US010049859B2

(12) United States Patent
Savas et al.

(10) Patent No.: US 10,049,859 B2
(45) Date of Patent: *Aug. 14, 2018

(54) PLASMA GENERATING UNITS FOR PROCESSING A SUBSTRATE

(75) Inventors: Stephen Edward Savas, Fremont, CA (US); Carl Galewski, Santa Cruz, CA (US); Allan B. Wiesnoski, Pleasanton, CA (US); Sai Mantripragada, Fremont, CA (US); Sooyun Joh, Livermore, CA (US)

(73) Assignee: Aixtron SE, Herzogenrath (DE)

( * ) Notice: Subject to any disclaimer, the term of this patent is extended or adjusted under 35 U.S.C. 154(b) by 1083 days.

This patent is subject to a terminal disclaimer.

(21) Appl. No.: 12/832,947

(22) Filed: Jul. 8, 2010

(65) Prior Publication Data

US 2011/0005681 A1 Jan. 13, 2011

Related U.S. Application Data

(60) Provisional application No. 61/224,047, filed on Jul. 8, 2009, provisional application No. 61/322,788, filed on Apr. 9, 2010.

(51) Int. Cl.
*C23C 16/24* (2006.01)
*C23C 16/26* (2006.01)
(Continued)

(52) U.S. Cl.
CPC ........ *H01J 37/32541* (2013.01); *C23C 16/24* (2013.01); *C23C 16/26* (2013.01);
(Continued)

(58) Field of Classification Search
CPC ....... C23C 16/50; C23C 16/513; C23C 16/24; C23C 16/26; C23C 16/345; C23C 16/40;
(Continued)

(56) References Cited

U.S. PATENT DOCUMENTS 4,230,515 A  10/1980 Zajac
5,543,688 A   8/1996 Morita
(Continued)

FOREIGN PATENT DOCUMENTS

DE         4242894 A1   6/1994
DE    10200410043967    9/2004
(Continued)

OTHER PUBLICATIONS

PCT/US2010/041440 International search report and written opinion dated Nov. 30, 2010.
(Continued)

*Primary Examiner* — Benjamin Kendall
(74) *Attorney, Agent, or Firm* — Ascenda Law Group, PC

(57) ABSTRACT

Apparatus and method for plasma-based processing well suited for deposition, etching, or treatment of semiconductor, conductor or insulating films. Plasma generating units include one or more elongated electrodes on the processing side of a substrate and a neutral electrode proximate the opposite side of the substrate. Gases may be injected proximate a powered electrode which break down electrically and produce activated species that flow toward the substrate area. This gas then flows into an extended process region between powered electrodes and substrate, providing controlled and continuous reactivity with the substrate at high rates with efficient utilization of reactant feedstock. Gases are exhausted via passages between powered electrodes or electrode and divider.

24 Claims, 26 Drawing Sheets

(51) Int. Cl.

| | |
|---|---|
| *C23C 16/34* | (2006.01) |
| *C23C 16/40* | (2006.01) |
| *C23C 16/44* | (2006.01) |
| *C23C 16/455* | (2006.01) |
| *C23C 16/46* | (2006.01) |
| *C23C 16/50* | (2006.01) |
| *C23C 16/503* | (2006.01) |
| *C23C 16/505* | (2006.01) |
| *C23C 16/54* | (2006.01) |
| *H01J 37/32* | (2006.01) |
| *H01L 21/67* | (2006.01) |

(52) U.S. Cl.
CPC ........... *C23C 16/345* (2013.01); *C23C 16/40* (2013.01); *C23C 16/401* (2013.01); *C23C 16/407* (2013.01); *C23C 16/4412* (2013.01); *C23C 16/45504* (2013.01); *C23C 16/45519* (2013.01); *C23C 16/45591* (2013.01); *C23C 16/466* (2013.01); *C23C 16/50* (2013.01); *C23C 16/503* (2013.01); *C23C 16/505* (2013.01); *C23C 16/545* (2013.01); *H01J 37/32036* (2013.01); *H01J 37/3244* (2013.01); *H01J 37/32091* (2013.01); *H01J 37/32449* (2013.01); *H01L 21/67069* (2013.01)

(58) Field of Classification Search
CPC . C23C 16/401; C23C 16/407; C23C 16/4412; C23C 16/45504; C23C 16/45519; C23C 16/45591; C23C 16/466; C23C 16/503; C23C 16/505; C23C 16/545; H01J 37/32018; H01J 37/32532; H01J 37/3255; H01J 37/32568; H01J 37/32036; H01J 37/32091; H01J 37/3244; H01J 37/32449; H01J 37/32541; H05H 1/26; H05H 1/32; H05H 1/34; H05H 2001/32; H05H 2001/34; H05H 2001/3431; H05H 2001/3478; H01L 21/67069
USPC ..... 118/723 E, 723 ER; 156/345.43, 345.45, 156/345.47
See application file for complete search history.

(56) References Cited

U.S. PATENT DOCUMENTS

| | | | |
|---|---|---|---|
| 5,609,690 A | 3/1997 | Watanabe et al. | |
| 5,685,949 A | 11/1997 | Yashima | |
| 5,686,360 A | 11/1997 | Harvey, III et al. | |
| 5,757,126 A | 5/1998 | Harvey, III et al. | |
| 5,811,022 A * | 9/1998 | Savas | H01J 37/321 118/723 I |
| 5,932,302 A | 8/1999 | Yamazaki et al. | |
| 5,981,899 A * | 11/1999 | Perrin | H01J 37/32541 118/723 R |
| 6,198,217 B1 | 3/2001 | Suzuki et al. | |
| 6,245,396 B1 | 6/2001 | Nogami | |
| 6,262,523 B1 | 7/2001 | Selwyn et al. | |
| 6,281,469 B1 | 8/2001 | Perrin et al. | |
| 6,353,201 B1 | 3/2002 | Yamakoshi et al. | |
| 6,359,250 B1 | 3/2002 | Blonigan et al. | |
| 6,489,585 B1 | 12/2002 | Nakamura | |
| 6,570,325 B2 | 5/2003 | Graff et al. | |
| 6,573,652 B1 | 6/2003 | Graff et al. | |
| 6,576,202 B1 | 6/2003 | Chiu | |
| 6,579,805 B1 | 6/2003 | Bar-Gadda | |
| 6,597,111 B2 | 7/2003 | Silvernail et al. | |
| 6,660,409 B1 | 12/2003 | Komatsu et al. | |
| 6,664,137 B2 | 12/2003 | Weaver | |
| 6,720,203 B2 | 4/2004 | Carcia et al. | |
| 6,743,524 B2 | 6/2004 | Schaepkens | |
| 6,779,482 B2 | 8/2004 | Sakai et al. | |
| 6,800,336 B1 * | 10/2004 | Fornsel et al. | 427/562 |
| 6,838,387 B1 | 1/2005 | Zajac et al. | |
| 6,863,020 B2 | 3/2005 | Mitrovic et al. | |
| 6,864,629 B2 | 3/2005 | Miyaguchi et al. | |
| 6,897,607 B2 | 5/2005 | Sugimoto et al. | |
| 6,916,401 B2 | 7/2005 | Long | |
| 6,962,664 B2 | 11/2005 | Mitrovic | |
| 7,015,640 B2 | 3/2006 | Schaepkens et al. | |
| 7,090,705 B2 | 8/2006 | Miyazaki et al. | |
| 7,205,034 B2 | 4/2007 | Kawamura et al. | |
| 7,264,849 B2 | 9/2007 | Keshner et al. | |
| 7,319,295 B2 | 1/2008 | Mashima et al. | |
| 7,342,361 B2 | 3/2008 | Ellingboe | |
| 7,492,091 B2 | 2/2009 | Kharrazi-Olsson et al. | |
| 7,510,913 B2 | 3/2009 | Moro et al. | |
| 7,518,142 B2 | 4/2009 | Hoffmann et al. | |
| 7,700,051 B2 * | 4/2010 | Miyairi | B01D 53/32 422/186.04 |
| 7,824,520 B2 * | 11/2010 | Nakamura | 156/345.43 |
| 7,829,147 B2 | 11/2010 | Aitken et al. | |
| 7,833,587 B2 | 11/2010 | Mashima et al. | |
| 7,886,690 B2 | 2/2011 | Ellingboe | |
| 7,951,620 B2 | 5/2011 | Won et al. | |
| 8,236,424 B2 | 8/2012 | Schaepkens et al. | |
| 8,257,799 B2 | 9/2012 | Lee | |
| 8,298,625 B2 | 10/2012 | Stimson et al. | |
| 8,343,592 B2 | 1/2013 | Kudela et al. | |
| 8,359,250 B2 | 1/2013 | Srinivasan et al. | |
| 8,404,502 B2 | 3/2013 | Won et al. | |
| 8,486,487 B2 | 7/2013 | Fukuda et al. | |
| 2001/0006093 A1 | 7/2001 | Tabuchi et al. | |
| 2001/0019746 A1 | 9/2001 | Higashikawa et al. | |
| 2001/0021422 A1 | 9/2001 | Yamakoshi et al. | |
| 2001/0042554 A1 | 11/2001 | Tamura | |
| 2001/0050059 A1 | 12/2001 | Hongo et al. | |
| 2002/0007793 A1 | 1/2002 | Sakai et al. | |
| 2002/0069971 A1 | 6/2002 | Kaji et al. | |
| 2002/0100556 A1 | 8/2002 | Kim et al. | |
| 2002/0148561 A1 | 10/2002 | Tetsuhiro et al. | |
| 2003/0066485 A1 | 4/2003 | Yamazaki et al. | |
| 2003/0070759 A1 | 4/2003 | Aota et al. | |
| 2003/0079983 A1 | 5/2003 | Long et al. | |
| 2003/0082313 A1 * | 5/2003 | Chien | 427/574 |
| 2003/0113479 A1 * | 6/2003 | Fukuda et al. | 156/345.45 |
| 2004/0050685 A1 | 3/2004 | Yara et al. | |
| 2004/0137647 A1 * | 7/2004 | Miyazaki et al. | 438/3 |
| 2005/0022740 A1 * | 2/2005 | Hatano | C23C 16/4405 118/723 E |
| 2005/0118533 A1 | 6/2005 | Mirkarimi et al. | |
| 2005/0217798 A1 * | 10/2005 | Sugiyama et al. | 156/345.45 |
| 2006/0096539 A1 * | 5/2006 | Kawasaki et al. | 118/723 R |
| 2006/0177599 A1 | 8/2006 | Madocks | |
| 2006/0185594 A1 * | 8/2006 | Uehara | H01J 37/32009 118/723 E |
| 2006/0214270 A1 | 9/2006 | Iwagami | |
| 2007/0217119 A1 | 9/2007 | Johnson et al. | |
| 2007/0227662 A1 | 10/2007 | Yamazawa | |
| 2008/0139003 A1 | 6/2008 | Pirzada et al. | |
| 2008/0309242 A1 | 12/2008 | Ellingboa | |
| 2009/0081360 A1 * | 3/2009 | Fedorovskaya et al. | 427/160 |
| 2009/0117717 A1 | 5/2009 | Tomasini et al. | |
| 2009/0244471 A1 * | 10/2009 | Kondo | G02F 1/1303 349/158 |
| 2009/0288602 A1 * | 11/2009 | Satake | C23C 16/4412 118/723 E |
| 2010/0068413 A1 * | 3/2010 | Lee | C23C 16/45514 427/569 |
| 2010/0080933 A1 * | 4/2010 | Kudela et al. | 427/574 |
| 2010/0112235 A1 | 5/2010 | Prinz | |
| 2010/0136331 A1 | 6/2010 | Fahland et al. | |
| 2010/0215871 A1 * | 8/2010 | Lee | C23C 16/06 427/569 |
| 2011/0005682 A1 | 1/2011 | Savas et al. | |
| 2011/0006040 A1 | 1/2011 | Savas et al. | |
| 2011/0262679 A1 | 10/2011 | Azuma et al. | |

(56) References Cited

U.S. PATENT DOCUMENTS

| | | | | |
|---|---|---|---|---|
| 2012/0247390 | A1* | 10/2012 | Sawada | C23C 16/4412 118/723 AN |
| 2013/0337657 | A1 | 12/2013 | Savas et al. | |

FOREIGN PATENT DOCUMENTS

| | | | |
|---|---|---|---|
| JP | 2001-026878 A | | 1/2001 |
| JP | 2002212744 A | | 7/2002 |
| JP | 2003/093869 | | 4/2003 |
| JP | 2003093869 A | * | 4/2003 |
| JP | 2003096569 A | | 4/2003 |
| JP | 2006134830 A | | 5/2006 |
| WO | WO-2006/120239 A1 | | 11/2006 |
| WO | 2007016999 A2 | | 2/2007 |
| WO | WO2008/055993 A1 | | 5/2008 |
| WO | WO2009/121975 A1 | | 10/2009 |
| WO | WO2011/006018 A2 | | 1/2011 |

OTHER PUBLICATIONS

Babayan, S.E., et al., "Deposition of silicon dioxide films with a non-equilibrium atmospheric-pressure plasma jet", *Plasma Sources Science and Technology* 10 (2001) Sep. 12, 2001, pp. 573-578.
Loureireo, J., et al., "Non-equilibrium kinetics in $N_2$ discharges and post-discharges : a full picture by modelling and impact on the application", *Plasma Sources Science and Technology* 20 (2011) Apr. 1, 2011, 12 pgs.
Soppe, W.J., et al., "Roll to Roll Fabrication Process of Thin-Film Silicon Solar Cells on Steel Foil", *ECN Solar Engergy*, 2004, 4 pgs.
Stephens, D.J., et al., "The optical properties of plasma-deposited $SiO_2$ and $Si_3N_4$ bragg reflectors in the spectral range from 1.8 to 3.0eV", *Materials Research Society*, vol. 281, 1993, pp. 809-814.
Stroebel, c., et al., "Dynamic high-rate-deposition of silicon thin film layers for photovoltaic devices", $23^{rd}$ *European Photovoltaic Solar Energy Conference*, Sep. 1-5, 2008, Valencia, Spain. pp. 2497-2504.
Takagi, T., et al., "Large area multi-zone VHF-PCVD system for a-Si and µc-Si deposition", $3^{rd}$ *World Conference on Photovoltaic Energy Conversion*, May 11-18, 2003, Osaka, Japan, pp. 1792-1795.
Van Aken, B.B., et al., "Surface (photo)voltage monitoring in roll-to-roll deposition of thin film silicon solar cells", *24th European Photovoltaic Solar Energy Comerence*, Sep. 2009, Hamburg, Germany, 4 pgs.
Zimmerman, T., et al., "Inline dynamic deposition of a S1:H and µC-SI:H thin-film solar cells", *25th European Photovoltaic Solar Energy Conference and Exhibition / 5th World Conference on Photovoltaic Energy Conversion*, Sep. 2010, Valencia, Spain, 4 pgs.
Y. Maemura, H. Fujiyama, T. Takagi, R. Hayashi, W. Futako, M. Kondo and A. Matsuda; "Particle formation and a-si:H film deposition in narrow-gap RF plasma CVD". Thin Solid Films vol. 345, pp. 80-84 (1999).
Simon Selitser, Time Domain CVD, Inc. "Plasma-Enhanced Deposition (of silicon dioxide) from TEOS and Oxygen". 2002.
Tobias Roschek, Tobias Repmann, Oliver Kluth, Joachim Mueller, Bernd Rech and Heribert Wagner. "High rate deposition of microcrystalline silicon solar cells using 13.56 MHz PECVD-prerequisites and limiting factors". Mat. Res. Soc. Symp. Proc. vol. 715 (A26.5.1) 2002.
J. Park, Henins, H. W. Herrmann, G. S. Selwyn, and R.F. Hicks; Discharge phenomena of an atmospheric pressure radio-frequency capacitive plasma source; Journal of Applied Physics; Jan. 1, 2001; pp. 20-28; vol. 89, No. 1; American Institute of Physics; United States of America.
Lee, J.W., MacKenzie, D. Johnson, S. J. Pearton, F. Ren and J. N. Sasserath; Development of Low Temperature Silicon Nitride and Silicon Dioxide Films by Inductively-Coupled Plasma Chemical Vapor Deposition.
G. R. Nowling, S. E. Babayan, V. Jankovic and R. F. Hicks; Remote plasma-enhanced chemical vapour deposition of silicon nitride at atmospheric pressure; Plasma Sources Science and Technology; Feb. 4, 2002; pp. 97-103; vol. 11; Institute of Physics Publishing; United States of America.
S. Y. Moon, J. K. Rhee, D. B. Kim, and W. Choe; ●, ●,and normal, abnormal glow discharge modes in radio-frequency capacitively coupled discharges at atmospheric pressure; Physics of Plasmas 13, 033502 (2006); pp. 1-6; American Institute of Physics; United States of America.
J. Yota, J. Hander, and A. A. Saleh; A comparative study on inductively-coupled plasma high-density plasma, plasma-enhanced, and low pressure chemical vapor deposition silicon nitride films;; J. Vac. Sci. Technol. A vol. 18 No. 2, Mar./Apr. 2000 pp. 372-376; American Vacuum Society; United States of America.
S. A. Moshkalyov, J. A. Diniz, J. W. Swart, P. J. Tatsch, and M. Machida; Deposition of silicon nitride by low-pressure electron cyclotron resonance plasma enhanced chemical vapor deposition in N2/Ar/SiH4; J. Vac. Sci. Technol. B vol. 15 No. 6, Nov./Dec. 1997, pp. 2682-2687; American Vacuum Society, pp. 372-376; United States of America.
W. A. Lanford and M. J. Rand; The hydrogen content of plasma-deposited silicon nitride; J. Appl. Phys. 49(4), Apr. 1978, pp. 2473-2477.
D. Landheer, N. G. Skinner, T. E. Jackman, D.A. Thompson, J.G. Simmons,Andd.V. Stevanovic, and D. Khatamian; Growth and characterization of silicon nitride films produced by remote microwave plasma chemical vapor deposition; J. Vac. Sci. Technol. A 9 (5), Sep./Oct. 1991, pp. 2594-2601; American Vacuum Society; United States of America.
G. Lucovsky, P. D. Richard, D. V. Tsu, S. Y. Lin, and R. J. Markunas; Deposition of silicon dioxide and silicon nitride by remote plasma enhanced chemical vapor deposition; J. Vac. Sci. Technol. A 4 (3), May/Jun. 1986, pp. 681-687; American Vacuum Society; United States of America.
F.H.P.M. Habraken and A.E.T. Kuiper, Silicon nitride and oxynitride films; Materials Sci. and Eng., R12 (1994) 123-175.
R. Chow, W. A. Lanford, W. Ke-Ming, and R. S. Rosler; Hydrogen content of a variety of plasma-deposited silicon nitrides; J. Appl. Phys., vol. 53, No. 8, Aug. 1982, pp. 5630-5634; American Institute of Physics; United States of America.
J. Madocks, W. Seaman, M.A. George, Q. Shangguan; Plasma Enhanced Chemical Vapor Deposition (PECVD) forLarge Area Applications; Preprint publication from the 53rd Society of Vacuum Coaters Annual Technical Conference 2010.
Supplementary European Search Report, from the European Patent Office, dated Sep. 17, 2015, for European Patent Application No. 10797882.7, 7 pgs.
Amendment, filed Oct. 7, 2014 with the European Patent Office, for European Patent Application No. 10797882.7, 33 pgs.
Non-Final Office Action dated Aug. 14, 2015, from U.S. Appl. No. 12/832,953, filed Jul. 8, 2010, 13 pgs.
Amendment and Response to Final Office Action filed Nov. 10, 2014, from U.S. Appl. No. 12/832,953, filed Jul. 8, 2010, 11 pgs.
Final Office Action dated May 9, 2014, from U.S. Appl. No. 12/832,953, filed Jul. 8, 2010, 12 pgs.
Amendment and Response to Office Action filed Jan. 13, 2014, from U.S. Appl. No. 12/832,953, filed Jul. 8, 2010, 11 pgs.
Non-Final Office Action dated Sep. 11, 2013, from U.S. Appl. No. 12/832,953, filed Jul. 8, 2010, 9 pgs.
Notice of Allowance dated Apr. 7, 2015, from U.S. Appl. No. 14/253,206, filed Apr. 15, 2014, 11 pgs.
Notice of Allowance dated Feb. 3, 2014, from U.S. Appl. No. 12/832,934, filed Jul. 8, 2010, 4 pgs.
Notice of Allowance dated Nov. 26, 2013, from U.S. Appl. No. 12/832,934, filed Jul. 8, 2010, 14 pgs.
Amendment and Response to Final Office Action filed Sep. 23, 2013, from U.S. Appl. No. 12/832,934, filed Jul. 8, 2010, 14 pgs.
Final Office Action dated Jul. 15, 2013, from U.S. Appl. No. 12/832,934, filed Jul. 8, 2010, 14 pgs.
Applicant Summary of Interview with Examiner filed May 17, 2013, from U.S. Appl. No. 12/832,934, filed Jul. 8, 2010), 2 pgs.

(56) References Cited

OTHER PUBLICATIONS

Amendment and Response to Office Action filed May 1, 2013, from U.S. Appl. No. 12/832,934, filed Jul. 8, 2010, 17 pgs.
Applicant Initiated Interview Summary filed May 17, 2013, from U.S. Appl. No. 12/832,934, filed Jul. 8, 2010, 3 pgs.
Non-Final Office Action dated Feb. 8, 2013, from U.S. Appl. No. 12/832,934, filed Jul. 8, 2010, 16 pgs.
Notice of Allowance dated Jun. 5, 2015, from U.S. Appl. No. 14/251,851, filed Apr. 14, 2014, 4 pgs.
Examiner Initiated Interview Summary dated Apr. 7, 2015, from U.S. Appl. No. 14/251,851, filed Apr. 14, 2014, 2 pgs.
Notice of Allowance dated Apr. 2, 2015, from U.S. Appl. No. 14/251,851, filed Apr. 14, 2014, 9 pgs.
Amendment and Response to Office Action filed Feb. 9, 2015, from U.S. Appl. No. 14/251,851, filed Apr. 14, 2014, 11 pgs.
Non-Final Office Action dated Oct. 7, 2014, from U.S. Appl. No. 14/251,851, filed Apr. 14, 2014, 6 pgs.
Amendment and Response to Office Action filed Oct. 19, 2015, from U.S. Appl. No. 12/832,953, filed Jul. 8, 2010), 16 pgs.
Final Office Action dated Feb. 5, 2016, from U.S. Appl. No. 12/832,953, filed Jul. 8, 2010, 10 pages.
Machine Generated English Translation of JP 2001-26878A. Published Jan. 2001, 3 pages.

* cited by examiner

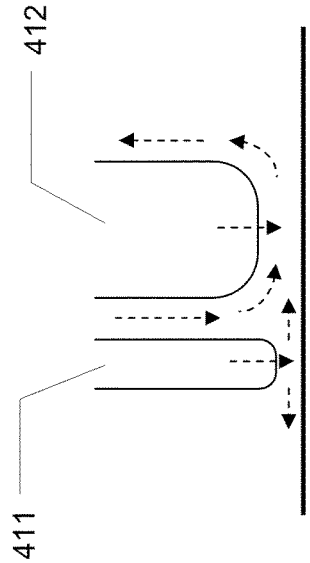
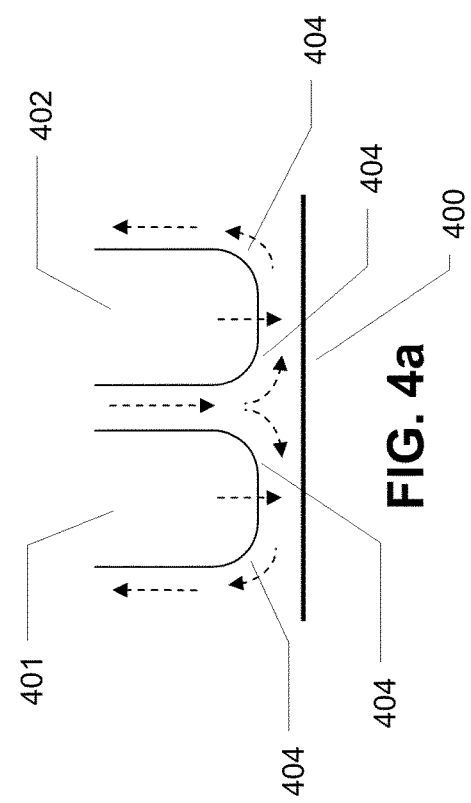
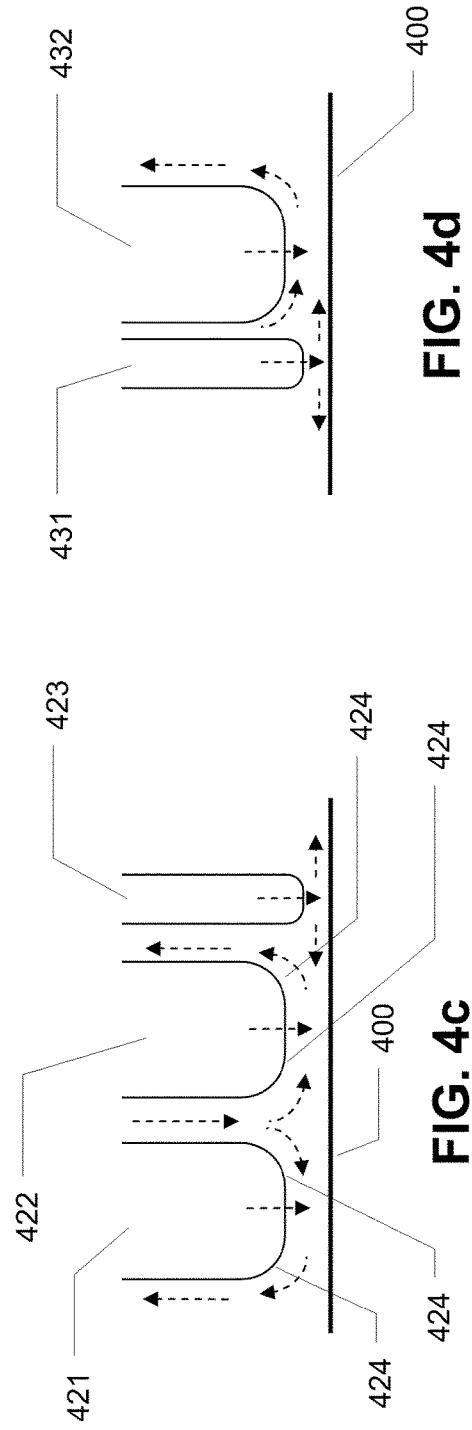

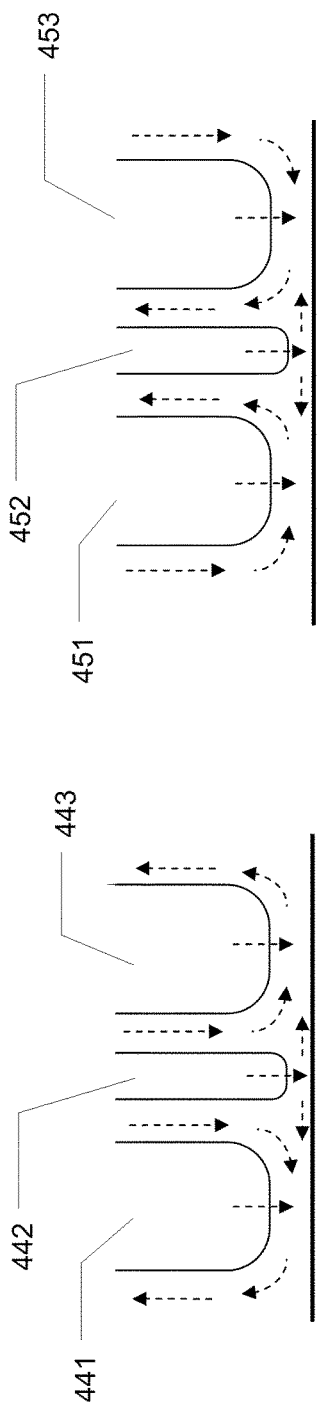
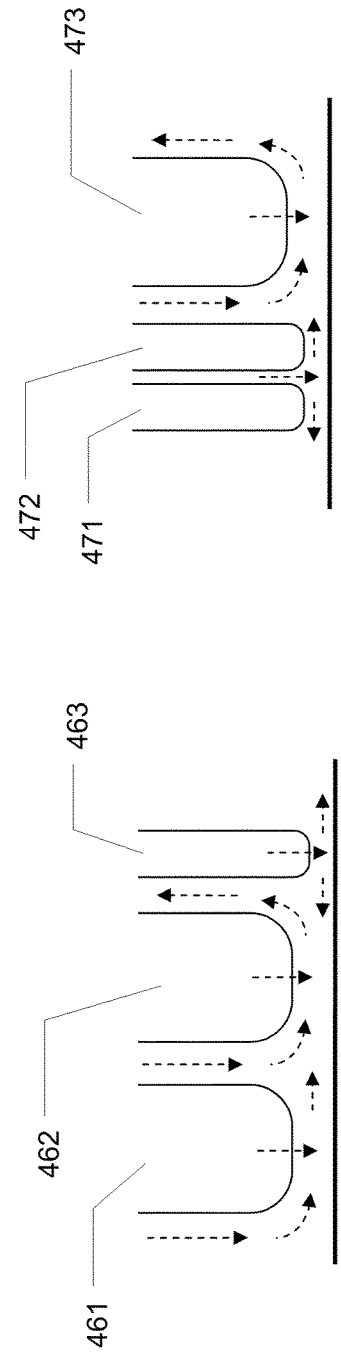
FIG. 4e
FIG. 4f
FIG. 4g
FIG. 4h

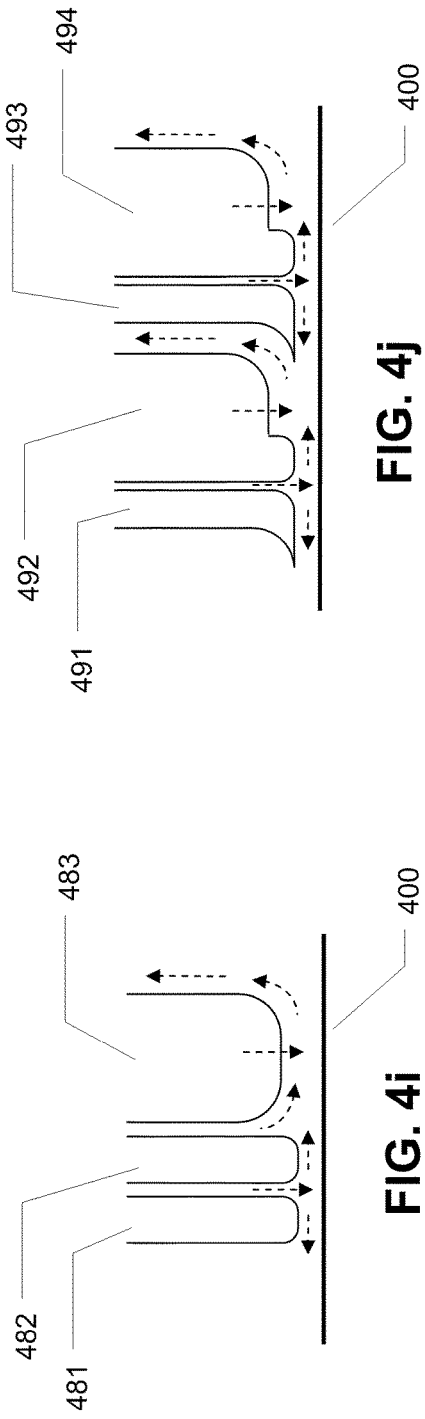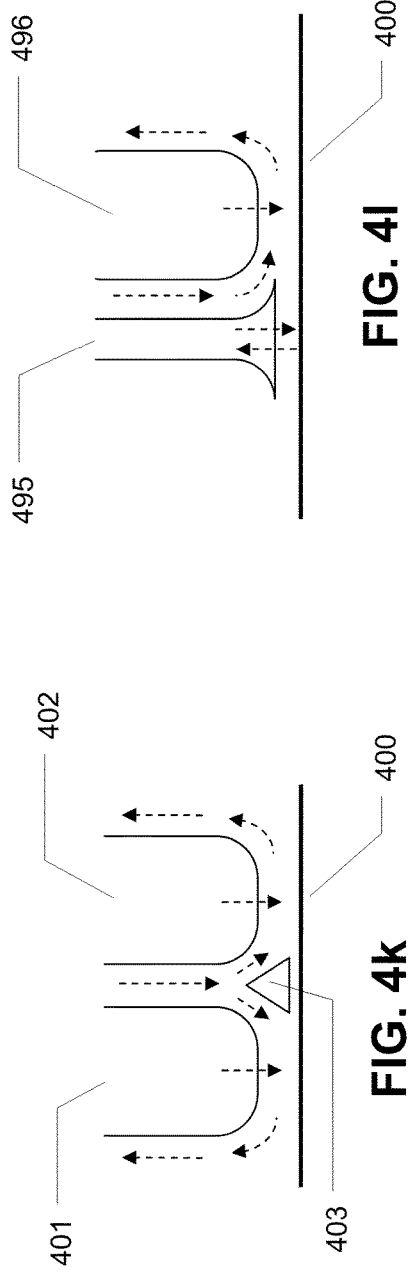

US 10,049,859 B2

PLASMA GENERATING UNITS FOR PROCESSING A SUBSTRATE

CROSS REFERENCE

This application claims the benefit of U.S. Provisional Patent Application No. 61/224,047, filed on Jul. 8, 2009, and U.S. Provisional Patent Application No. 61/322,788, filed Apr. 9, 2010, each of which is incorporated herein by reference.

This application is related to copending U.S. patent application Ser. No. 12/832,953, filed Jul. 8, 2010; U.S. patent application Ser. No. 12/832,934, filed Jul. 8, 2010 (now issued as U.S. Pat. No. 8,697,197); and PCT Patent Application No. PCT/US2010/041440, filed Jul. 8, 2010, each incorporated herein by reference.

BACKGROUND

Field of the Invention

The field of the present invention relates to an apparatus and methods for plasma processing, and more particularly, to alternating current induced plasma processing for deposition, etching, or treatment of semiconductor, conductor or insulating films or carriers holding smaller substrates, rectangular substrates, or continuous band substrates.

Background

The development of plasma enhanced processes for deposition, etching, cleaning, and surface treatments have been instrumental to maintain the progress in many manufacturing industries, such as, integrated circuits (IC), liquid crystal display (LCD) screens, and photovoltaic (PV) panels.

Example reactors for plasma enhanced processing include parallel plate capacitive and microwave discharge reactors. Scaling reactors to process larger substrates may increase manufacturing cost because of the need to operate at lower power density and gas concentration per unit area to maintain desired film properties and uniformity.

For the IC and LCD industries, the cost of scaling plasma enhanced processes to larger substrates has been offset partially by the increased functionality per unit area (IC) and ability to charge a higher price for more surface area (LCD). The PV panel industry, on the other hand, faces additional challenges in finding ways to directly reduce manufacturing cost and energy use per unit area produced while also improving the deposition methods to produce panels with higher conversion efficiency of light to electrical energy. One method of manufacturing PV panels involves Plasma Enhanced Chemical Vapor (PECVD) deposition of silicon containing thin films.

However, bombardment by high-energy ions (>10 eV), formation of silicon particles in the gas phase, and metal contamination are factors that can contribute to defects in the deposited silicon films that reduce the efficiency of converting light to electrical energy. For many PECVD processes, it may be desired to achieve economical, high rate deposition, uniformity over large area substrates (including at edges and corners of large rectangular substrates) and efficient feedgas utilization.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

FIGS. 4a-l show schematic cross-section views of twelve example PGU configurations in accordance with example embodiments of the present invention.

DETAILED DESCRIPTION

Figure 1:
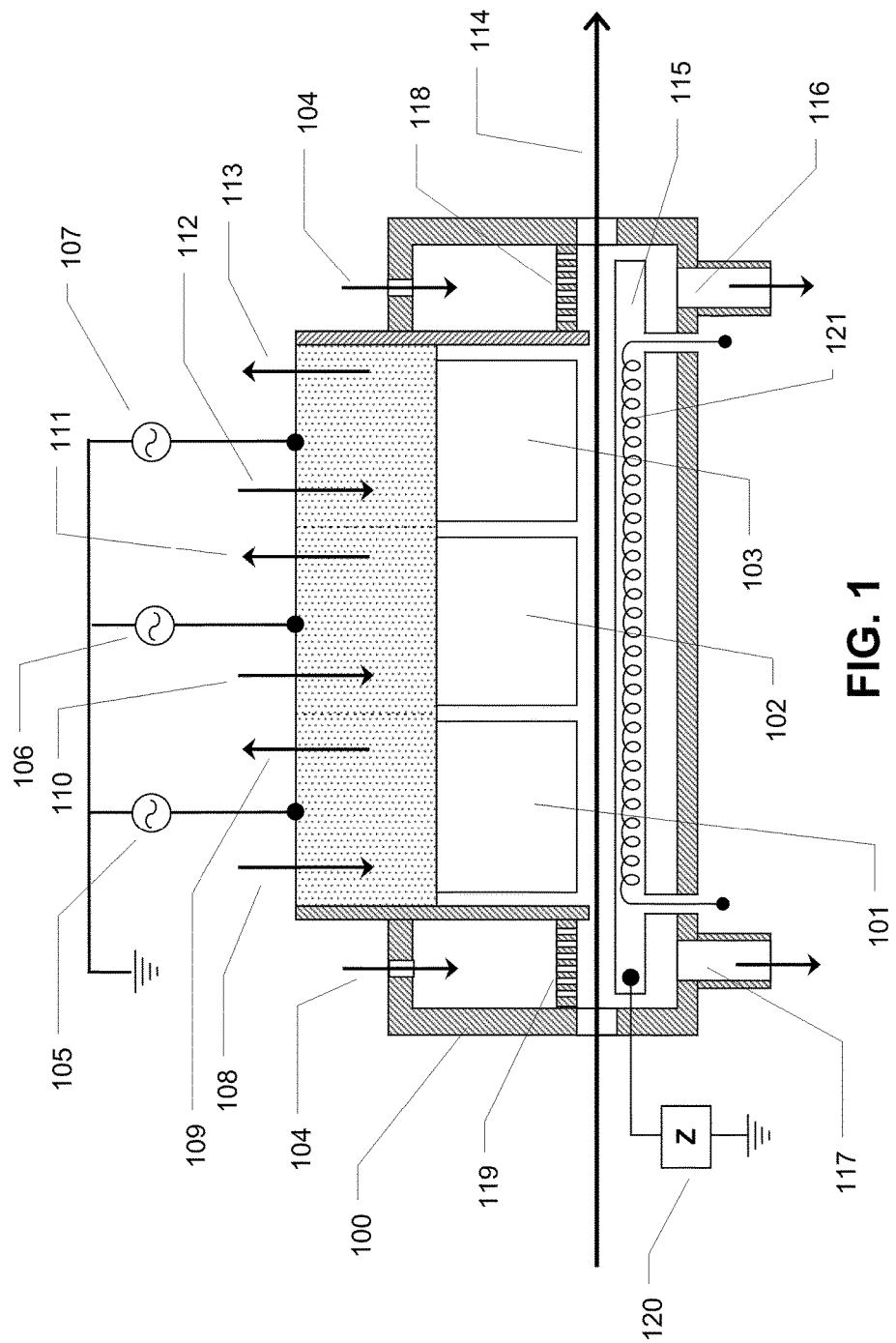
FIG. 1 shows cross-section view of a processing system with closely spaced PGUs according to an example embodiment of the present invention.

While the present invention is open to various modifications and alternative constructions, the embodiments shown in the drawings will be described herein in detail. It is to be understood, however, there is no intention to limit the invention to the particular forms disclosed. On the contrary, it is intended that the invention cover all modifications, equivalences and alternative constructions falling within the spirit and scope of the invention as expressed in the appended claims.

Example embodiments include plasma generating units (PGUs) each of which may generate or sustain, or contribute to the generation or sustaining of, a plasma for plasma processing. In example embodiments, the PGUs may include one or more elements to provide power to generate or sustain a plasma (or to contribute to generating or sustaining a plasma), to help contain and/or provide a return path for the electric current, and/or to guide or control gas flow of the plasma.

Thus, each PGU may generate a plasma in a region which is adjacent elements of that PGU as well as adjacent other plasma regions or part of a larger plasma region. In either case, the plasma in this region may be substantially controllable with the power provided to some elements of this PGU in example embodiments. In some embodiments, the elements may be electrodes at lower frequencies (such as RF or even VHF frequencies) that couple power into the plasma mainly through displacement currents—capacitive coupling. In other embodiments, the coupling of power from the PGU into the plasma may be principally inductive where some elements of the PGU include one or more turns of a coil. Other embodiments may use power in the UHF or microwave bands with coupling of power into the plasma as surface waves which are electromagnetic in their nature. In any of these example embodiments, processing in this region may be substantially a product of the plasma generated by AC electrical power injected via the PGU. Other embodiments may use combinations of PGUs that couple power capacitively, inductively or by surface waves. These are examples only and other embodiments may use other PGUs or combinations of PGUs.

Elements of a PGU may include, for example, one or more powered electrodes, grounded electrodes, neutral electrodes and/or floating electrodes, one or more dividers to guide or control gas flow and/or to help contain power, and/or one or more liners to protect the electrodes or other chamber surfaces (and which may also help guide or control gas flow). These and/or other elements may be used alone or in combination to provide the desired plasma properties for processing, as further described below. In some embodiments, processing occurs as a substrate is moved under one or more PGUs. In other embodiments, the substrate is stationary under a PGU or an array or other combination of PGUs. In yet other embodiments, the substrate may be stationary while a single PGU or array or other combination of PGUs are moved.

Shown in FIG. 1 is a processing chamber, 100, according to an example embodiment which may contain one or more plasma generating units (PGUs). FIG. 1 shows an example embodiment of a chamber having three PGUs, shown as items 101, 102 and 103, that are closely spaced to one another. The PGUs may be of the same type or have different configurations of electrode(s), divider(s) and/or other elements. As shown in FIG. 1, the multiple PGUs in this embodiment are closely spaced, so that there may be plasma generated between elements of adjacent PGUs as well as between elements within each individual PGU. In some example embodiments, the gaps between adjacent PGUs may be less than the width of each PGU. In some embodiments, the gap between adjacent PGUs may be less than about twice the gap between the powered electrodes and the substrate being processed. In this example embodiment, AC current may flow between PGUs as well as within each PGU. In this embodiment, each PGU has at least one electrode, one of which is powered, and may or may not have a divider or multiple dividers which are not grounded or powered. Example embodiments of each PGU may have at least one powered electrode and may have a plurality of powered electrodes. Example embodiments may also have one or more grounded electrodes. Inert gas may be supplied through an inlet as shown at 104, to a manifold 118 and 119 on either side of the PGU assembly to prevent process gases from leaving the chamber and prevent the entry of gases from the adjacent chamber into the process region. In example embodiments, such gas purging at the entry and exit of the chamber may also help remove undesirable gases from the substrates as they enter the chamber to avoid contamination of the processes within the chamber. AC power is provided by generators, 105, 106 and 107, respectively to PGU 101, 102 and 103. Gas supply inlets, 108, 110, and 112, and exhaust ports 109, 111, and 113 are provided for PGU 101, 102 and 103 respectively. In this example embodiment, the substrate is moved laterally below the PGUs for processing. Substrate motion into and out of the processing chamber in this embodiment is indicated by the arrow at 114. A conveyor, web or other moveable transport or carrier may be used to move the substrate below the PGUs. A substrate support and neutral electrode, 115, may be connected to ground through an impedance element, 120, which may incorporate reactive and resistive elements as well as solid state electronic devices such as power diodes or varistors that may be used for sensing the plasma condition and assuring process stability and correctness. There are heater elements, 121, that may be incorporated into (or near) the pedestal, 115. Such elements may be resistive within the pedestal (as shown) or radiative and below the pedestal. Exhaust ports 116 and 117 are provided to pump out the purge gases which are delivered to the substrate region by manifolds, 118 and 119. In some embodiments with multiple PGUs, the PGUs are grouped closely with gaps between adjacent elements of neighboring PGUs that are less than twice the gap between the substrate and the powered electrode(s) of one or both of those PGUs.

In example embodiments, the PGUs may be arranged so that the long sides of adjacent elements of neighboring PGUs are approximately parallel and narrowly spaced along the direction of substrate motion.

Figure 2:
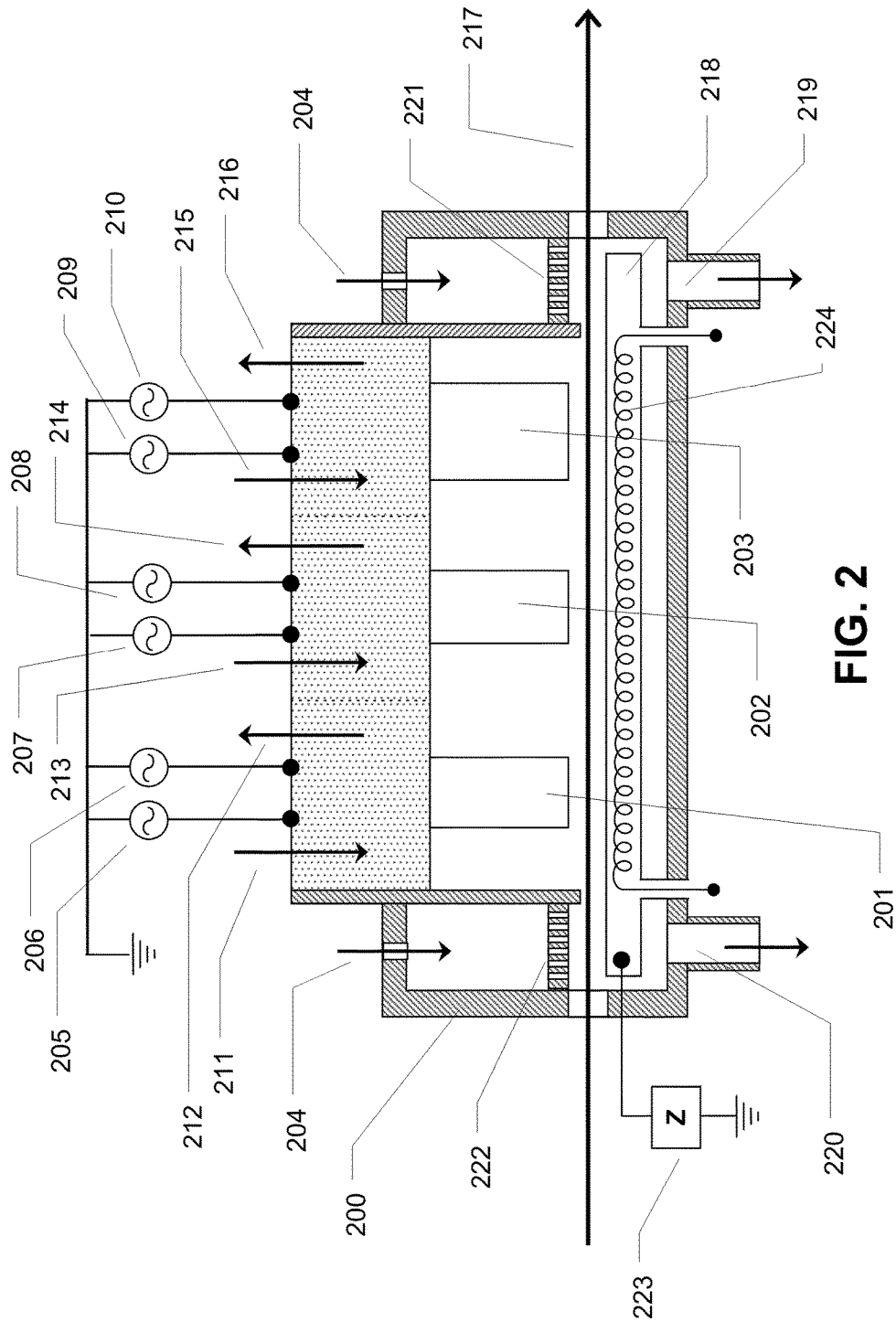
FIG. 2 shows cross-section view of a processing system with individually mounted PGUs according to an example embodiment of the present invention.

Shown in FIG. 2 is another embodiment of a processing chamber with multiple PGUs that are more widely spaced or may be isolated compared to the previously described embodiment in FIG. 1. In this case each PGU may have at least two electrodes, and may or may not have a divider or multiple dividers (which may not be grounded or powered). There may in some embodiments be only one PGU within a processing chamber. Chamber 200 is shown with three PGUs. In this case very little AC current may flow between different PGUs in addition to that within any PGU. The PGUs shown as items 201, 202 and 203 may be of the same type or have different configurations of electrode(s) or divider(s). As shown, the multiple PGUs are not closely spaced, with gaps that may be less than the PGU width so that there may be little or no plasma generated between elements of adjacent PGUs.

Inert gas may as well be supplied, 204, to distribution manifolds 221 and 222 on either side of the PGU assembly to prevent process gases from leaving the chamber. In some embodiments AC power is provided by generators, 205 and 206 to PGU 201; generators 207 and 208 to PGU 202, and generators 209 and 210 to PGU 203. In other embodiments a single generator may also be adequate for supplying all powered electrodes within one or more of the PGUs. Gas supplies, 211, 213, and 215, and exhausts 212, 214, and 216 are provided for PGU 201, 202 and 203 respectively. Substrate motion into and out of the processing chamber is indicated as 217. The substrate support and neutral electrode, 218, may be connected to ground through an impedance element, 223, which may incorporate reactive and resistive elements as well as solid state electronic devices such as power diodes or varistors that may be used for sensing the plasma condition and assuring process stability and correctness. There may be a heater element, 224, which either conducts heat to the pedestal, 218, from within the pedestal as shown or radiates heat to the pedestal and substrate from below and near the pedestal. Exhausts 219 and 220 are provided to pump out the purge gases which are delivered to the substrate region by purge manifolds, 221 and 222.

Figure 3:
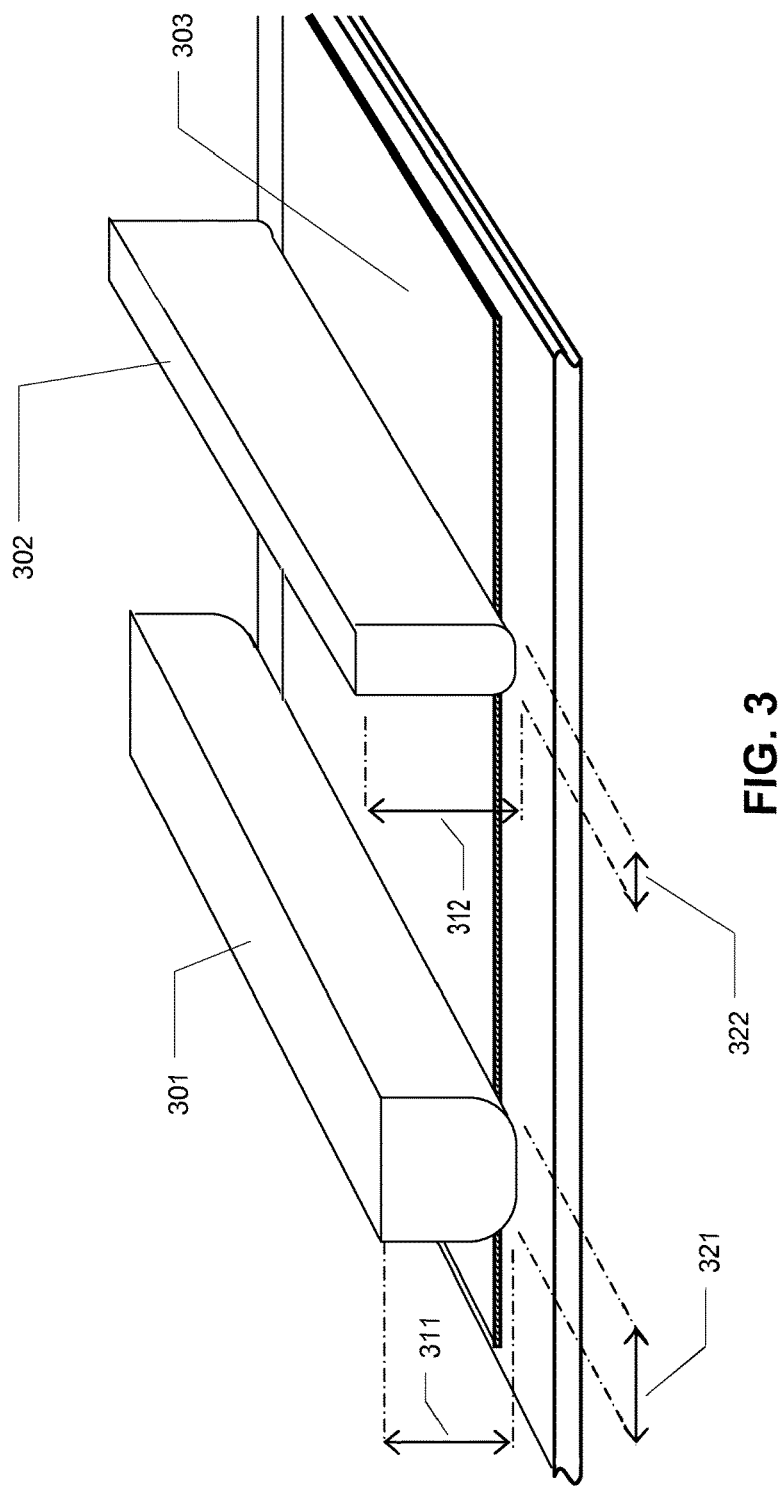
FIG. 3 shows a perspective illustration of the dimensional aspect ratios of an example wide and narrow electrode in relation to the substrate position.

Example elements within a PGU shown in FIG. 3 are generally proportioned and shaped to process substrates uniformly. The lengths of an electrode, 301, or divider, 302, within a PGU, as shown in FIG. 3, may be longer than the dimension of the substrate, 303, parallel to such length. Electrode or divider length may also be much greater than their heights, 311 and 312, in the direction perpendicular to the substrate, or their widths, 321 and 322, in the direction parallel to the substrate surface and perpendicular to the electrode length dimension. In some embodiments, as illustrated schematically in FIG. 3, the cross section shape of both powered electrodes and dividers may be approximately constant along such length dimension.

In some embodiments, the cross-sectional shape of AC powered electrodes may generally have a rectangular cross-section with rounded corners as seen in FIGS. 3, 4a-l, 5, 6, 7, 8, 9, and 10.

Embodiments of the present invention may use PGUs in various configurations and combinations to achieve desired processing characteristics. In example embodiments, PGUs may be used for processing large substrates or carriers holding smaller substrates, or continuous band substrates. In some embodiments, an elongated PGU or a row or any array of elongated PGUs may be used to process a large area substrate for PV panels or other applications. In some embodiments, a linear plasma source or plasma generating unit (PGU) can be configured to operate effectively with a variety of processes, providing efficient gas utilization for the desired substrate reactions in combination with short and uniform gas residence time to prevent unwanted gas phase reactions. In some embodiments, multiple PGUs may be used to enhance the throughput of the overall system and still allow the flexibility to tune each unit for specific process steps to suit the requirements of the applications.

In example embodiments, one or more PGUs may be positioned near the surface of the substrate to be processed, each supporting one or more gas discharge(s) that generate plasma and reactive species in volumes adjacent to the substrate for processing its surface. If multiple PGUs are used, some or all may be of the same configuration and may be grouped in combination with some of the different configurations in various kinds of mixtures. A PGU in some embodiments, particularly where such PGU may be used singly or substantially spaced from another, may include as elements two or more electrodes which are either grounded or powered. In example embodiments, at least one of the electrodes in each PGU is powered, and in particular may be provided with RF or VHF current. In some embodiments where there may be multiple, closely-grouped PGUs each may have one or more electrode(s) as element(s), at least one of which is provided with RF or VHF current. In both isolated and grouped configurations a PGU may or may not have as elements one or more divider(s), which may not be grounded or powered, but may be electrically floating. In some example embodiments, the PGUs are generally capable of generating plasma between their powered electrodes and the substrate, as well as between elements within the PGU, or between an element of the PGU and an element of an adjacent PGU. In some embodiments, the opposite side of the substrate or carrier may be supported on or very near a neutral electrode that may be grounded or have a small impedance to ground at RF, or VHF frequencies. In some embodiments there may be plasmas formed between adjacent elements that may provide for activation and ionization of gas before or after the substrate has been exposed to it.

In example embodiments, the plasma(s) may cause processing to take place in one or more elongated region(s) over the surface of the substrate(s). In some embodiments, each of the processing regions formed by a PGU is larger in one dimension than the diameter or width of the substrates or may be comparable in size to a large dimension of a carrier (for example, the outer width of the carrier). In example embodiments, the processing regions formed by the PGUs over the substrate surface may be elongated and the length of each such region may be much greater than its width. For example, the length of each processing region between a PGU and the surface of the substrate may be between two and 100 times the width of the processing region in example embodiments or any range subsumed therein. If there are multiple PGUs in a chamber in some embodiments, the PGUs may be arranged closely spaced side by side so their elements have long dimensions aligned and are approximately parallel to each other with gaps comparable in magnitude to those gaps between elements within a PGU or between electrodes and the substrate, or they may be spaced apart from each other or separated from each other by other by spacers or dividers (which, in some examples, may be purged with inert gas).

In some embodiments the PGUs may be placed in close proximity to each other without need for a shield between them. This configuration may be used to provide a stable means of running multiple units next to each other which may be performing different process steps. If necessary for a particular application, the specific process performed by each PGU may be independently adjusted by incorporating features, such as different electrode and divider configurations in a PGU, individual gas flow control for varying the gas mixture, separate power supply connection, different liner configurations, electrode width and height, electrode gap distances, length of pre-activation region above the process gas injection point, and/or size of the process region.

In example embodiments, elements within PGUs may be generally proportioned and shaped to process substrates uniformly. The lengths of electrodes or divider(s) within a PGU may be greater than the dimension of the substrate(s) aligned along such length, and lengths may be much greater than either their height—the size in the direction perpendicular to the substrate—or their width or both. The width dimension of an electrode or divider is defined as its size parallel to the substrate surface and perpendicular to its long dimension. In some examples, the length of the electrodes may be two, ten, twenty, fifty, one hundred or more times the height or width of the electrodes or both. Example lengths of electrodes, dividers or other elements in the PGU may be from about 30 centimeters to about 400 centimeters or any range subsumed therein. Example heights of electrodes, dividers or other elements in a PGU may range from about a centimeter to about 30 centimeters or any range subsumed therein. Example widths of powered electrodes, dividers or other elements in a PGU may range from about one centimeter to about 30 centimeters or any range subsumed therein. The ratio of powered electrode height or width to length may be less than about 0.25 in some embodiments. The heights of grounded electrodes or dividers may be within the same range as those of powered electrodes in example embodiments. However, the minimum widths of grounded electrodes or dividers may be less than for powered electrodes and may be as small as about a millimeter in some embodiments. Example ranges for the width of grounded electrode and divider may be between about 1 millimeter and about 100 millimeters or any range subsumed therein, with widths within the range of between about 2 millimeters and about 10 millimeters being used in some example embodiments.

In embodiments where the substrates move relative to the PGU during processing the substrate may move roughly in the direction of the width dimension of the elements and roughly perpendicular to the elements' length dimension. Example electrodes may be made at least partially of electrically conducting material such as metal, although they may also have parts which are poorly conducting. Electrodes cross sectional shape perpendicular to their length dimension may be generally rectangular in some embodiments but variations in such shape may be appropriate for some applications. Electrodes may either be connected to a source of RF, VHF, UHF or microwave current or energy, or may be connected to ground through reactive or resistive circuit components whose impedance is not excessively large. Dividers are in some embodiments approximately parallel to electrodes along their length dimension and may be of insulating or conducting material or both. If made all or partially of metal, that part of a divider may float electrically and be neither grounded nor be connected to a power source. In general, dividers may serve as conduits for gas flow and may also serve as a boundary for a region within which plasma is sustained. In some examples, electrodes and dividers may be supported either by a support structure on their side facing away from the substrate which may include dielectric and possibly metal, or at their ends in the direction of elongation.

In example embodiments, the elements of a PGU may be closely spaced from the substrate surface to be processed and from each other. An electrode within a PGU may have the same or different width from another electrode or divider, and its minimum distance from the substrate may be less than or approximately equal to either its width or its height, or both. In some embodiments such distance is much less than either the width or height. Such distance to the substrate may be approximately constant along all or most of the lengths of the electrodes and dividers. However, in some embodiments, such distance may vary, especially near the ends of electrodes, in order to counteract other end-effects in the plasma so that the process variation at the ends has reduced variation and acceptable uniformity over a greater fraction of the PGU length. Elements within a PGU, including both electrodes, and dividers, if used, may be closely spaced to the adjacent element(s) along the substantial part of their lengths. In some embodiments, some facing surfaces may be angled slightly in a plane perpendicular to the length dimension and may be substantially parallel along most of such length.

In example embodiments, the substrate is supported either on a neutral electrode directly or on a carrier that is supported on it. The substrate may be placed directly on the support, on intervening spacers (conducting or insulating), or suspended by the differential pressure of a gas cushion. In example embodiments, when a configuration with a stationary PGU and moving substrate is used, the parts that accomplish the substrate motion may either fully or partly form the neutral electrode, or act as non-conductive separation between the substrate and neutral electrode. In some embodiments, the neutral electrode may be generally more extensive along the direction of substrate motion than the powered electrodes so that there may be a common neutral electrode for multiple PGUs containing powered electrodes.

During substrate processing in some embodiments, gas is injected and flows toward the substrate within an element or between two elements, which may include electrode(s) or divider(s) or both. In some embodiments, such element or elements may be a powered electrode and an adjacent element or two dividers. In some embodiments, the plasma then diverts and flows parallel to the substrate surface, eventually flowing between a powered electrode and the substrate, and then diverts to flow between that electrode and a neighboring element and then to an exhaust port from the processing chamber. Such diversion in gas bulk flow direction may in some embodiments be by about 90 degrees. Such diversion in gas flow direction occurs in example embodiments without causing a recirculating flow pattern of the gas.

In some embodiments, the electrodes may have some edges rounded or beveled, in particular for one or more of the edges bounding that side facing the substrate, so that said diversion of the gas flow occurs without causing recirculation flows within the volume downstream from that edge. Further, it is also helpful for avoiding recirculation flows that the gap between such elements with rounded or beveled edge(s) and the facing surface, toward which the gas is flowing, be small so that recirculation flows are avoided. In some embodiments, such gap should be less than about three times the width of the channel which is diverting. Such careful control of the flow pattern of the gas may be important for optimum process performance in some applications, such as deposition of nanocrystalline silicon for thin film silicon photovoltaic panels. Such rounding or beveling of otherwise sharp edges may also be advantageous for either conducting or dielectric film deposition. In example embodiments, the gap between powered electrodes and substrate may be in the range of about 5 mm to 15 millimeters or any range subsumed therein. Based on this, and example pressure and gas flow ranges, the rounding of the edges appropriate to avoid recirculation flow may be in the range of about 1 mm to 10 mm in example embodiments or any range subsumed therein.

While gas may be ionized in the spaces between powered electrode(s) and the substrate in example embodiments, plasmas may also be formed in spaces between powered electrode and an adjacent element or between nearby elements in some embodiments, wherein gas may be flowing either toward or away from the substrate. In some embodiments gas may be activated by plasma during its initial flow toward the substrate. Such gas may include an inert gas and/or a gas/gases that chemically participate in the process, which may include either atomic or molecular species. If such gas is activated during passage between elements of a PGU, it can facilitate the breakdown or dissociation of the feed gas that provides the reactive species for substrate treatment. In some embodiments injected gas may flow toward the substrate in the space adjacent a powered electrode or in the space between divider and electrode or between two dividers or two electrodes. Whether or not activated, such gas may in some embodiments provide chemical isolation between adjoining processing regions associated with neighboring PGUs. Helium is one such gas that may be used to provide isolation without substantial chemical effects on other gases. In some embodiments where the gas injected toward the substrate can be more easily activated by electron impact than helium, when such gas then flows in the space between an electrode and the substrate it will also participate in the plasma reactions producing various species, some of which may be needed for the process.

For optimized process conditions in example embodiments, the plasmas between powered electrode(s) and substrate may have different power density, electron density and electron average energy than regions between electrodes and adjacent elements, depending on the particular application. This ability to independently and controllably vary the power densities in such adjacent plasma regions is a consequence of the electrode structure as well as the close control of the relative sizes of gaps between powered electrode(s) and substrate versus gaps between electrode and adjacent elements. The phase between the time-varying electrical potentials fed to each electrode in a PGU can also be varied to tune the relative power density in the gap between the powered electrodes versus the power density in the process region between the powered electrodes and the substrate. In some embodiments, such ratio of gaps can be varied by up to about 50% for the various applications. In some embodiments, the plasma between electrode and substrate will receive a higher power density from the electrode, and be of higher electron density and average energy than plasmas between electrode and adjacent elements. This will be particularly appropriate when either generation of reactive radicals immediately adjacent the substrate, or ion bombardment of the substrate are limiting or controlling reactions for that process application. On the other hand, in some embodiments of the process, such as deposition of silicon nitride with very low hydrogen content, the formation of nitrogen atoms by pre-dissociation of $N_2$ gas requires a great deal of energy and benefits from a configuration in which the plasma between a powered electrode and the adjacent element is of higher power density than that between the electrode and the substrate.

For processes requiring ion bombardment as a primary mechanism—such as reactive ion etching—the power density to the plasma, $D_p$, which is generally expressed in units of Watts per cubic centimeter per kiloPascal of pressure, will be higher than for processes where neutral species only are required, such as deposition of nanocrystalline silicon. Typically, ion-based processes will be characterized by a range of power densities that is roughly between about 3 and 100 $W/cm^3/kPascal$ or any range subsumed therein, whereas neutral-based processes may have $D_p$ between about 0.1 and about 10 $W/cm^3/kPascal$ or any range subsumed therein.

Such low power densities may be used for plasma-assisted deposition processes to avoid ion damage to the deposited films so that defect levels can be at or below a level that permit, for example, high photovoltaic efficiency in deposited silicon. In the case of nanocrystalline silicon, the defect levels may be less than or about several times $10^{16}$ per centimeter cubed. To achieve a high stabilized photovoltaic efficiency, above about 13%, it may be desirable to limit such defect levels below about $2\times10^{16}/cm^3$.

Shapes and positions of dividers, and electrodes may in some embodiments be chosen to greatly improve chemical isolation between adjacent PGUs when inert gas is injected through or between them. In some embodiments, the gap between the divider and the substrate may be very small, potentially as small as 0.05 mm or even less, to improve such isolation. In some embodiments the separation of a grounded electrode from the substrate may be very small. In some embodiments a substantial flow of inert gas such as helium or argon is injected through a grounded electrode or divider into a very narrow gap between itself and the substrate. In this case the gas may not be pre-activated by such passage. Such gas may also be injected between two closely spaced elements such as two dividers or grounded electrode and divider or powered electrode and divider so as to minimize diffusion of a process gas or gases from one PGU into the adjacent PGU where a different process step may be performed. This can be used to cause the flow of the process-causing species to consistently be in the same direction—which may be important if the substrate is moving relative to the PGU. In this case, whether or not there are multiple PGUs the direction of reactive species flow can be chosen to be either along or in the direction opposite to that of the substrate relative motion.

In some embodiments where there is a very small gap between divider or grounded electrode and substrate, and inert gas is injected through the divider, this can act as a sort of "gas bearing". Use of sufficient flows of gas and shaping of the divider(s) and possibly electrode liner may help prevent contact of the substrate with this element and help maintain more precisely the position of the substrate relative to the electrodes whether the substrate is stationary or moving, but especially when the substrate is moving. This may be important in controlling the process and making it have less variation in time due to fluctuations in the gap between powered electrode(s) and substrate. It is further useful in some embodiments that there be both injection of gas through a divider or between dividers as well as pumping through a different divider or between a different pair of dividers adjacent the location of injection, so that there can be a true gas bearing which maintains a very nearly constant gap between the dividers and the substrate. This may help maintain a constant gap between powered electrodes and substrate and therefore controlling and/or making constant in time the processing rate, which may depend on such gap. In this case the ratio of the power densities in the plasmas between electrodes or electrode and divider relative to the power density between electrode and substrate are kept more constant and may provide for better consistency in process results.

In general, as gas flows through a series of channels it may undergo expansion and its bulk flow speed will decrease if the cross sectional area of the channel through which it flows increases. Such flow into an expanded channel or region may cause gas cooling. In example embodiments, a flow channel may to have an area with width equal the length of the electrode or divider, and height equal the distance between the bounding electrode, substrate or divider surfaces. Contrary to the case of an expanding channel, the gas will tend to accelerate and undergo some compression if the cross section area of its flow channel decreases. If the walls of the channel get hotter or the gas is heated by plasma the flow speed will tend to increase, while cooling walls will cause deceleration. In example embodiments, there may be a change in the cross sectional area of the channel along the flow path of the gas, and in plasma power density and/or the wall temperatures such that the gas temperature and/or bulk flow speed will change as it moves from one plasma region to another. In particular, the temperature of the gas may decrease slightly as it flows from the region between powered electrode and substrate into the region between elements on its way to the exhaust due to lower power density in the plasma in this region. However, in example embodiments, any such decrease in gas temperature may be small so that particulate growth in this region is minimal and does not adversely affect the results of the process. In example embodiments, such "effective" cross sectional area of the flow channel does not change by more than about a factor of three, and the power density in the plasma does not decrease by a large factor (for example, more than 10 times) from one region to the next, so that abrupt cooling of the gas stream is avoided. In some processes said abrupt cooling would result in rapid growth of particulates in the gas phase which would cause contamination on the substrate and poor process performance. In some cases the "effective" flow channel cross section area for a particular flow path may be less than the full channel area when gas flows from a single channel into two separate channels. Conversely, when flow combines from two initial channels into a single channel the effective channel cross section of the flowing gas from each initial channel in the combined channel may effectively be less than the full area of the combined channel as regards its effect on gas expansion and cooling. Further, by keeping plasma power density and/or wall temperatures elevated along most or the entire flow path the gas may be kept hotter along the entire flow path so that the gas temperature does not change much during its passage through the reactor. This, along with avoiding of large increases in the cross sectional flow area prevents sudden gas cooling or slowing in bulk flow speed during its residence time in the reactor, may result in reduced particle formation in some embodiments where depositing species are present in the gas phase, which for some applications may improve process performance. Since particle growth is so much faster in gases where the temperature is less than about 100° C., the gas temperature may be kept above about 100° C. throughout the flow path of the plasma in example embodiments. Example embodiments may maintain such high gas temperature because it avoids rapid expansions in the cross section for flow and maintains all surfaces in contact with the gas flowing through the plasma above about 100° C.

To enhance the ability to control plasma activity in the exhaust manifold in example embodiments, additional electrode(s) may be added as part of the exhaust manifold relative to the previously described configurations. A gas that improves the volatility of gaseous reaction byproducts, and/or volatilizes deposited films may also be added to the exhaust region during the deposition cycle. This cleaning gas may, or may not need to be activated by plasma activity.

After a certain amount of continuous processing, a complete cleaning cycle may still be required in some embodiments. A complete cleaning cycle may involve injecting a cleaning gas via the input manifolds that volatilizes films and particles deposited on the liner or electrode surfaces. The reaction of the cleaning gas may be activated by plasma, temperature, or both. The cleaning cycle may be performed on the heated liners directly after a deposition cycle, or the liners may first be heated by an additional heating mechanism for cleaning, such as a plasma created by a non-reactive gas.

A particular issue pertaining to in-situ cleaning of processing systems is that the amount of contamination to be cleaned may not be uniformly distributed. For example, in silicon deposition systems the exhaust region may need more cleaning than the processing region, which in turn may require more cleaning than the pre-activation region. In addition, the cleaning gas may also attack clean surfaces, creating undesired damage and particles. In example embodiments, the voltage phases to the electrodes may be adjusted during the cleaning cycle to be different from the deposition cycle. This method provides the capability to increase power dissipation to particular regions around each electrode as required during the cleaning cycle to enhance removal of deposits and particles where most needed and reduce attack on surfaces that need less cleaning. Gas composition and/or injection location may also be adjusted during the cleaning cycle to improve its effectiveness.

In some embodiments the gas injected through an electrode into the process plasma may come from two or more separate upper reservoirs within that electrode that are both connected with a lower reservoir within the electrode. The lower reservoir may feed three or more rows of holes conveying gas into the space between that electrode and the substrate. In some embodiments, provision of different gas compositions to the separate upper reservoirs within the electrode(s) can cause the process gas injected from successive rows of injection holes to have a composition that varies with a desired functional dependence on the position in the process plasma. This may be used to control the gas phase concentrations of species produced in the plasma to give either a desired uniform process along the width direction, perpendicular to the long direction of the PGUs, or perform a process with a desired non-uniformity. In the case of deposition of nanocrystalline silicon, the injection of a gas mixture to the plasma between powered electrode and substrate having increasing fractional silane or disilane content along the direction of bulk gas flow may permit much more uniform properties of the deposited nc-Si:H film—increasing the photo conversion efficiency of the cells and the value of the process.

In example embodiments, the cross-section of a powered electrode may be rectangular with a roughly uniform gap formed between adjacent electrodes, but more complex shapes and gaps may also be formed if beneficial for some applications. Long edges of electrode or dividers may be rounded with curvature radius chosen to avoid recirculation flows as the gas stream passes such edges and flow proceeds into the next region on its way to the exhaust. The minimum gaps formed between powered electrodes, between powered electrodes and substrate, and between electrodes and dividers may all be less than the width or less than the height of the electrodes or less than both. Such gaps may vary depending on the position between two facing surfaces, but the amount of such variation may be less than the minimum gap in example embodiments. In some embodiments, the gap is mostly uniform and the facing surfaces are substantially parallel over most of such areas. Said uniform spacing between facing surfaces wherein plasma is generated may tend to make the plasma density within such volume more uniform, which may improve the process performance. In some embodiments, at least one of the powered electrodes in a PGU may also be wider than the gap formed between the substrate and powered electrode. This causes the plasma properties in such region adjacent the substrate to be controlled independently from those in adjoining regions and maintains substantial sheath potentials that provide particle bombardment to the surface whose energy depends on the gas density.

The powered electrode(s) may in some embodiments be mounted directly to, or close to, a dielectric structure that may provide conduits for gas supply, cooling water, and gas exhaust, and in some embodiments provide physical support. Inert and/or reactive gases may in some embodiments be injected from the dielectric structure into the gap region formed between two powered electrodes. Gas injection manifolds formed inside one, or both, of the powered electrodes may also be used to supply gas directly to the electrode gap and/or processing region. In some embodiments, after flowing by the processing region, gas flows toward exhaust ports near one, or both, of the powered electrodes in each PGU. In some embodiments, the powered electrodes may be connected to appropriate sources of RF, VHF, UHF or microwave current so as to create sustained plasma in such regions where gas is flowing toward the exhausts.

In some embodiments a metal electrode which is connected to a power source or to ground has plasma-facing surface(s) that are covered by dielectric or weakly-conducting liners. In example embodiments, these liners may be directly deposited onto the electrodes or may be a separate body attached to the electrodes maintaining a finite but small gap to the electrode to allow their surfaces that are in contact with the plasma to be at a somewhat higher temperature than the electrode. In some applications it is advantageous that the surfaces contacting the plasma be as hot as possible so that it may be advantageous to use materials for liners such as quartz or even "opaque" quartz which have lower thermal conductivity in order that the surface temperature be higher for a given heat flux to the surface. Materials may be used, such as quartz or other dielectric or low-conductivity metal that have a very low coefficient of thermal expansion so that the liner does not expand very much relative to the electrode which may be cooled by fluid flow or other methods. The small thermal expansion reduces potential rubbing between the liner and inner body and maintains alignment of holes in the liner with holes in the inner body of the electrode—in particular holes that may be for injecting process gas into the plasma. In example embodiments the gap of the inner body to the liner may be less than a minimum distance within which plasma can be sustained at the process pressure, so that there is no plasma generated between electrode surface and the liner. The gap between liner and electrode may be chosen based on the gas pressure and heat flux to the liner so that the temperature of the liner's outer surface may be profiled in accordance with the requirements of the process. In using such liner(s), the surface of the liner may be the effective interface with the plasma and may be the effective surface for RF, VHF or UHF currents transmission to the plasma whether said liners are of conductive or dielectric material. In example embodiments, the gap between the electrode and liner may be between about 0.05 mm and about 3 mm or any range subsumed therein, depending on the gas pressure and AC power density and frequency. Generally, higher pressures and lower AC frequencies make smaller gaps necessary.

Figure 7:
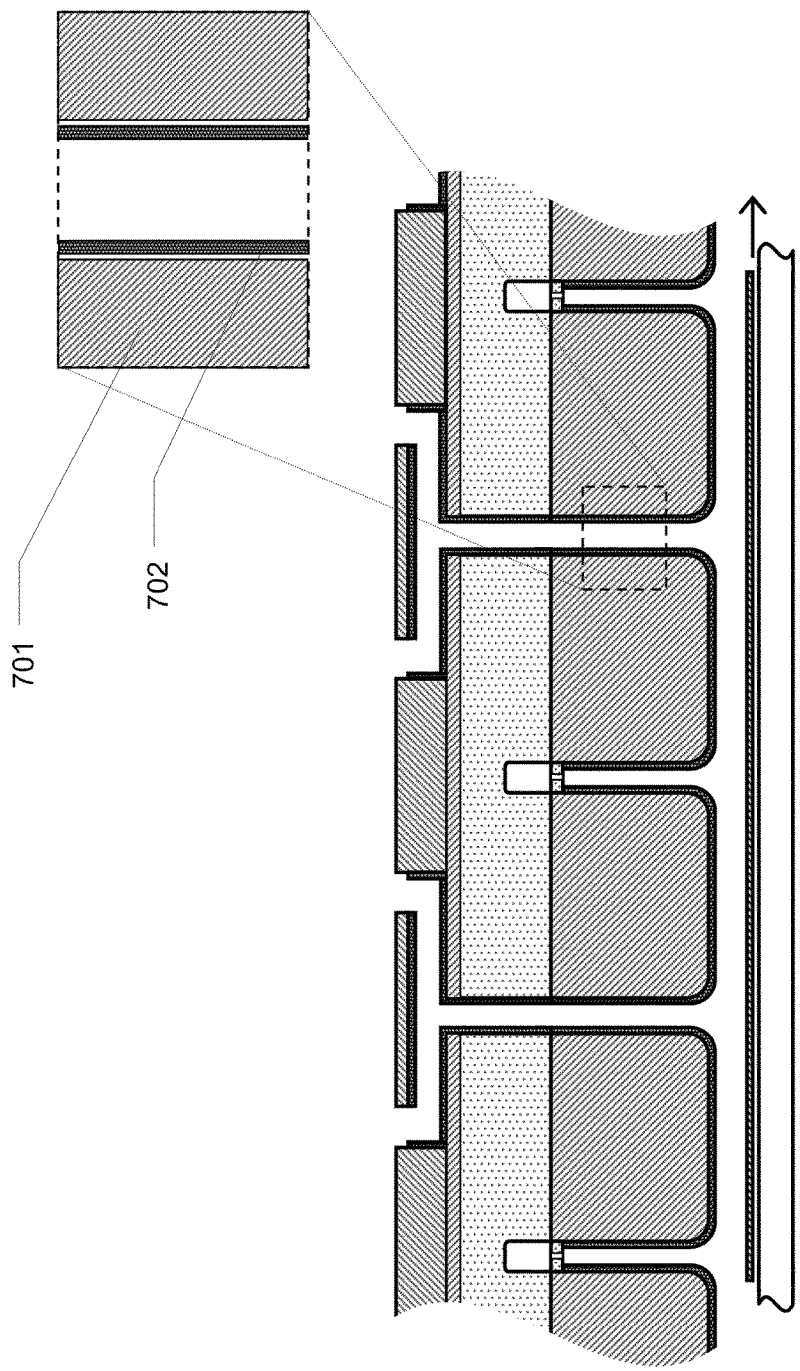
FIG. 7 shows the example arrangement of FIG. 6 with the addition of dielectric shields or liners mounted to the electrodes with a narrow gap to the electrode body.

In some embodiments, the gap between inner surface of the liner and the electrode surface, as shown in FIG. 7, is constant within about 10% over a majority of that face opposite the substrate or facing another electrode. In some embodiments, the thickness of the liner is approximately constant over the majority of the liner area. In embodiments where both gap and thickness are constant, the AC impedance of the gap and liner combined in series may be roughly constant over most of that face of the electrode surface. In this case, when the electrode surface AC potential is constant and the plasma impedance approximately constant over the area of that face, the resulting surface potential on the liner will also be roughly constant. Further, in some of the above embodiments, the surface of the liner facing the plasma will be parallel to the surface of the underlying electrode over a majority of the electrode surface so that the gap from substrate to liner surface will be uniform if the gap from substrate to electrode is uniform.

In some example embodiments, some parts of the liner may be thicker or have raised ridges or pads with small dimension or dimensions so that in these places the shield actually contacts the electrode. This may be done to provide physical support for the shield or liner, to act as barriers minimizing gas flow between areas in the space between liner and electrode, or to control and keep more constant the gap between electrode and liner over most of its area. In such cases where a dimension of such area is narrow or small the effect on the uniformity of the AC impedance of the shield is minimal, preserving the uniformity of the electrical potential of the liner on its outer surface given uniform surface potential on the electrode. In some example embodiments, there may be narrow grooves or other small shaped recesses in the electrode surface into which raised or thicker areas of the liner may fit, but such may not cause substantial potential variation on the outer surface of the liner or perturb the general uniformity of the impedance of the liner.

In some embodiments, the liner may be designed so that the gap between electrode and liner is controllable and does not vary substantially over time in different regions of the electrode. In some embodiments, this gap does not vary by more than about 10% or 0.1 mm, whichever is larger. In some configurations, the space between powered electrodes may be partially filled by such dielectric liners, but the configuration of gas flows in different plasma regions is not affected. In some example embodiments, the size of the gap between liner and inner body of the electrode(s) may be made to vary with position on the inner body surface in order to cause the RF, VHF, UHF, or microwave intensity at the outer surface of said liner to have a desired dependence on position. This may permit the power density injected into the plasma to be shaped as desired to meet requirements of the process. The thickness of the liner as well as the gap may in some embodiments vary with position so that the combined effect of their series impedances causes the power density of the injected RF, VHF, UHF, or microwave power to have the desired dependence on position. In some embodiments there may be multiple layers of such liners covering such inner body where the gaps between them are so small that plasmas are not formed between any adjacent inner surfaces. While such liners may represent substantial RF, VHF, UHF, or microwave reactive impedance, they may also have small enough thickness and gap that such reactive impedance is not excessive. In some applications at higher gas pressures (above about 200 Pascals for example), the gap may be less than about 1 mm in some embodiments.

In some embodiments, the gap causes the liner to maintain a temperature substantially above that in the electrode inner body. Use of different gas compositions and different gas pressures will in general affect the thermal conduction from the liner to the inner body. Should the mixture use substantial amounts of light gases such as hydrogen or helium the temperature of the liner will be closer to that of the inner body, whereas use of argon as principal gas with minimal amounts of hydrogen and little or no helium will result in higher temperature differential between liner and inner body—which for normal heat fluxes to the liner between about 1 and 3 W/cm$^2$, the liner may be between about 50° C. and 150° C. hotter than the electrode inner body. Walls in contact with the plasma can thus be kept above about 100° C. In this case the gas temperature in the plasma will for modest levels of plasma power be everywhere hotter than the lowest temperature body in contact with it—typically the walls—and therefore can be maintained above 100° C. or higher. Gas temperatures throughout the plasma volume may with such liners be maintained with a minimum between about 100° C. and 200° C. or above, which may for some applications have beneficial effects.

In order to avoid direct plasma exposure of bare electrode surfaces that may have much higher surface voltages and potentially cause various problems, a liner configuration may be used that avoids line-of-sight exposure of electrode to plasma. Yet, for some applications gas may need to be injected from the electrode into the plasma via a provided conduction path. Some embodiments of such a liner may include baffles covering any hole or narrow slot in such liners, where such baffles are spaced narrowly from the rest of the liner on three sides so that the gas flows around the baffle and then through holes or slots into the plasma. If gaps are narrow no plasma will be sustained therein and very few ions will strike the electrodes.

In some embodiments, there are two opposite directions of gas flow across the substrate, both perpendicular to the long direction of electrodes and parallel to the substrate surface, while in other embodiments there may be but a single direction of bulk flow of gas along the surface of the substrate. Single direction flow can in some embodiments be accomplished by use of dividers which have very small gaps to the substrate, and where inert gas may be injected so as to greatly reduce flow of process gas in the direction from the region of process gas injection toward said inert gas injection. In some embodiments the substrate moves relative to the PGU. In this case the flow of gases may be either bi-directional with flow in some areas along the direction of apparent substrate motion and in other areas opposite to it. In other embodiments the flow may be only along the direction of the substrate's apparent motion as observed from the PGU, or alternatively may in some embodiments be opposite to the substrate apparent motion.

In some embodiments, the space between two powered electrodes in a PGU may be completely filled with an insulating material and all gases may be introduced through holes in the powered electrodes. The electrodes lower surfaces that face the depositing plasma may also be covered by one or more insulating liners. The outermost such layer may have small holes that support hollow cathode discharges that can cause utilization rate of the feed gases to be higher than in normal parallel plate discharges.

Additional examples of PGU configurations which may be used in example embodiments are schematically illustrated in FIGS. 4a to 4l. These PGUs, for example, may be used as the PGUs in processing chambers 100 or 200 or may be used in other configurations as described above.

FIG. 4a illustrates an example embodiment with a PGU having two electrodes, 401 and 402, wherein gas flows toward the substrate between said electrodes, both of which may be provided alternating current from a power source which may be at RF, VHF, UHF or microwave frequencies, or combinations thereof. The gas stream flows to the substrate, 400, and splits, diverting so some gas enters the region between each electrode and the substrate, and then after flowing past such electrodes diverts again to flow upward between each electrode and the adjacent surfaces, or elements on both sides which may be elements of another PGU, or end-pieces wherein plasmas may in some embodiments also be formed. It should be noted in FIG. 4a that gas flow direction, after issuing from the gap between powered electrodes, is to the left under the powered electrode 401 and to the right under the electrode 402. The result is that gas flows in opposite directions through the adjacent two regions of the substrate that face the two electrodes. As shown in FIG. 4a, the electrode surfaces facing the substrate are mostly flat in the depicted embodiments and parallel so that the gap within which the gas flows is nearly constant, creating a nearly constant cross sectional area of the channel through which the gas flows. The gaps between powered electrodes, between powered electrodes and substrate, and between powered electrodes and outside structures may all be set independently. In some embodiments, such different gaps should not have sizes so much different that the gas experiences substantial expansion along its flow path. Thus, gas is, from the point of injection, flowing successively through volumes whose cross sectional area does not increase by a factor more than about two. Thus, even as the gas diverts in its flow path within the chamber it does not undergo significant expansion or cooling.

In some embodiments having two powered electrodes, such as in FIG. 4a, such electrode surfaces facing either the other electrode or the substrate need not be flat or parallel so that slight gas expansion and compression does occur during flow in each region. Yet, some embodiments may limit such volumetric expansion or compression along the flow path to less than a factor of about 2 so that gas cooling in such locations is not excessive.

FIG. 4b illustrates an example configuration of a two electrode PGU wherein one is grounded, 411, and the other, 412, is provided alternating current which may be at RF, VHF, UHF or microwave frequencies or combinations thereof. Said grounded electrode 411, may or may not have an insulator segment at its end adjacent the substrate. In some embodiments the gap between the substrate, 400, and the bottom of the grounded electrode 411 is small compared to the gap between the substrate 400 and bottom of powered electrode 412 to induce the gas injected from the top between the grounded electrode 411 and the powered electrode 412, which may be inert gas, to flow substantially to the right under the powered electrode 412 due to the effective barrier to gas flow provided by the narrower gap to the substrate at the bottom of the grounded electrode. In order to make this barrier effective, the gap between such grounded electrode, 411, and the substrate, 400, may in some embodiments be very small, much smaller than that between the powered electrode and the substrate so that little or no plasma is generated in this gap. In some embodiments gas for the process may be injected from the bottom of the powered electrode, 412, into the region between that electrode and the substrate. In some embodiments inert gas may also be injected through the grounded electrode into the gap between it and the substrate. In embodiments where inert gas is injected from the bottom of the grounded electrode, that gas may flow in both directions, to left and/or right, so that gases flowing on either side of the grounded electrode are largely kept separate. The formation of flow barrier may be most effective when the gap between the substrate and the grounded electrode is less than about 2 mm, and in some embodiments less than or about 0.2 mm but more than about 0.02 mm. The effect of such a small gap is illustrated in FIG. 4b, minimizing the flow of process gases toward the left from the region under the powered electrode and more effectively makes the direction of flow of process species in the PGU only to the right. The resultant pattern of flow of gas sequentially being first down flow towards the substrate between grounded and powered electrode, then diverting such flow to pass between powered electrode and substrate, and then diverting again, in embodiments having multiple adjacent such PGUs, into an up flow away from the substrate between the powered electrode and the grounded electrode of an adjacent PGU. Such flow pattern may be continued in adjacent PGUs and other PGUs of the same design present in the chamber. In this way, in embodiments where there is a substrate moving to the right or left relative to the PGU, the flow of process gases may be made unidirectional either along the direction of the substrates motion relative to the PGU, or opposite to that motion. Such unidirectional gas glow could, for some applications, be useful in improving process results relative to those having bidirectional flow such as in FIG. 4a. In some embodiments such flow may be in the same direction as the movement of the substrate relative to the PGU.

In some embodiments exemplified by FIG. 4b the injection of inert gas through the bottom of the grounded electrode 411 can prevent the substrate moving up to touch the bottom of the electrode and help control the gap between the grounded electrode and the substrate.

FIG. 4c schematically illustrates an example embodiment of a PGU configuration similar to that of FIG. 4a, but which may be used when adjacent PGUs are performing processes using different gas mixtures, and there is need for processes gases in adjacent PGUs to be isolated. In this case, in addition to the powered electrodes, 421 and 422, there is a grounded electrode, 423, with a very small gap to the substrate, similar to that in FIG. 4b, which also may serve for injecting inert gas both adjacent to it and through it. In some embodiments the flow path of the gases starts between the powered electrodes wherein gas injected from the top moves toward the substrate, 400, and then after passing the electrodes the flow divides into two paths in to the regions between each of the two powered electrodes and the substrate. After passing through the regions between the powered electrodes and the substrate the flows in both directions divert again and move upward away from the substrate and then to the exhaust. This path for upward flow is formed for electrode 422 by the gap to the grounded electrode 423. For powered electrode 421 the upward flow path is formed either by the gap to an adjacent PGU, or an element that is part of the chamber 100 or 200. In the embodiments illustrated by FIG. 4c there may be gas injection from each powered electrode into the gas and plasma region between itself and the substrate. In some embodiments there may also be injection of process gases from one or both powered electrodes into the space between the two powered electrodes, 421 and 422. Also, there may be liners covering the powered electrodes and there may also be a liner covering any grounded electrode in each such PGU. The AC power provided to the electrodes may be from the RF, VHF, UHF or microwave frequency, or combination thereof. In some embodiments there is plasma in the space between powered electrodes, between powered electrodes and the substrate and between powered electrodes and grounded electrodes. In some embodiments the power densities and electron densities of any such plasma does not differ from any other by more than about a factor of 5. In some embodiments the edges, 404 in FIGS. 4a and 424 in FIG. 4c, of the side of the powered electrodes facing the substrate may be rounded with curvature radius such that the gas flows continuously from one region to the next with a laminar flow and without recirculation.

FIG. 4d schematically illustrates an example embodiment of a PGU configuration having a powered electrode and a divider that is not electrically grounded. The divider 431 does not establish a strong electric field between itself and the powered electrode 432 and can, therefore, be placed in close proximity to the powered electrode. The divider can, for example, be made from dielectric material or of a conducting material if it is not connected to any ground or power supply. Gas is injected between the divider, 431, and powered electrode, 432, which then flows down toward the substrate, 400. The gap between divider and substrate may be smaller than that between powered electrode and substrate so that the gas injected between divider and electrode almost entirely flows to the right and under the electrode. Further, process gas may be introduced from the powered electrode into the region between itself and the substrate. Thus, the gas stream which initially flows downward diverts to flow under the electrode and then having passed the electrode diverts to flow upward away from the substrate. The gap between divider and electrode in some embodiments may be small so that the gas flowing through it does not break down and become activated. Alternatively, in other embodiments the gap may be sufficient for such gas to break down and be activated. Inert gas may also be introduced at the bottom of the divider so that it purges the gap between it and the substrate and provides a further barrier assuring that the gases injected from the electrode flow to the right. In some embodiments of this configuration there may be other PGUs closely spaced as in FIG. 1 so that the gas flowing upward will also be broken down to form a plasma between PGUs. Some embodiments have rounded edges on the bottom edges of the electrodes or dividers so that the gas flowing around them will do so in a non-recirculating manner.

FIG. 4e schematically illustrates an exemplary embodiment of a PGU with a central element, 442, which may either be a grounded electrode or a divider between two powered electrodes, 441 and 443. The gas injection paths toward the substrate in this embodiment are formed by the two gaps of the central element 442 to the two adjacent powered electrodes 441 and 443. Gas flowing towards the substrate diverts after exiting the gap formed along the powered electrodes, resulting in flow in opposite directions along the substrate surface into the regions under each of the powered electrodes 441 and 443, and the substrate 400. After passing under the electrodes 441 and 443 the gases divert to flow away from the substrate in the gaps formed between the electrodes and elements of adjacent PGUs on either side, or other adjacent structure or wall part of the chamber 100 or 200. The divergence of the injected gas flow can be enhanced by making the gap between the central element 442 and the substrate 400 smaller than the gap to the substrate between the two powered electrodes 441 and 443. FIG. 4e also illustrates an optional feature of gas injection from the bottom of the central element into the gap between it and the substrate 400. The addition of injection at the bottom of the central element serves to further isolate the chemically active species from one side relative to the other and to reduce gas recirculation in this region. Such a configuration is most appropriate when one or a few PGUs are used in a chamber, and deposition of more than one type of layer is required and, in particular, when the gaseous species necessary for formation of one layer is a contaminant for the formation of adjoining layer. In this case the isolation of the gases for one PGU process from an adjacent PGU process is an important advantage of this embodiment. In other cases the reason might be that the duration of the process or thickness of deposited layer should be very small and precisely controlled.

When a similar application as discussed in relation to FIG. 4e is to be performed, but a central exhaust is desired, then the configuration illustrated schematically by FIG. 4f may be suitable. This embodiment may use the same configuration as in FIG. 4e with a central element, 452, which is a divider or grounded electrode, and powered electrodes, 451 and 453, on either side. It can be seen that the principal visible difference between FIGS. 4e and 4f is that the gas flow direction is reversed so that gases are injected on the right and left sides of the PGU and exhausted adjacent the central element. If 452 is a grounded electrode then AC power to the two electrodes act independently, and the power feed to the two may be equal or different. In the case where the central element is a divider, if plasma is desired in the central channels on either side of the central element, the AC power to the two electrodes should be different—either out of phase or of different frequencies. As described previously in other embodiments, gas, which may be inert, may be injected from the base of the central element to improve the chemical isolation between the two sides.

FIG. 4g schematically illustrates an embodiment of a PGU with a unidirectional flow adjacent the substrate and chemical isolation from one PGU to the adjacent PGU. In this case, gas for activation or processing may be injected toward the substrate from between powered electrodes, 461 and 462, as well as between the left-most electrode and the adjacent PGU or structure. Gas may also be injected from the base of either or both powered electrodes. Further, the element on the right, 463, may be either a divider or grounded electrode, which also may serve as a source of inert gas or process gas. This configuration may be most appropriate when a process for surface treatment, etching or deposition in a PGU requires sequential or blended chemistries, or the process in this PGU should be isolated from that in an adjacent PGU, or region.

FIG. 4h schematically illustrates an example embodiment of a PGU that can accomplish chemical isolation between different PGUs or groups of PGUs. In this embodiment, two passive elements, 471 and 472, which are either grounded electrodes or dividers or one of each, serve to conduct gas through a narrow gap or channels between them to the space immediately adjacent the substrate. Such gap may be as in previous figures between about 0.02 mm and about 2 mm. The two passive elements 471 and 472 may have different gap distances to the substrate—within the above stated range—so as to cause the majority of said gas to flow either to the right or left. Such gas may in some embodiments be preferably inert so as to chemically isolate the regions to the left and right of this pair of elements. When better chemical isolation is desired between PGU the gaps between such passive elements and the substrate may be in the range between about 0.5 mm and 0.02 mm. To the right of said pair of passive elements is an AC powered electrode, 473. Such power may sustain plasma between electrode 473 and the element 472 which may activate gas injected down between these two. The flow pattern of gas in the PGU may be similar to that in FIG. 4d where process gases may be injected from the bottom of the powered electrode mixing with the gas flows previously described. This configuration is relatively easily fabricated, and in some embodiments the two passive elements may be held together with the gap between them being so narrow that plasma may not be sustained within. In this case the gas is not activated, and may serve only to purge that very narrow gap between such passive elements and the substrate, 400.

In case pre-activation of gas is not required before gas encounters the substrate, the configuration of FIG. 4i may be used instead of the previously discussed configuration described by FIG. 4h in example embodiments. In this case the two passive elements, 481 and 482, which may be either grounded electrodes or dividers or one each, have a narrow gap both between them and between element 482 and the powered electrode, 483. Gas may be injected through the space or channels between the passive elements and between element 482 and electrode 483. Said gas may be inert gas and causes a degree of isolation of the gas chemistry to the left of the passive elements from that under the powered electrode. As said gas stream is passing under the electrode, 483, additional gas may be injected into it from the bottom of this electrode to adjust the gas mixture in the region between the electrode and substrate 400. After passing through this region the gas flow diverts away from the substrate to the exhaust via the gap formed between the powered electrode 483 and elements from an adjacent PGU, or element or wall part of the chamber 100 or 200.

FIG. 4j schematically illustrates an embodiment of a PGU that can help accomplish smooth gas flow or avoid recirculation. In this case a divider, 491, is adjacent and closely spaced from a powered electrode, 492. There is also a second divider, 493, on the other side of the powered electrode and a second powered electrode, 494, furthest to the right. In some embodiments dividers 491 and 493 may be identical or very similar and the electrodes 492 and 494 may be of similar shapes. Said electrodes, 492 and 494, may have insulating protrusions at their bottoms as shown, or preferably an enlargement of an insulating liner such that the gap between this feature and the substrate, 400, is very small. When gas is injected between said divider and the electrode it flows out the bottom into a narrow gap adjacent the substrate and may serve to purge this region and prevent gas mixing between regions at the left and right sides. Gas may also be injected from the bottom of the electrode, 492.

After passing the electrode the gas diverts to flow away from the substrate between that electrode and the adjacent divider, 493.

FIG. 4k schematically illustrates an example embodiment of a PGU with an additional divider which may help to minimize or eliminate stagnation flow regions adjacent to the substrate. This embodiment is that of FIG. 4a with an added feature so the numbering is repeated for their common components. Gas is injected and flows toward the substrate between powered electrodes, 401 and 402, divides upon reaching the divider, 403, and two separate streams then pass in opposite directions under the two powered electrodes. Additional gas may also be injected from the electrodes to combine with the flow already passing along the substrate. After the gas streams pass through the regions below each electrode it is diverted away from the substrate surface along the opposite side of each electrode by the means previously described in other embodiments. A divider 403, may be located with a very narrow gap to the substrate, 400, so as to suppress plasma in the narrow space between them. This kind of divider may also be supported from above as part of a longer divider structure. In embodiments where the divider, 403, is made of dielectric material, such as quartz or aluminum oxide, it may have a minimal effect on the plasma discharge sustained by the AC currents to the powered electrodes. Should the divider be made of metal or other good conductor it may serve to enhance plasma density in those regions between itself and the two adjacent electrodes.

FIG. 4l schematically illustrates an example embodiment of a PGU that combines the features of a unidirectional flow along the substrate surface and control of the gap distance to the substrate 400. Here, the element, 495, which may be a divider or grounded electrode, has a shape that promotes recirculation-free flow of gas injected between itself and the powered electrode, 496. Gas may be injected from the underside of the element, 495, so as to purge the narrow gap between that element and the substrate, 400. Such purge serves to chemically isolate regions at the left from regions at the right of said element. The shape of said divider is such as to maximize the gas pressure in the gap to further promote chemical isolation. The gas flow from said element may also prevent the substrate from touching the bottom of said element, and thereby help control the gap between powered electrode and substrate. Further, in some embodiments there may be a duct also within said element that leads to an exhaust so that some of the gas that is injected from the bottom of this element is also pumped out before it can flow into the region around the powered electrode. This may help to minimize the effect of such gas participating in the process. In embodiments including such feature the gap between the element, 495, and the substrate, 400, may be so narrow that the combined injection and pumping of gas serves as a gas "bearing" which serves to exert gas pressure that keeps the substrate within tighter limits at the desired distance from the powered electrode. This may be of particular importance when substrates are moving relative to the PGU and "oscillations" of the substrate may otherwise cause substantial variation in the gap to the powered electrode resulting in non-uniformity of process characteristics. Thus, such a feature as the divider both isolates the adjacent regions chemically from each other and helps keep more stable the gaps from electrodes to substrate. These may be important for improved control, uniformity and repeatability of processes performed on the substrate surface.

Figure 5:
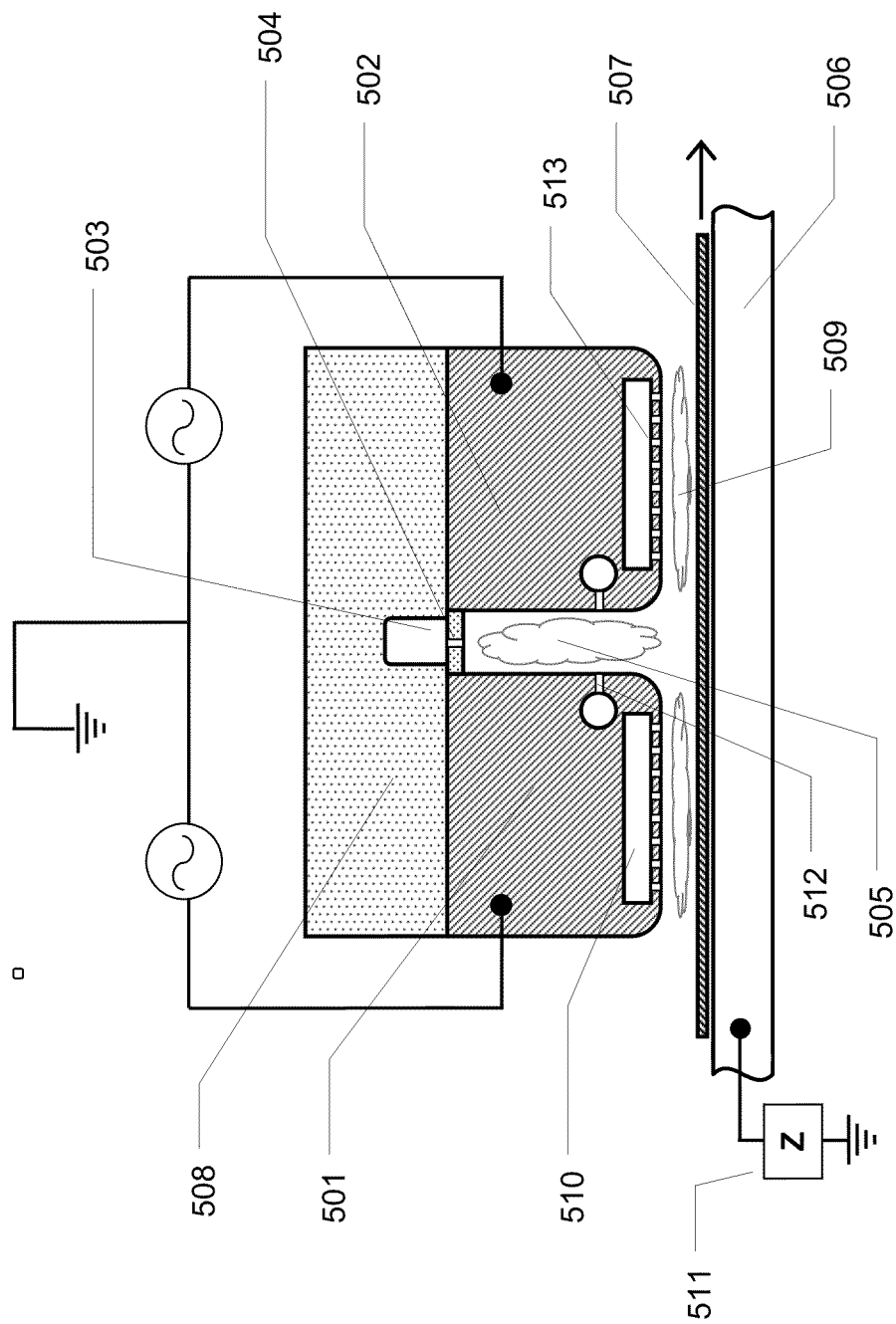
FIG. 5 shows the cross sectional view, radio frequency (RF) or VHF supply configuration and plasma regions of a symmetrical two electrode PGU according to an example embodiment.

In some example embodiments, as shown in FIG. 5, two powered electrodes in a PGU, 501 and 502, are connected to source(s) of RF, VHF, UHF or microwave power such that the instantaneous electrical current to one electrode, 501, is approximately equal in magnitude and opposite in sign to that of the other, 502. In the illustrated embodiment the powered electrodes are roughly mirror images of each other with a gap into which process gases are injected from a manifold, 503, through small holes, 504. In this gap there is also sustained plasma, 505, formed by the electrical breakdown of the gases due to the AC electrical potential difference between electrodes 501 and 502. There is also a support structure (which may be a neutral electrode), 506, on the opposite side of the substrate or carrier for substrates, 507, which is a neutral electrode, which may be connected to ground via a complex impedance Z, 511. This impedance 511 may come simply from a physical gap or strap(s) or from electrical components that are resistive, reactive (such as capacitors and inductors), and/or solid state elements such as diodes or varistors. The neutral electrode, 506, may physically support the substrate or a carrier for substrates. In this example embodiment, the neutral electrode, 506, is effectively a third electrode for each pair of powered electrodes such that together they comprise a triode. On the side of the electrodes opposite to the substrate, in some embodiments, there may be a dielectric support structure, 508, that serves to support and position electrodes 501 and 502. In some embodiments the support structure may be of metal with electrodes supported through standoffs made of insulating material. Alternatively, in some embodiments the support structure for powered electrodes may be the chamber wall and/or vacuum wall with standoffs made of insulating material.

The support 508 may also provide(s) channels for gases supplied both to the top of the plasma volume that is between electrodes, 505, as well as to the lower part of that volume that is between electrodes and substrate, 509. In some embodiments gases containing silicon and/or germanium are injected into the plasma from injection manifolds within the electrode(s), 510 and 512. In some embodiments the gases injected between electrodes and from within electrodes may contain hydrogen, oxygen, nitrogen, $N_2O$, inert gases, and gases containing silicon, germanium, or a metal such as zinc, tin, aluminum. It is noted that in the configuration of FIG. 5 in some embodiments the gap between electrodes, and that from electrodes to substrate, may be roughly constant along the length of such electrodes and both gaps are smaller than either the width of such electrodes or their heights. In some embodiments, these gaps may be much smaller than the width of the electrodes so that the potential in the plasma within such gaps is determined by the potentials of the two bounding surfaces which are closest, which may be powered electrode and substrate, or powered electrodes, unlike some other configurations where multiple electrodes are farther from the substrate relative to their width. Further, such gaps between electrodes and gaps from electrodes to substrate may be comparable in size. For example in some embodiments the gap between the electrodes 501 and 502 may be between about 0.6 cm and 1.5 cm while the gap between electrodes 501 and 502 and substrate 507 may be between about 0.5 cm and 1.5 cm. Such gaps may be chosen so that the ratio of power densities in the respective plasma regions—one region being between electrodes and the other between electrodes and substrate—will be optimal for the particular processing application. Some applications such as deposition of low-hydrogen silicon nitride or low temperature silicon oxide or silicon nitride may benefit from higher power density between electrodes than between electrodes and substrate. In example embodiments, the ratio of such power densities (Watts/cm$^3$) would not exceed about 10 and in many cases would not exceed a factor of about 5.

Further, in a particular embodiment the gaps may be chosen so that the cross sectional area of the flow channel formed by the gap between electrodes 501 and 502 is more than 50% of the cross sectional area of the flow channel formed by the gap between electrodes 501 and 502 and the substrate 507. This helps assure that the gas stream does not cool due to volumetric expansion as it flows from the one region into the other. When both power densities and channel cross sections, as well as temperatures of bounding surfaces are not much different, the gas temperature will not drop suddenly as the gas flows from one region into the next. It should be noted that in some embodiments the lower edges of the electrodes, 501 and 502, are rounded with a curvature radius greater than or about 1 mm so that the gas flow coming from the region between the electrode flows round such edges without forming recirculation flow patterns. The minimum radius of curvature for avoiding such recirculating flow depends on the flow speed and density of such gas, as well as the distance between the electrodes and the substrate. For example, at a gas pressure of about 4 kiloPascals and with a flow rate of about 4 SLM (Standard Liters per Minute) of gas per meter of electrode length and a gap between electrodes of about 8 mm and between electrodes and substrate of about 8 mm the minimum curvature radius for the edge may be about 1 mm in some embodiments. The maximum radius may be approximately equal or slightly greater than the gap between electrode and substrate in some embodiments. In some embodiments the radius preventing recirculating flows can be replaced by a facet or multiple facets—bevels—that effectively serve the same purpose.

The range of gas pressures in some embodiments as illustrated in FIG. 5 may be from about 200 Pascals to about 10,000 Pascals or any range subsumed therein. For embodiments in which dielectric materials are deposited where compressive stress is required at or above about 100 Mega-Pascals, the gas pressures may be in the range of from about 50 Pascals to about 500 Pascals or any range subsumed therein. For applications such as passivation coatings for polysilicon or crystalline solar cells where film stress should be low and ion bombardment of the substrate and growing film should be minimized, the pressure may be kept above about 1000 Pascals (1 kiloPascal) in some embodiments. Where smaller gaps between electrodes below about 10 mm and between substrate and electrodes below about 10 mm are used the pressure may be in the range of from about 5,000 Pascals to about 15,000 Pascals in example embodiments or any range subsumed therein.

Total gas flow within a PGU per meter of electrode length may be in the range of about 200 seem (Standard Cubic Centimeters per Minute) to 20 slm in example embodiments or any range subsumed therein. Flows may be in the higher end of the range above about 2 slm for processes at higher pressures above about 1000 Pascals. Typical gas composition depend on the particular application. Table I contains a list of some example applications and their associated gas mixtures together with projected ranges for pressure and gas flows that may be used in example embodiments. Such ranges of pressures, gas mixtures, flows and AC power levels may apply to processes that may be performed using any of the configurations shown in FIG. 1-3 or 5-11 using any of the PGUs show in FIGS. 4a-4l or combinations thereof. In some examples, the processes below may be performed with less than all of the gases listed. The example pressure and gas flow below include any range subsumed in the ranges listed below. These are examples only and other embodiments may use other gas mixtures, pressures and gas flow.

TABLE I

| PROCESS APPLICATION | GASES | GAS PRESSURE (Pascals) | TOTAL GAS FLOW (Standard Liters/ minute per meter of electrode length) |
|---|---|---|---|
| Deposition of Silicon Nitride having low Hydrogen content. | $N_2$, $Si_nH_{2n+2}$, $NH_3$, Ar, He, $SiF_4$, $NF_3$, $SiHCl_3$, $SiH_2Cl_2$ | 50 to 2000 | 0.1 to 5 |
| An exemplary embodiment of SiN deposition | $N_2$, $SiH_4$, Ar, He | 100 to 300 | 0.5 to 3 |
| Deposition of nano-crystalline Silicon for PV or LCD applications | Ar, He, $H_2$, $Si_nH_{2n+2}$ | 400 to 10,000 | 0.2 to 20 |
| An exemplary embodiment of nc-Si:H deposition | Ar, $H_2$, $SiH_4$ | 1000 to 4000 | 2.0 to 8 |
| Deposition of amorphous silicon | Ar, He, $H_2$, $Si_nH_{2n+2}$ | 400-10,000 | 0.5 to 20 |
| An exemplary embodiment of a-Si:H deposition | Ar, $H_2$, $SiH_4$ | 1000-4000 | 2.0 to 6 |
| Deposition of Silicon Oxide with compressive stress | TEOS, TMCTS, SiH4, $O_2$, $N_2O$, Ar, He, | 50-500 | 0.1 to 5 |
| Isotropic Etching of Silicon Nitride (Si3N4) at high rates (>10,000 A/minute) | $SF_6$, $CF_4$, $CHF_3$, $CH_3F$, Ar, $CH_2F_2$, $C_2F_6$, $NF_3$, $O_2$, $C_4F_8$, He, $N_2$, $NH_3$, $CH_4$, $Cl_2$, HCl | 500-15,000 | 1 to 20 |

TABLE I-continued

| PROCESS APPLICATION | GASES | GAS PRESSURE (Pascals) | TOTAL GAS FLOW (Standard Liters/minute per meter of electrode length) |
|---|---|---|---|
| Anisotropic Etching of Silicon Dioxide at high rates (>7000 A/min). | $SF_6$, $CF_4$, $CHF_3$, $CH_3F$, Ar, $CH_2F_2$, $C_2F_6$, $NF_3$, $O_2$, $C_4F_8$, He, $N_2$, $NH_3$, $CH_4$, $Cl_2$, HCl | 50-300 | 0.5 to 5 |
| Deposition of amorphous Carbon or Diamondlike Carbon Films | $CH4$, $CnH2n+2$, $C6H6$, $CnH4$, $CF4$, $CnH2n+2$, $H2$, Ar, He, | 1000-10,000 | 1 to 20 |
| Hydrogen Treatment or Annealing of Silicon or Carbon-based films | $H_2$, Ar, He | 300-10,000 | 0.1 to 2 |
| Deposition of ZnO | $O_2$, $N_2O$, $Zn(CH_3)_2$, He, Ar, $H_2O$, $NO_2$, dimethylzinc-triethylamine (DMZTA) | 20-2000 | 1 to 20 |
| Deposition of ZnAlO | $O_2$, $N_2O$, $Zn(CH_3)_2$, He, Ar, $H_2O$, $NO_2$, $Al(CH_3)_3$, DMZTA | 20-2,000 | 1 to 20 |
| Deposition of low temperature $SiO_2$ | TEOS, TMCTS, $SiH4$, $O_2$, $N_2O$, Ar, He, | 100-5000 | 0.1 to 2 |

The range of electrical power densities deposited in the plasmas in the region between the powered electrodes and in the region between each electrode and the substrate may vary over a substantial range depending on the gas pressure and the particular application desired. The active area (in centimeters squared) for estimating the injected power density within a PGU is approximately the sum of the area as projected on the facing electrodes in the gap between the powered electrodes and the areas of the powered electrodes as projected onto the substrate. The power density parameter is calculated by dividing the total power delivered to a PGU using a source of RF, VHF, UHF, or combinations thereof by the active area as calculated above. For higher pressures, above about 4,000 Pascals, it may be desirable to have at least about 1.0 $W/cm^2$ up to about 10 $W/cm^2$. However, for gas pressures below about 1,000 Pascals it may be desirable in some embodiments to have power injection less than about 3 $W/cm^2$ and possibly as low as about 0.1 $W/cm^2$ when the gas pressure is less than about 200 Pascals.

Another useful metric for RF, VHF or UHF power injection is the density of power injection per cubic centimeter of plasma volume, per kilo-Pascal of gas pressure. This is in effect a power input per molecule or atom in the gas. Weakly electronegative or inert species dominated plasma can be stable at a value of about 0.1 $W/cm^3$-kPascal or more, but become unstable much below this value. Electronegative gases require higher power densities to be stable. The processing applications we consider fall into roughly two categories—those that use ion bombardment as a primary process mechanism and those that rely almost exclusively on neutral species alone. For the former processes the density of power injection, $D_p$ ($W/cm^3$-kPascal) may be in the range of about 3 to 100 or any range subsumed therein. For the radical driven process the range of $D_p$ may be between about 0.1 and 10 or any range subsumed therein. The overall range for the power density parameter, $D_p$, for these example processes is between about 0.1 and 100 or any range subsumed therein.

Figure 6:
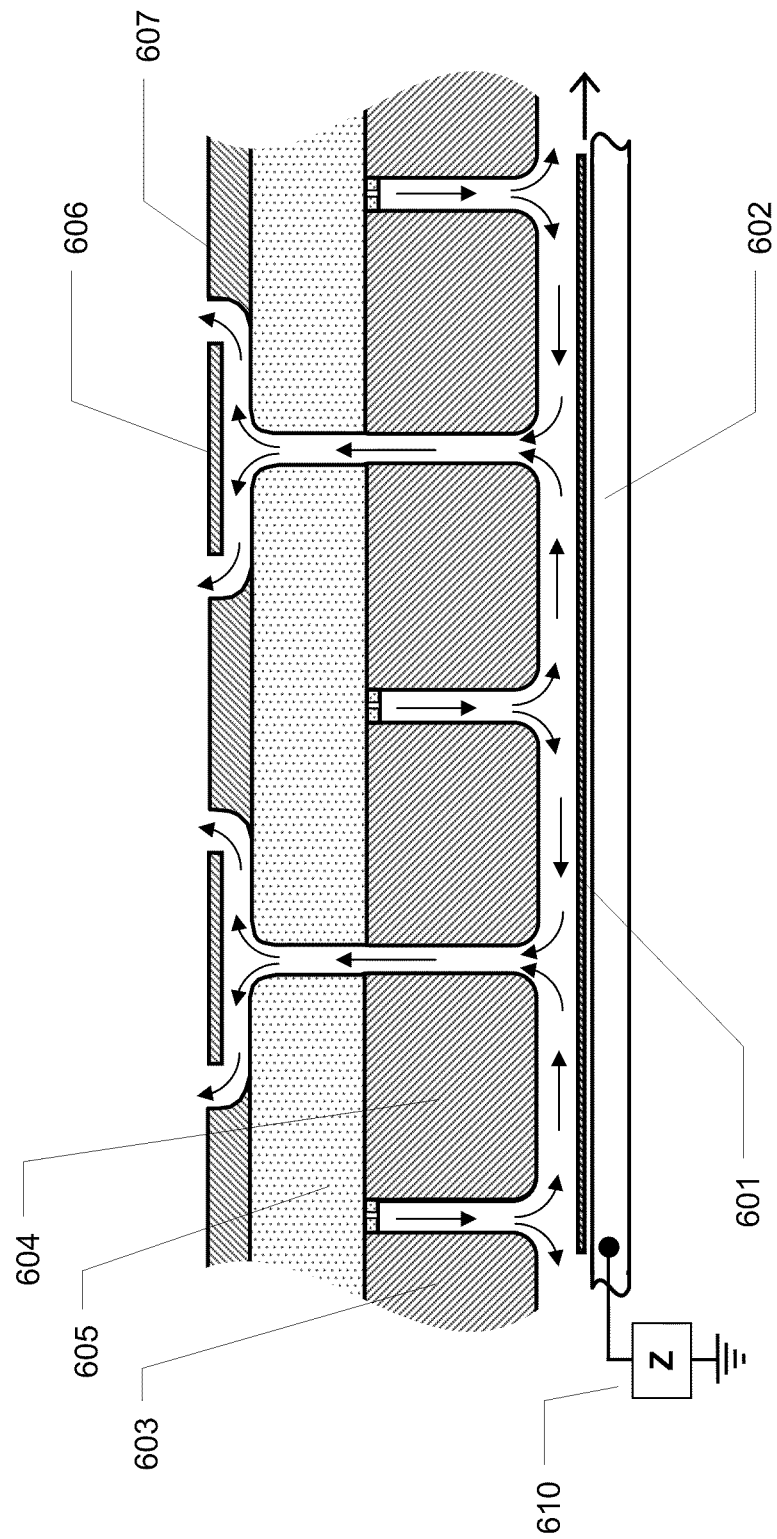
FIG. 6 shows the uniform gas flow paths and example arrangement for applications requiring multiple sources according to an example embodiment.

In an example embodiment illustrated schematically in FIG. 6, the substrate(s), 601, moves adjacent to multiple, closely spaced PGUs, each one similar to the PGU embodiment illustrated in FIG. 5. Supporting the substrate adjacent its opposite side a support structure (which may be a neutral electrode), 602, may be connected to ground in some embodiments through an impedance element 610 consisting of components such as inductors, capacitors, resistors which may be variable, or other solid state devices such as diodes or varistors. Alternatively, it may not be connected to grounded directly through components or may be grounded through a strap or straps that have some inductance. There may be an acceptable modest impedance to ground provided simply by the capacitance between a floating support pedestal or carrier and nearby grounded structures such as chamber wall(s). Such structure serves as an anode for the RF, VHF or UHF currents flowing from one or more electrodes. Typical total impedance from the neutral electrode 602 to ground may be in the range between less than or about 1 Ohm to about 10 Ohms or any range subsumed therein. In some embodiments the powered electrodes being in pairs having roughly opposite voltages at any instant in time will conduct to the support structure roughly equal and opposite RF, VHF or UHF currents so that the net current to the neutral support structure is substantially less than the current to either electrode. In this manner the voltage of the support structure and substrate may be kept small even though they may not be directly grounded due to the limitations imposed by the mechanism that moves the substrate.

While other gas injection locations may be used in other embodiments, FIG. 6 shows an example pattern of overall gas flow from initial injection to exhaust for a multi-PGU processing chamber according to an example embodiment. Gas initially injected into the gap between powered electrodes, 603 and 604, of each PGU flows through a plasma discharge in that gap towards the substrate until passing the electrodes where the gas flow splits into two streams that divert in opposite directions to flow between each electrode and the substrate or carrier for substrates that is underneath it. Such flow pattern is without recirculation due to the relatively narrow gap between powered electrode and substrate—that may be less than or about 1 cm, and the rounding of the bottom edges of the electrodes which may have radius of order 1 mm to as much as 2 cm. In some embodiments the rounding may be between about 3 mm and 6 mm when the pressure is between about 3000 Pascals and about 5000 Pascals and the flow rate between about 1.0 to about 5 slm per meter of PGU length. The flow of gas continues under the electrodes until it passes by them to where the gas stream meets that from the adjacent PGU, and these streams combine to flow away from the substrate towards the exhaust, again without recirculation in the flow stream. The flow then continues upward past the electrodes, 604, and past support structure, 605, diverting at the chamber wall, 606, where it continues to flow without recirculation around the rounded corner of the support structure, which may be an insulating material, to arrive at exhaust ports between the wall and the fixtures or standoffs, 607, for the support structure. The avoidance of gas expansion cooling and recirculation as practiced in these embodiments reduces formation of particulates in the gas phase for both deposition and etching processes using certain chemistries, and improves the resulting processes. There may be plasma present in this gap between the electrodes of adjacent PGU which will reduce the tendency for forming deposits on the walls of such channel or reduce the tendency for such deposits to produce gas phase particles.

In some embodiments, as illustrated schematically in FIG. 7, liners 702 can be used to cover surfaces 701 otherwise directly exposed to process gas. Such liners may be made of dielectric material or conducting material or both. Liner thickness may be from 0.1 to 10 mm, with more typical thicknesses from 1 to 5 mm. In some embodiments liner thickness may be varied according to position across the lined surfaces. In some embodiments liners may, over most of their area, be spaced a sufficiently small distance apart from the electrode, such that plasma is not sustained in that small space. In example embodiments, that gap may be between about 0.03 to about 5 mm or any range subsumed therein, depending on the gas pressure and power density, and may vary with position on the electrode. At gas pressures above about 1000 Pascals this gap may be less than or about 1 mm in example embodiments. In this manner the spatial distribution of the transmitted power density to the plasma may be modified—in some embodiments with the goal of making the power density and plasma density more uniform. Such liners may have only small areas of contact with the electrode surface in regions where that liner is exposed to plasma. In example embodiments, such areas of contact may have dimensions less than the thickness of the liner to minimize variations in sheath potential and transmitted power density. In some embodiments the dielectric may be glass, quartz, AlON, aluminum oxide, silicon nitride or other such materials. In some embodiments liners may be of conducting materials such as silicon, silicon carbide or other poor conductors that have such low electrical conductivity that their skin depth is comparable or larger than the thickness of the liner. Liners may also have thin coatings such as silicon dioxide, aluminum oxide or silicon which protect their surfaces from being affected by species generated from gases used in the process. These liners may cover the surfaces of an electrode and the surfaces of the support structure that might otherwise be exposed to the plasma or gas stream. Such liners may cover electrode surfaces facing the opposing electrode within a PGU, facing the adjacent electrode of an adjacent PGU, or facing the substrate, 601, or all surfaces otherwise exposed to the process plasma ambient. Such liners may be part of a single integrated structure, or be in segments, and may have one or more than one layer covering one or more sides of the electrodes. Such liners conduct to the plasma the RF, VHF, UHF or microwave frequency currents provided to the electrode, and thereby inject current and power into the plasma. In embodiments where gas is injected from the electrode, it needs to pass through such liner in order to reach the plasma. To permit such conduction of gas there may be holes in the liner. In some embodiments, the liner may be of porous material or there may be structures or openings in the liner(s) such that the gas may conduct to the plasma but very few ions and plasma fall directly onto the electrode. In some embodiments such a structure eliminates any line of sight from the plasma through the liner to the electrode, though obliquely angled holes may also be adequately effective.

Such liners may help to reduce the amount of heat conducted from the plasma to the electrodes as well as causing a hot surface to be present adjacent to the plasma and process environment. Such hot surface may have substantial process benefits depending on the particular process. Such hot surfaces receive the deposits from the plasma, while the electrodes may be at the same time kept cool so as to avoid problems with mismatch in thermal expansion during operation. Such heated surfaces may be easier to clean off by an in-situ cleaning process and are less likely to cause deposited material to flake off and put contaminants into the deposited film on the substrate.

For some embodiments with liners, the plasma density between the electrodes relative to that between electrodes and substrate, may be substantially modified by having different liner gaps or thicknesses in those regions. Such liner gaps and/or liner thickness may be made to differ by a factor of 2 or more, resulting in substantially different AC surface potentials on the liner surfaces in the two regions. Likewise, power and plasma densities in both of these regions may differ from those in regions between electrodes and the outside bounding surfaces in embodiments having plasma in such regions. Relative RF, VHF, UHF or microwave power densities in these different regions of plasma are also changed by varying the relative liner thickness or gap sizes between electrode and liner. In embodiments where liner(s) with dielectric properties are used, these may become the outer plasma-bounding surfaces and the liner thickness may be used to adjust the relative power density. Such dielectric liners may be made of materials that include dielectrics such as quartz or materials such as silicon or silicon carbide. By making thicker those parts of the liner covering the sides of electrodes facing each other, and making thinner those parts covering the sides facing the substrate, the relative power density and plasma density in the regions adjacent the substrate may be increased. For example, a quartz liner may be 2 mm thick in the areas facing the opposing electrode and 1 mm thick in the areas that face the substrate. This amount of liner thickness variation may substantially increase the power density adjacent the substrate relative to that between electrodes, even while the gaps between electrodes may be the same as that between electrodes and substrate.

Figure 8:
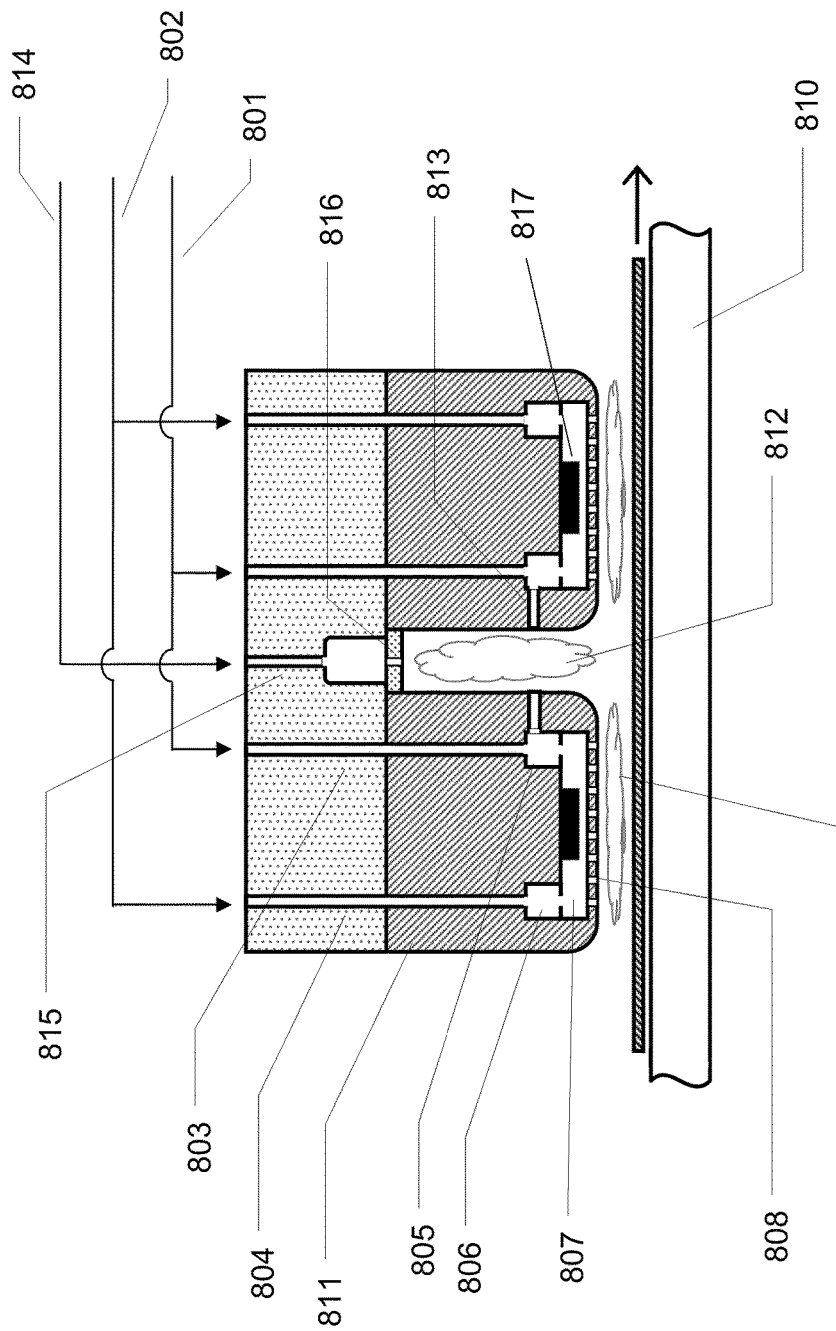
FIG. 8 illustrates an example gas injection feature that allows the combination of two independent gas flow channels to be added as a uniformly controlled distribution of added reactive gas to the substrate process region in accordance with an example embodiment.

FIG. 8 illustrates schematically a gas injection manifold structure that in some embodiments may be within an electrode, 811. Gases injected from such a manifold may include either inert gas and/or process gases, such as hydrogen, halogen, silicon, germanium or dopant containing gases. Such a gas injection manifold can also be used in other embodiments within a divider. The example embodiment illustrated in FIG. 8 includes the option of controlling the distribution and gas mixture across the width of the electrode bottom surface. In the embodiment illustrated schematically in FIG. 8, gas is first introduced from separately controlled supplies, 801 and 802, by ducts, 803 and 804, which pass through both support structures and the actual electrode or divider, to upper reservoirs, 805 and 806, within the electrode. These channels typically extend almost the full length of the electrodes and are connected to the lower reservoir, 807. In some embodiments the channels have much higher conductance along their length than the conductance to the lower reservoir, 807, such that gas effectively fills the upper reservoir 806 much faster than the holes to the lower reservoir can empty it. The lower reservoir also typically extends along almost the full length of the electrode or divider so as to be able to provide gas evenly along almost the full length of the plasma. In such manner the mixture delivered to the lower reservoir from each upper reservoir is almost exactly the same along the length of the reservoir. The lower reservoir has small holes, 808, that distribute this gas into the volume of plasma between that powered electrode and the substrate, 809, and similar holes, 813, for gas injection into leading to the space between electrodes. The lower reservoir in an electrode may have a baffle or flow restrictor, 817, within it which reduce the gas conductance in the direction parallel to the substrate motion. In this way the gases injected into the primary reservoirs, 805 and 806 will mix in proportions depending on the relative distances from the two primary reservoirs, and depending on the total flow of gas to the two upper reservoirs. Gas coming through holes, 813, for example will be virtually entirely coming from gas supply 801 via primary reservoirs, 805, due to the minimal diffusion of gas from supply 802 which fills upper reservoir 806. In this manner the gas mixture flowing from the rows of holes at increasing distance from reservoir 805 will have a decreasing proportion of gas from primary reservoir 805. There may be such small holes distributed in some manner over nearly the full width of the reservoir, thus introducing gas into the plasma over a substantial proportion of the width of the electrode. In some embodiments gas may also be injected from this reservoir into the volume between electrodes 812. Such gas may in part come from a separate supply of gas, 814, via an input channel to a reservoir in the insulating support, 815, and thence be injected through small holes, 816, into the plasma between electrodes, 812. The substrate is supported by a support, 810, which is also the neutral electrode that may be connected to ground by means previously described. The upper reservoirs may in some embodiments be connected to the lower reservoir near its opposite sides through holes or narrow channels or baffles. The lower reservoir may in some embodiments be a connected volume, and may in some embodiments, be divided into sections which may extend the length of the electrode with channels between them so that gas from the two upper reservoirs can mix in varying proportions in the different sections or regions of the lower reservoir. In some embodiments gas injected into the upper reservoirs, 805 and 806, flows along the length of these reservoirs as it more slowly flows into the adjacent part of the lower reservoir, 807. Gas from the two upper reservoirs then mixes within that lower reservoir in proportions that will vary with the position—specifically proportions that vary almost exclusively in the direction of the width dimension of the lower reservoir and of the electrode. Whatever the proportions of gases from the two upper channels that is in the mixture at any of the small holes, 808, will be the mixture delivered to the plasma by that hole. In this manner gas that is a mixture with proportions of gas from each upper reservoir that vary with the relative gas conductance from the two upper channels will be delivered to the plasma. In such manner the gas mixture delivered to the plasma may be made to be almost precisely constant along the length of the electrodes, so that the process is substantially constant in rate and properties along the length of the electrodes.

Figure 9:
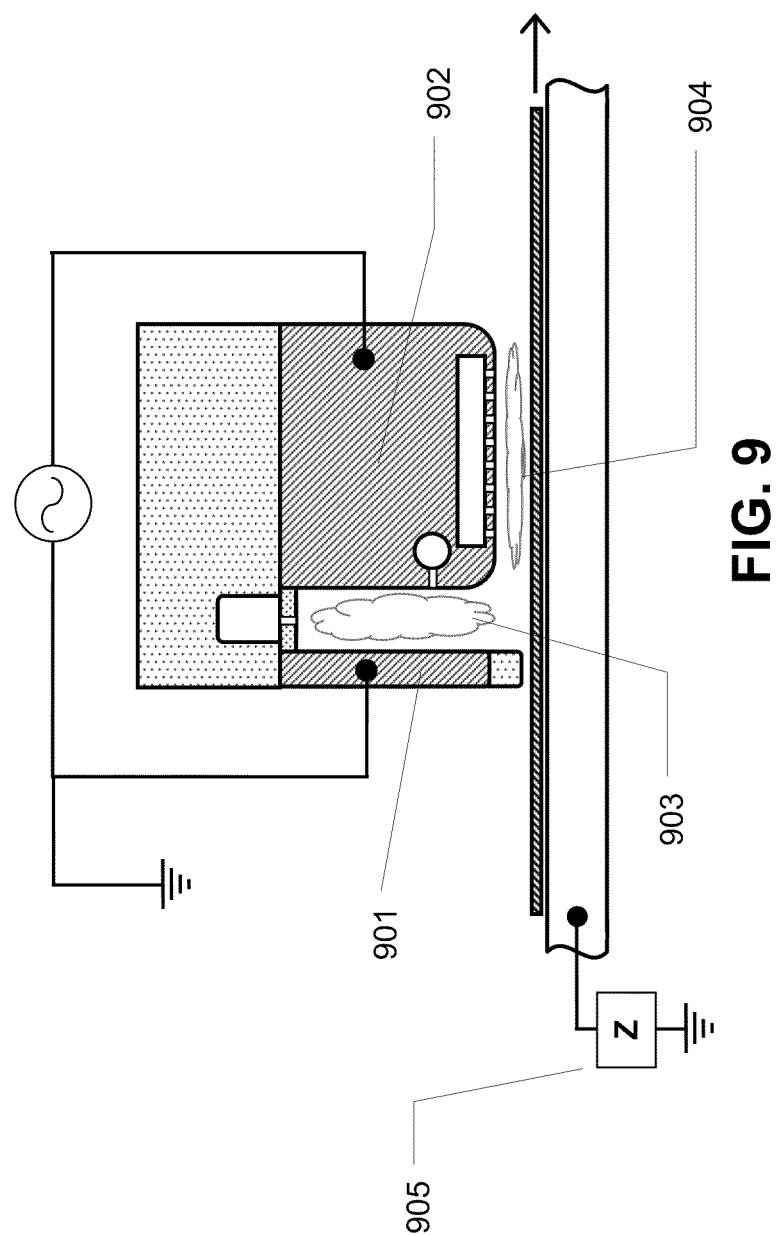
FIG. 9 shows an alternative PGU embodiment that accomplishes gas flow in only one direction along the substrate surface.

FIG. 9 schematically illustrates an example embodiment of a PGU that includes a grounded electrode, 901, and a powered electrode, 902. Plasma, 903, is generated between powered and grounded electrode by the application of an AC potential to the powered electrode, and plasma, 904, between powered electrode and substrate. Such plasmas are largely independent in power density, each being dependent on the gap between the powered electrode and the opposite surface, and the relative AC potentials across the gaps. A larger gap increases the electrical resistance of the plasma and thereby reduces the current density flowing across such gap. Therefore, the relative size of the gap between powered electrode and substrate versus the gap between electrodes will determine, in part, the proportion of the power supplied to powered electrodes that is actually deposited in each of the plasma regions. The proportion of power supplied to the different plasma regions may also be varied by the use of dielectric liners with different thicknesses, and gaps to liners for areas facing the substrate versus facing the grounded electrode. The impedance 905 from the neutral electrode to ground will also have an influence on the division of the RF, VHF, UHF or microwave current coming from the powered electrode and conducting to the grounded electrode or to the substrate. Should the impedance to ground of the neutral electrode be high it will cause more current to flow to the grounded electrode versus the substrate resulting in a denser plasma 903 in the region between electrodes, versus that adjacent the substrate, 904. In some embodiments a portion of the grounded electrode, 901, may be a dielectric material such as quartz or ceramic so that there is less likelihood of plasma forming in the gap between the grounded electrode and the substrate. In example embodiments, the gap between the tip of the grounded electrode and the substrate may be from 0.1 to 5 mm, or any range subsumed therein. In some example embodiments, this gap may be less than about 0.5 mm. There may be injection of inert gas from the bottom of the grounded electrode in some embodiments as well as injection of gas from a manifold within the powered electrode.

Figure 10:
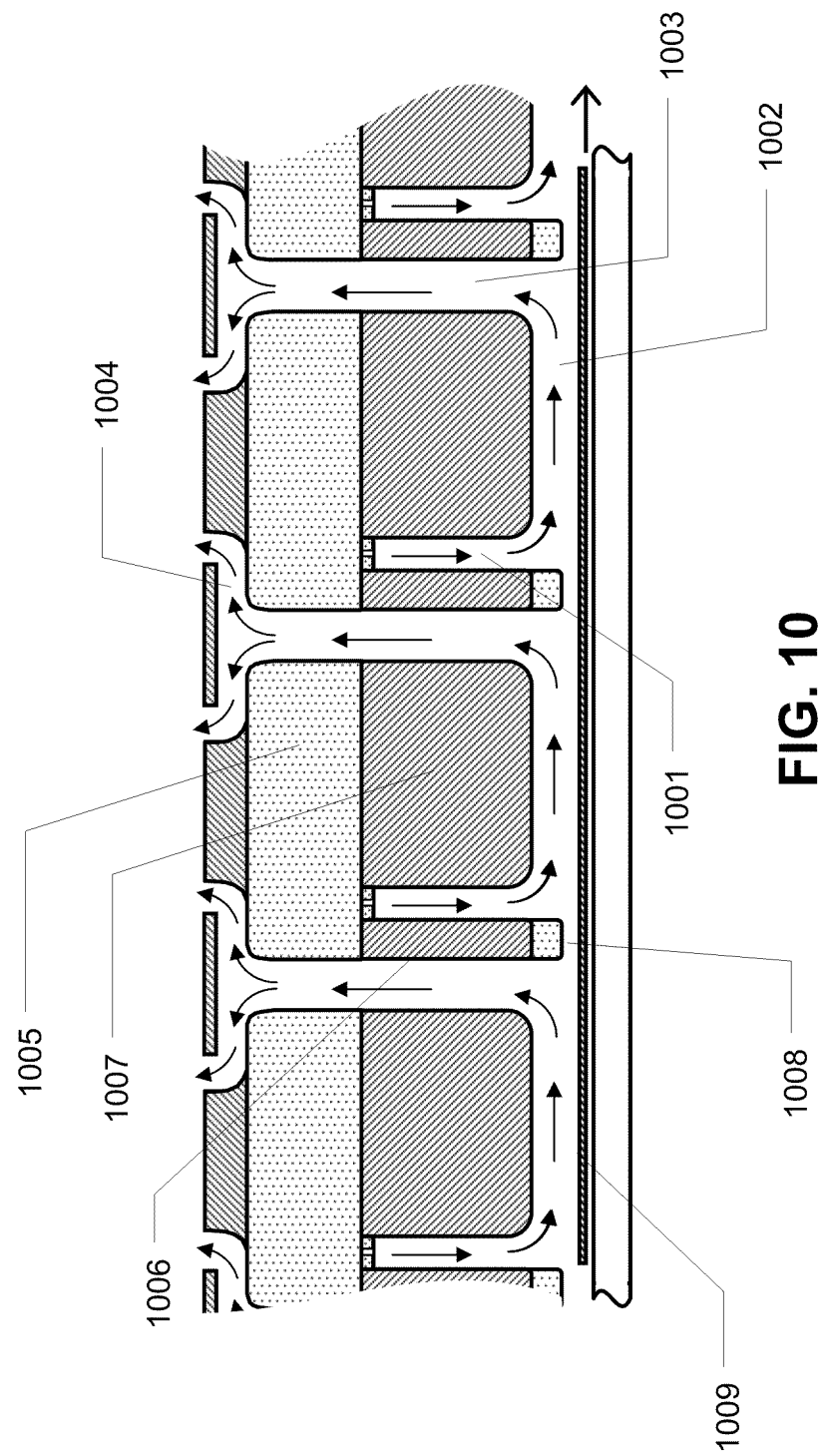
FIG. 10 shows the uniform gas flow paths and an example for applications requiring multiple sources according to an example embodiment.

In an example embodiment illustrated schematically in FIG. 10, there are multiple, closely spaced PGUs, each one similar to the PGU embodiment illustrated in FIG. 9. The gas flow in this embodiment starts in the region (or gap), 1001, between the electrodes, 1006 and 1007, in a direction toward the substrate surface, and then diverts upon passing the powered electrode 1007 so that a substantial majority of the gas flows in the gap, 1002, between the powered electrode and substrate, which may be between about 5 nun and 10 mm in example embodiments. This is due to the much smaller gap 1008 between the tip of the grounded electrode 1006 and the substrate 1009 that restricts the flow under the grounded electrode. The flow then diverts again after passing under the powered electrode and flows along the surface of the powered electrode away from the substrate surface in region (or gap) 1003 towards the exhaust. In embodiments where there is a similar PGU on both sides of that shown, the upward flow adjacent the powered electrode is between it and the grounded electrode of the adjacent PGU on the right side. In this case, if the gap between the adjacent PGU were comparable to the gap 1002 between the powered electrode and the substrate, there would be plasma generated as well in gap 1003, which would have a comparable power density. In some embodiments the gap between the PGU shown and that on its right would be slightly larger than the gap 1001 between powered electrode and the grounded electrode on its left. In such an embodiment the power density in gap 1003 on the right of the powered electrode may be less than in gaps 1001 and 1002. In this case the gas flowing away from the substrate may be moving through plasma with lower power density than in the earlier phases of its flow. Such power density may be no less than about $1/5^{th}$ that in the gap to the substrate in some embodiments. After flowing past the electrode 1007 and the support 1005 the gas reaches channel (or region) 1004, above the support 1005. This channel leads to an exhaust port from the chamber and may also have plasma within it. In some embodiments an auxiliary power source may provide power to sustain the plasma in region 1004 or coupling though the support structure from the electrode may be adequate to do so. Thus, the flow of the gas in embodiments as shown in FIG. 10 is essentially in a circuit as shown by the arrows—around the powered electrodes, and then the support and out of the chamber. An etching gas may also be introduced near the exhaust yet inside the chamber so that depositing species may be converted to strongly volatile species so that condensation in pumping manifolds or valves may be avoided. The flow adjacent the substrate surface is substantially in a single direction which in some embodiments may be in the same direction as the movement of the substrate. The gas flow as shown moves around the rounded edges of electrode, 1007, and support structure, 1005, with radii of curvature between about 1 and 10 mm such that there are no recirculation patterns in the bulk gas flow as it flows from one region to another. Further, for some embodiments, any changes in the cross sectional area due to changes in the gap dimensions, as the gas flows from one region to the next should preferably kept less than a factor of 2. This helps reduce gas cooling and particle growth due to expansion. Maintaining a high gas temperature helps reducing particle growth and contamination of the substrate.

Figure 11:
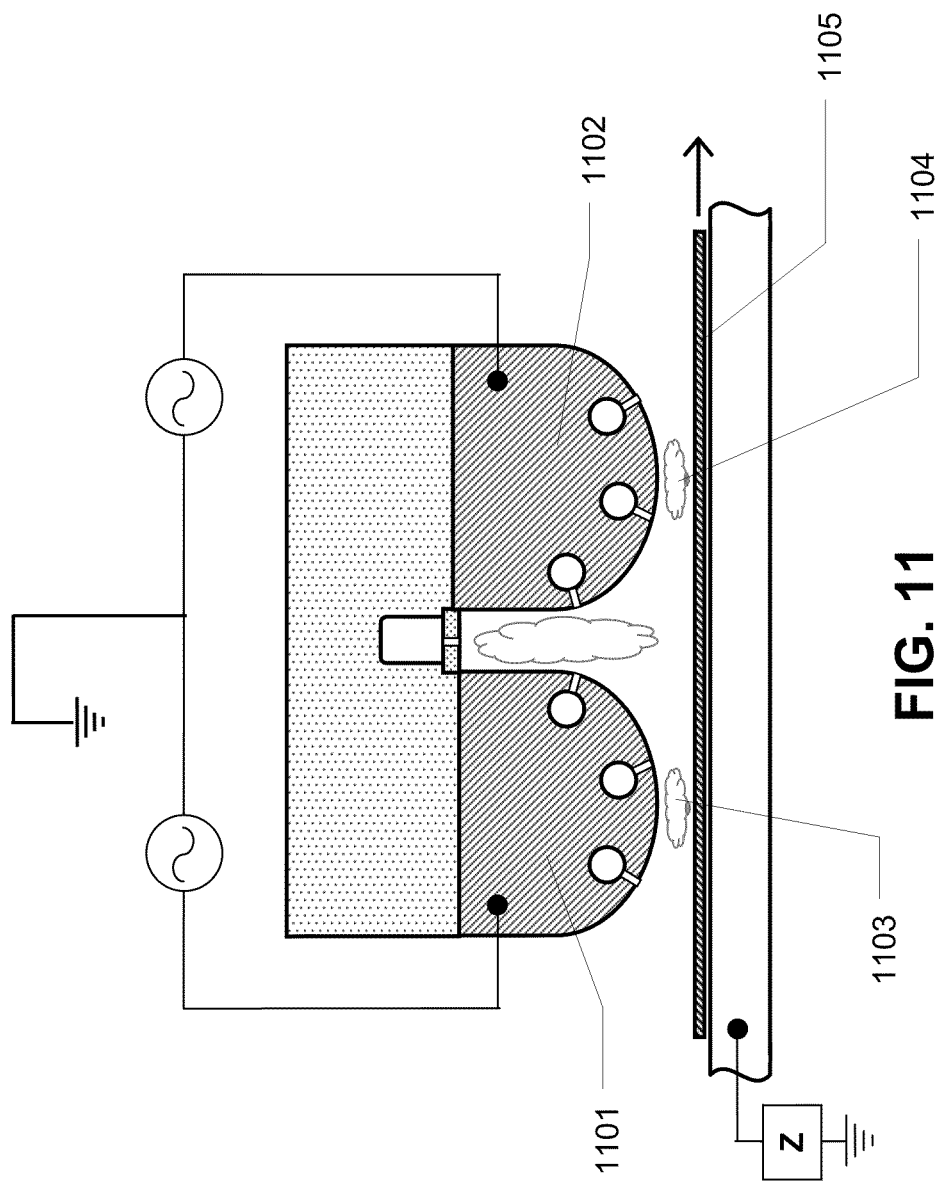
FIG. 11 shows an alternative PGU embodiment utilizing a non-rectangular electrode cross-section.

In the example embodiments described above, the cross-sectional shape of the electrodes and dividers have a substantially planar surface both in the gap between elements and the region facing the substrate surface. Additional embodiments can employ other shapes. FIG. 11 schematically illustrates an example embodiment utilizing electrodes with a curved cross section. The shape of the curved electrodes 1101 and 1102 may add additional benefits from some processes by concentrating the power deposited in the plasmas in to a small region 1103 and 1104 where the gap between electrodes, 1101 and 1102, to the substrate, 1105, is the smallest. The rounded shape meanwhile may retain the benefit of preventing recirculation in the gas flow path.

Other embodiments may use other shapes for the PGUs. However, example embodiments using other shapes may still maintain some or all of the characteristics described above, including small electrode width and height dimensions relative to the length; small gap between facing surfaces of electrodes and dividers within a PGU; separately controllable plasma power densities in regions adjacent the powered electrodes; and electrode shapes and gaps configured to prevent gas recirculation.

Figure 12:
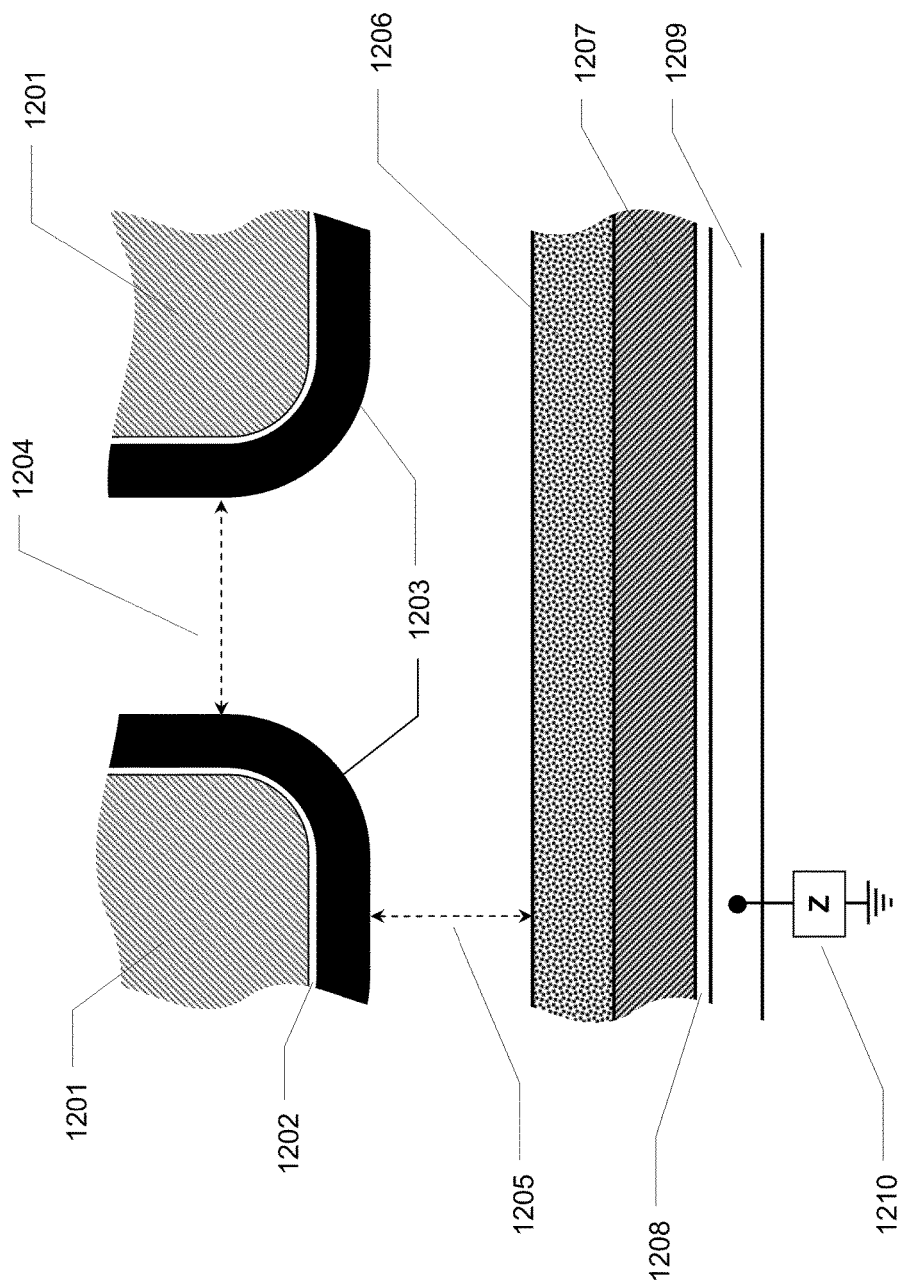
FIG. 12 shows a close up view of the gaps regions between electrodes and between electrodes and substrate in example embodiments.

FIG. 12 illustrates aspects of electrode and liner spacings and substrate support as found in example embodiments wherein liners are used to cover surfaces of electrodes otherwise in contact with the plasma. The electrodes, 1201, being made from conductive material, are separated by a small distance, 1204, from the liners, 1203, which in some embodiments are dielectric material such as quartz. This liner may be gas permeable so as to allow injection into the plasma from the electrode(s). Example liner thickness may be between about 1 mm and about 5 mm or any range subsumed therein, which may be different for sides facing the substrate from their thickness over sides facing other electrode or divider. The plasma is typically formed between the electrodes only in the gaps, 1204 and 1205, and not in the small gap 1202 between electrodes and adjacent liners. In example embodiments, the maximum allowable electrode-liner gap, 1202, to avoid formation of a plasma depends primarily on the gas pressure and on the power density locally injected into the plasma. At gas pressures below about 0.1 kiloPascals and at power densities below 1 W/cm$^2$ the gap, 1202, may even be as large as 2 to 5 mm without causing a plasma therein, though this may not be practical due to the large voltage drop between electrode and outer surface of the liner. Higher gas pressures, above about 1 kiloPascal, may require gaps less than 1 mm, especially at power levels of 1 W/cm$^2$ or more to avoid sustaining a plasma therein. Pressure above about 3 kiloPascals may require an electrode-liner gap less than 0.5 mm. In the disclosed device this gap may be at less than about 0.05 mm or more in order to provide desired thermal insulation between plasma and electrodes and to increase the temperature of the liner to above 100° C. everywhere over its surface in some embodiments. This also serves to increase the minimum gas temperature in the plasma region, 1204, to greater than about 100° C. This higher gas temperature tends to be particularly helpful in avoiding growth of gas phase nano-particles in the plasma regions and helps to reduce defects when growing silicon or silicon-based films. The gap 1205 between liner's outer surface and the substrate may be between about 5 min and as large as 20 mm, though more typically at gas pressures above about 1000 Pascals, the gap to the substrate is often no more than about 15 mm. In some embodiments where the process pressure may be above about 5 kiloPascals the maximum gap from liner surface to substrate may be less than about 10 mm. The gap between facing liner surfaces, 1202, is typically in roughly the same range as that between liner and substrate but in some embodiments may be slightly larger due to the constraint of avoiding rapid expansion in the cross sectional area of the flow channel for gas.

The substrate, 1206, may in some embodiments rest on a carrier, 1207, which is a good electrical conductor, which may in turn rest on or with small gap, 1208, to a pedestal or support structure with a small complex impedance 1210 to ground. The magnitude of such impedance may be less than about 10 Ohms in many embodiments to avoid plasma discharge from the carrier. The small gap, 1208, may be associated with a transport system that moves the carriers relative to the support, 1209. In this case the capacitance between carrier and support may be very high, reducing the build up of electrical potentials on the carrier when RF, VHF or UHF currents are conducted to it from powered electrodes of the PGU. Particularly in cases where the substrate moves relative to the PGU, it may be difficult to provide a good electrical ground on the substrate carrier, but a very small gap, 1208, which may be less than a few millimeters will result in high capacitance to ground and low resulting RF, VHF or UHF impedance. If the AC potentials of the electrodes, 1201, are roughly equal and opposite, then the net capacitive current to the substrate or carrier will be minimized and the electrical potential of the carrier or substrate will be minimized.

In other embodiments, there may be AC power provided to the substrate support and/or the carriers for the substrates. In such case there may be additional ion bombardment of the substrate which in some applications is beneficial.

In some embodiments, universally high gas temperature or avoidance of electrode heating may not be important, and thus liners on electrodes may not be used in some embodiments. In many of these cases the limits stated above for the gaps between liner surfaces, or gaps from liner surface to substrate would apply equally to the gaps between facing surfaces of the electrodes, or between electrode surface and substrate, in the absence of a liner. Both such gaps might be between about 5 and 20 mm or any range subsumed therein in example embodiments.

One example application for the example embodiments described above is the deposition of thin films of nano-crystalline silicon (nc-Si:H) for photovoltaic cells. It is desirable to reduce the cost of manufacturing such cells and provide higher efficiency for conversion of light to electrical energy. In order to meet such requirements the defect levels in the silicon may need to be less than or about $2\ 10^{16}$/cm3. In the event deposition of thin films of silicon having such defect levels can be achieved with excellent uniformity across an entire substrate, photovoltaic efficiencies of 13% or better might be achieved in cells having multiple absorber layers with different absorption bands.

In some cases, the cause of high defect levels in deposited nano-crystalline silicon may in part be due to the incorporation of large numbers of clustered microscale silicon particles into the growing film. In some plasma reactors where gas temperatures are high, growth rates of small silicon particles may be much smaller. However, deposition systems for nc-Si:H that utilize a "showerhead" or other injector may have a relatively cold surface—which may be less than or about 60 Celsius in some reactors. This may cause the gas to have higher formation rates for particles that ultimately are incorporated into the film resulting in reduced Photovoltaic efficiency. In example embodiments of the present invention, the operating temperature of surfaces in contact with the plasma may be maintained at 100 C or more by using hot liners covering the electrodes that are spaced from the electrode surface to reduce heat conduction to the cooled electrode. By providing hot surfaces adjacent the plasma, hot gas temperatures may be sustained throughout the plasma region. Because gas phase particle growth is reduced, example embodiments may be operated at high power density and achieve higher deposition rates, while maintaining low defect levels in the deposited film. For example, deposition rates in some embodiments may exceed 4 nanometers/second. Other embodiments may use other configurations to maintain temperatures at or above 100 C for surfaces adjacent the plasma to reduce particle growth in the gas phase and thereby improving the PV efficiency.

In some embodiments, such as those shown in FIGS. 4a-4l, the substrate support may be either a neutral electrode, while in other embodiments power may be provided to the substrate support and/or the carriers for the substrates. In such case there may be additional ion bombardment of the substrate which in some applications is beneficial. In some embodiments, use of a dc or low frequency bias on the substrate may be useful in reducing the defect level of the silicon, or increasing the density of the deposited film.

In some embodiments a small gap is maintained between the powered electrodes and the substrate. In example embodiments, this gap may be between about 5 mm to 15 mm or any range subsumed therein. Because it is important to precisely control the gap between the electrodes and substrate in order to avoid non-uniformities in the deposited film, it may be useful to employ aligners near to a PGU, or a pair of parallel plate electrodes, that keep the substrate at the desired gap relative to the electrodes. It may be useful to have aligners at regular intervals—typically much less than the length of a substrate—along the path of the substrate both before and after a processing region to control the substrate-to-electrode spacing, without adversely affecting the quality of the film deposited. Such aligners may be separated from a PGU, but elongated like dividers or grounded electrodes in spanning the width of the substrate, perpendicular to the direction of motion, and providing a flow of gas, as shown in FIG. 4h or 4j. The gas flow from the end adjacent the substrate prevents the substrate from touching the nearby surface of the aligner. Alternatively, the aligner may have one or more "arms" which may be rigid or have some ability to flex, and each may have one or more isolated pads at the end whose surfaces are large enough—usually greater than about 5 square centimeters—and have vents in that surface as a source of inert gas. Such arms and pads are configured and positioned at a small distance—typically less than about 2 millimeters—above and/or below the plane of substrate motion, to cause the substrate to move through the electrodes or PGU at the desired distance. Aligners that are sources of gas with no pumping may be adjacent the side of the substrate whereon processing is to take place, or adjacent both sides of the substrate. Aligners may also have vacuum apertures in the pads so that they act effectively as "gas bearings", though in this low pressure environment the larger pad area is helpful.

In an example embodiment, a method for depositing silicon layers to form a portion of a photovoltaic cell may be provided including some or all of the following features (or any combination thereof):

Providing at least three sets of PGUs wherein the first set includes at least one PGU and the third set includes at least one PGU;

Wherein the second set is between the first and the third set and includes a number of PGUs greater than the number of PGUs in the first and third sets;

Moving a substrate linearly below the three sets of PGUs;

Depositing a first layer of doped silicon using the first set of PGUs, wherein the silicon has a first type of doping;

Depositing a second layer of intrinsic silicon over the first doped layer using the second set of PGUs, wherein the second layer is thicker than the first layer;

Depositing a third layer of doped silicon over the second layer using the third set of PGUs, wherein the third layer has a second type of doping.

One example application is the deposition of the multiple layers of silicon-based films for a photovoltaic device. In this example, a doped layer may be deposited first, then an intrinsic absorber layer may be deposited and finally another complementarily doped layer may be deposited. Example embodiments may be used for deposition of all three layers in sequence at the same time in the same apparatus and even in the same chamber.

In example embodiments, a conveyor, web or other moveable transport or carrier may be used to move the substrate below the PGUs. Such motion is often linear, though it may be curved for continuous band substrates. Such substrates may move in a path such that they describe segments that may be part of a cylinder.

In example embodiments, as shown in cross section in FIGS. 3-12, the PGUs may be arranged so that the long sides of adjacent elements of neighboring PGU are approximately parallel and narrowly spaced along the direction of substrate motion. Cross sections of the electrodes may be roughly rectangular in example embodiments as shown in the same Figures.

In these example embodiments, each PGU may generate a plasma in volumes adjacent elements of that PGU. The plasma in this region is substantially controllable with the power provided to AC powered electrodes of this PGU. In some examples, such electrodes may be at excitation frequencies such as in RF or even VHF bands and may couple that power into the plasma mainly through displacement currents—capacitive coupling. In some examples, the coupling of power from the PGU into the plasma may be principally inductive where some elements of the PGU include one or more turns of a coil. In some examples, the power is in the UHF or microwave bands and the coupling of power into the plasma may be as surface waves which are both inductive and capacitive in their nature. In example embodiments, processing in this region may be substantially a product of the plasma generated by electrical power injected via the PGU. Other PGUs may be used in other embodiments.

Figure 13:
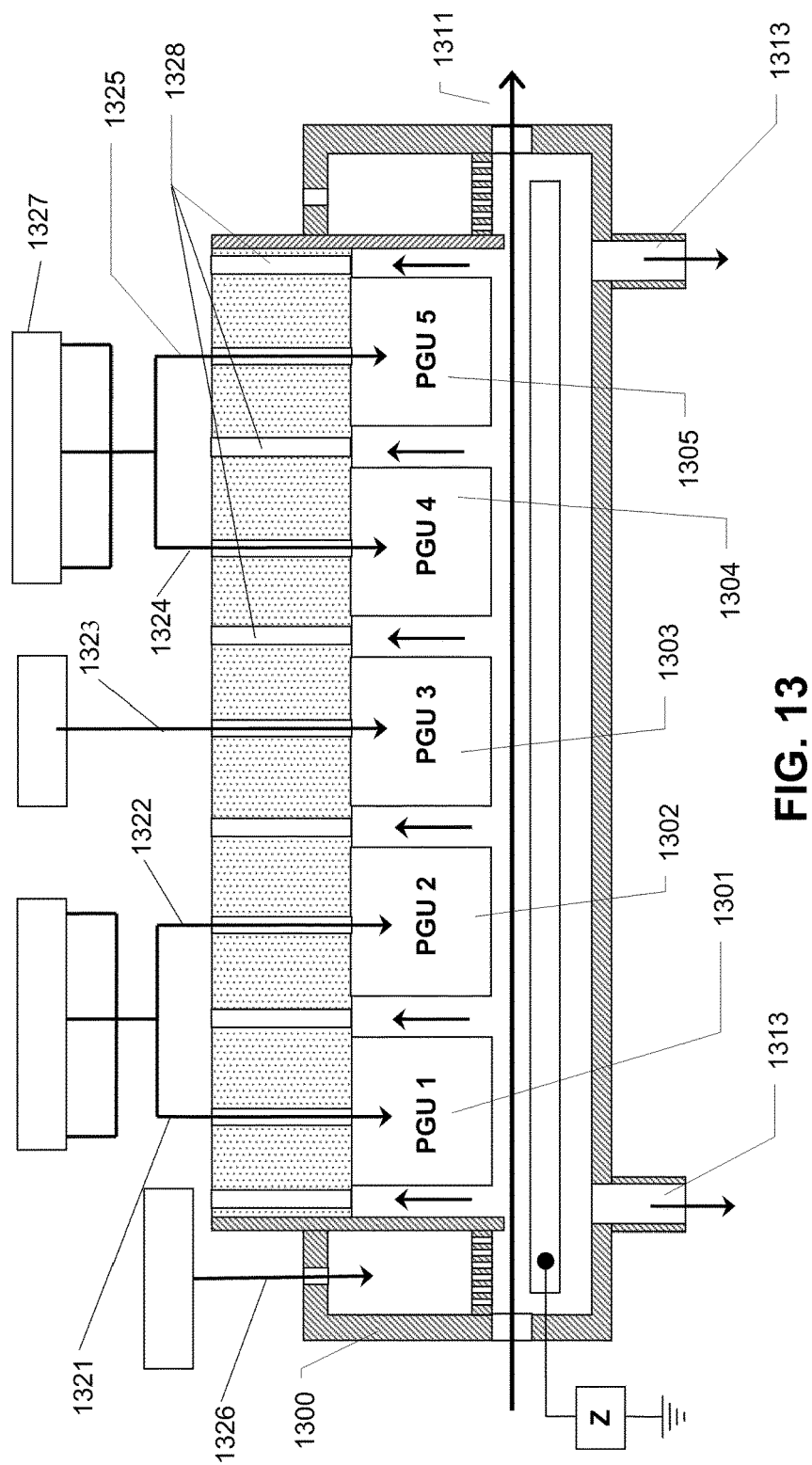
FIG. 13 shows a cross section of a reactor chamber according to an example embodiment having five PGUs in which the first two PGUs perform a process using gases A, B, and C, the third PGU uses only inert gases He and Ar to provide separation, and the last two PGUs use gases D, E, F to perform a different process.

In FIG. 13, example embodiments are shown having multiple adjacent PGUs within a single chamber, wherein separately controllable gas or mixture of gases are supplied from gas supply systems, 1321 to 1325, to PGUs 1301 through 1305, respectively in the chamber, permitting different processes to be performed simultaneously within the chamber on a substrate by different PGUs or groups of PGUs. In some embodiments, the processes performed by PGUs 1301 and 1302 may be substantially the same on the substrate using separately controllable gases or mixtures of gases, 1321, and 1322 respectively, which in such embodiments are similar or identical. In some embodiments, the gas mixtures to the two may contain the same components but proportions may differ slightly causing only the rate of the process to differ between the two. In these embodiments, the PGU 1303 may or may not utilize AC power to produce a plasma, but uses a flow of only inert gas which causes no process to be performed on the substrate within the region of this PGU. However, because gas is injected within each PGU and is removed via an exhaust port, within or adjacent that same PGU, such region of inert gas may serve to isolate processes in PGU 1304 and 1305 from the gaseous species in PGU 1301 and 1302, and vice versa. For example, gas injected from gas supply 1321 into PGU 1301 may be exhausted via ports 1331 and/or 1332, and gas injected into PGU 1304 from supply 1324 may be exhausted via ports 1334 and/or 1335.

One example is the case where PGUs 1301 and 1302 deposit a heavily phosphorus doped silicon layer and PGUs 1304 and 1305 deposit undoped intrinsic silicon layers. In this example, the direction of some of the gas flow in PGU 1303 may be from right to left toward 1301 and 1302 and away from 1304 and 1305 so as to oppose any flow or diffusion of phosphorus containing gas species from PGUs 1302 into PGU 1304. In another example, there may be etching using fluorine containing species in PGUs 1301 and 1302 while there are deposition processes in PGU 1304 and 1305.

In an example embodiment, a substrate, 1311, entering the chamber may be subjected to flow of a purge gas 1326 supplied to injectors over the surface of the substrate, 1311, while a substrate may be subjected to potentially different gas, 1327 prior to exiting the chamber. Such purge gas, along with other gases ambient outside the PGU may be pumped by exhaust ports, 1313. Exhausts 1328 for gases provided within each PGU may be separate. Though they may flow to a common vacuum pump, in example embodiments, they do not allow species out one exhaust duct to diffuse back into any other process region.

Figure 14:
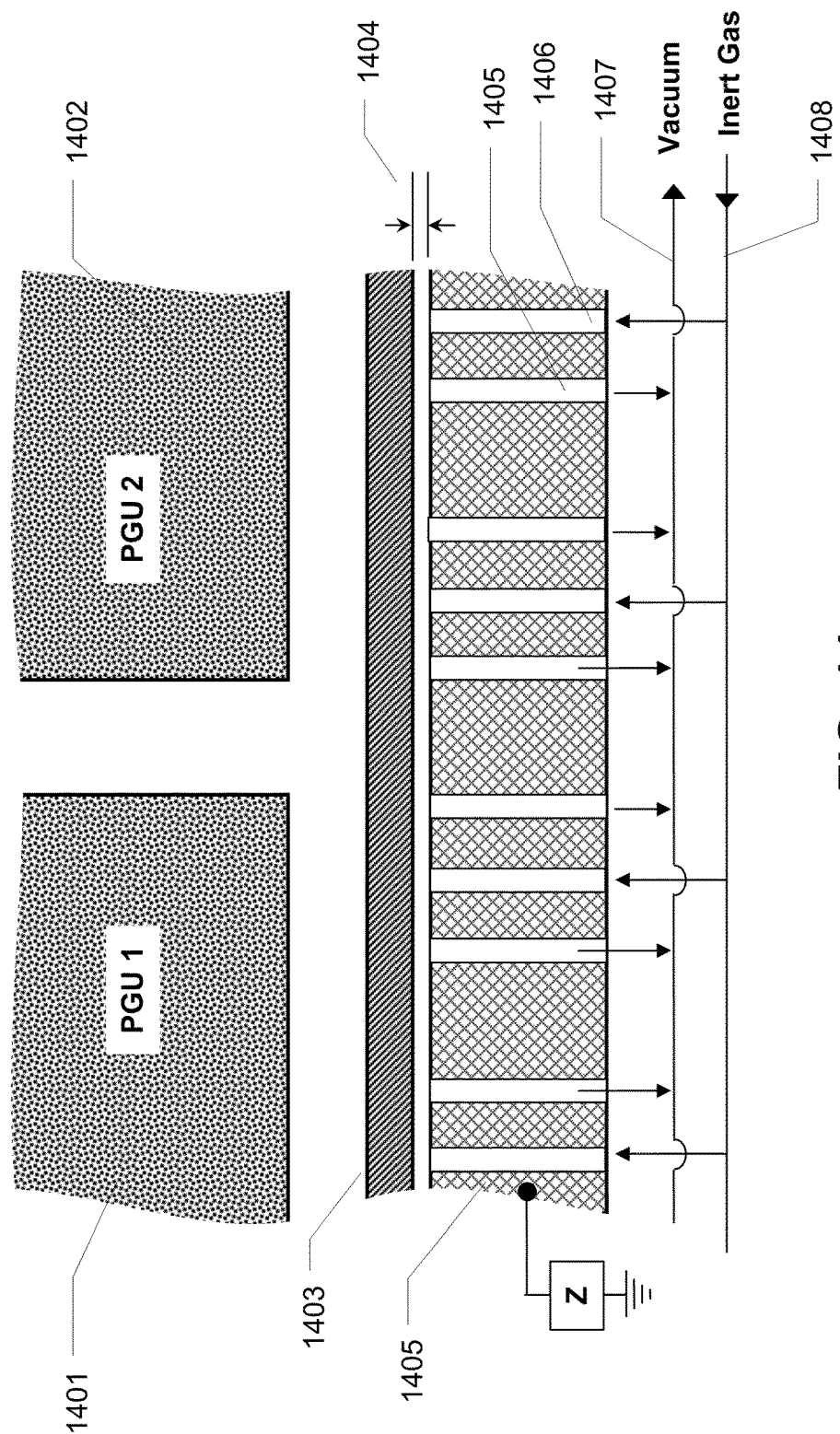
FIG. 14 shows a cross section of a reactor chamber according to an example embodiment having a pedestal which provides multiple small separate apertures for gas injection and pumping between itself and the substrate.

In FIG. 14, a cross section of an example chamber is shown with elements of two or more PGUs, 1401 and 1402, having a common support, 1405, for a large substrate, 1403, which maintains a very small, and controlled gap, 1404, from the PGU to the support. The substrate support has internal channels 1405 connected to a supply of gas 1407 that terminate in apertures at the substrate supporting surface having at least one dimension less than about a millimeter—for introducing gas into the gap, 1404. There are other channels 1406 that are in the substrate support that are connected to a vacuum pump 1408 or other exhaust which also terminate in apertures on the surface of the substrate support.

Figure 15:
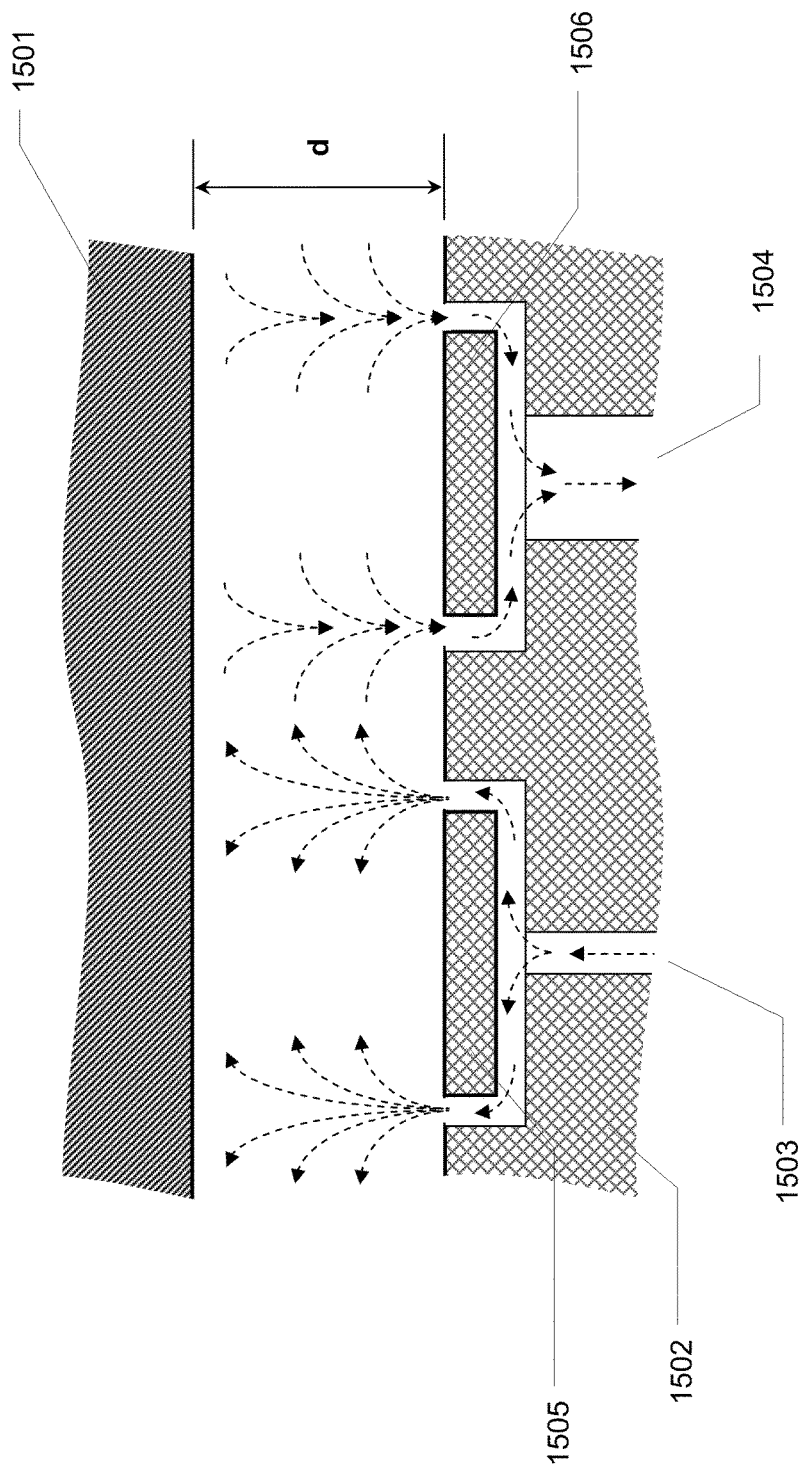
FIG. 15 shows a cross section of a substrate support and substrate according to an example embodiment where there is gas injection and pumping from the substrate support from baffled openings.

Shown in FIG. 15 is an example embodiment for a substrate support pedestal having linear apertures for gas injection and exhaust. Shown is a substrate, 1501, supported on a pedestal, 1502, by gas injection supplied from a network of channels, 1503. Gas from the channels, 1503, is injected into the space between substrate and support that has a height, "d". The gas injection is around small baffles, 1505, which distributes the gas into the space with height "d". The apertures for gas injection are less than about a millimeter in width but sufficiently long to provide gas somewhat uniformly into the space between support and substrate. Similarly, the gas is exhausted from this space between substrate and support in this embodiment through larger channels, 1504, which are covered by baffles, 1506. The baffles are elongated such that apertures on the support surface are elongated but narrow, less than about a millimeter, which provide sufficient pumping speed to exhaust gas from the space between substrate and support. By maintaining such small apertures, and keeping the gap, d, less than a millimeter the gas in the space between substrate and support is prevented from forming a plasma, due to electrical fields from the PGU.

Figure 16:
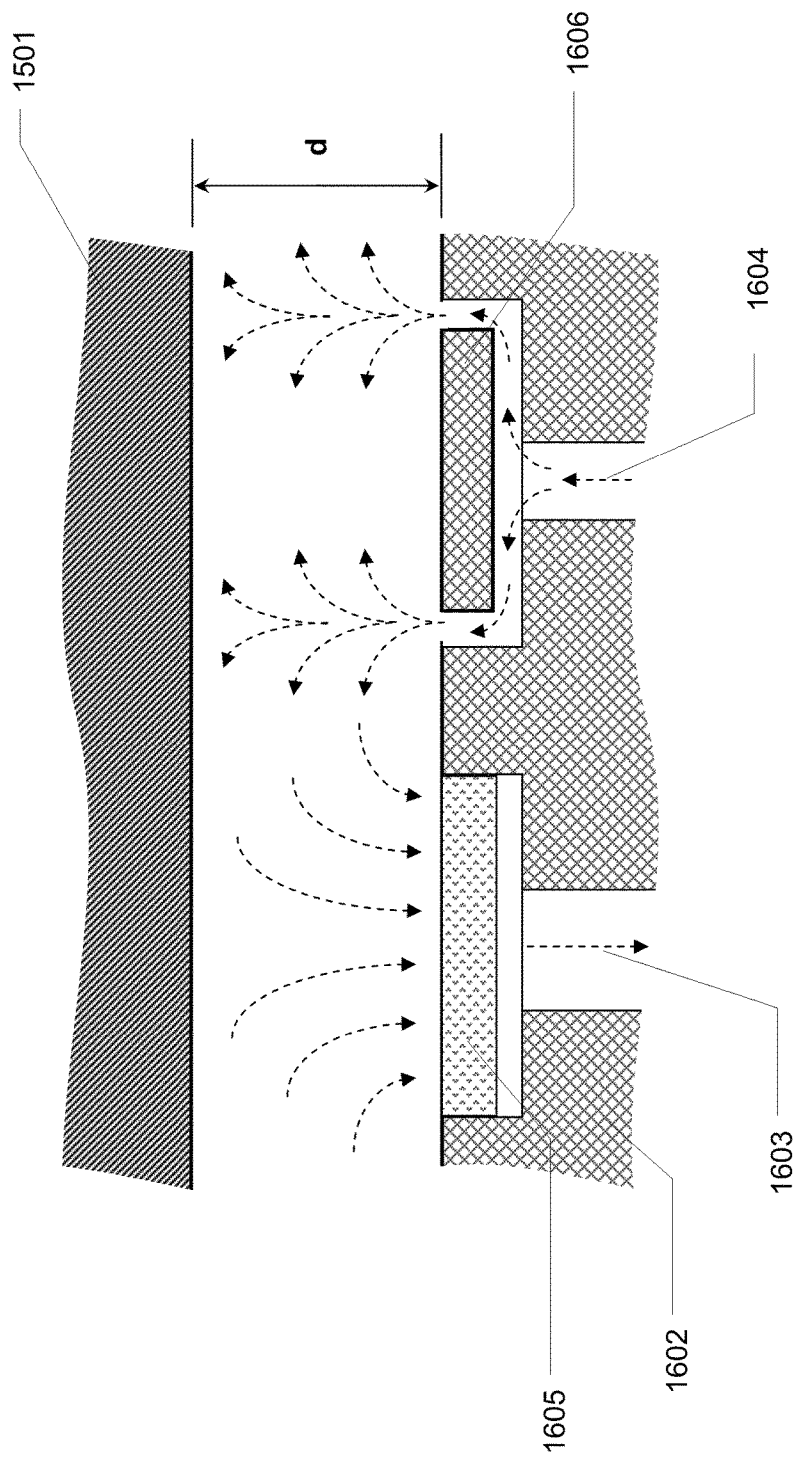
FIG. 16 shows a cross section of a substrate support and substrate according to an example embodiment where the support has baffled gas injectors and has pumping apertures that are filled by porous gas-conductive and electrically conductive material preventing electric fields from penetrating into the larger diameter channels used for pumping.

FIG. 16 shows an alternative embodiment of a substrate support 1602 having baffles 1605 and 1606 which are porous conducting material such that electrical fields coming from the PGU do not penetrate into the channels, 1603, which are sufficiently large to permit good conductance in exhausting the gases from the space between substrate and support. Avoiding electrical fields in such channels prevents plasma from forming in exhaust channels 1603, where gas pressures are generally smaller than in the space between substrate and support. In this case, the high gas flow conductance of the porous plug material causes there to be a strong response in the average gas pressure between substrate and support when the gas conductance between the injector holes and the porous exhaust ports changes due to the gap between substrate and support either increasing or decreasing. Note that the conductance for gas flow in the viscous regime between two surfaces varies at least as rapidly as the square of the gap between them.

Such example substrate supports as shown in FIGS. 14-16 may be used for processing large substrates since they permit maintaining a highly constant gap between the elements of the PGU and the substrate. Control of the gap to a high precision and uniformity is achieved by the disclosed substrate support since there is a natural restoring mechanism to prevent the gap between support and substrate from varying. This mechanism works as follows: gas pressure average between substrate and support decreases rapidly when the gap between them increases due to the conductance increase between gas inlets and exhaust in the support. This decrease in gas pressure between substrate and support causes the substrate to be driven back down toward the support due to the higher process pressure within the PGU above the substrate than the gas pressure between substrate and support. When the gap between support and substrate decreases that conductance decreases rapidly causing the average pressure between support and substrate to increase pushing the substrate so as to increase the gap between support and substrate. The gap between substrate and PGU elements is small—between about 5 mm and 15 mm—and the local power density of the plasma is highly dependent on this gap. If the gap between an AC powered electrode and the substrate varies by 10% over the length of the electrode or from one AC powered electrode to another, the resulting power density non-uniformity may be 20% or more, causing process non-uniformities of the same order or even worse. In case there are dielectric liners on the AC powered electrodes the plasma non-uniformity will be mitigated by the high impedance (capacitive reactance) of the gap to the dielectric liner and the liner itself since higher current AC current densities passing through the liner will result in larger voltage drops across the liner and hence lower voltage on the plasma-facing surface of the liner.

In example embodiments, to achieve adequate process uniformity, U—which for many processes must be better than +/−5%, [where U≅(max−min)/(twice the average)], the gap from AC powered electrodes to substrate may be maintained to about 2% or less. In some embodiments where process uniformity is of order +/−1%, the size of the gap over an AC powered electrode may be controlled to be better than about +/−0.5%. For a gap from AC electrode to substrate which is about 10 mm, the gap may vary less than about 0.2 mm in most cases, and may vary by less than 0.025 mm when the gap is about 5 mm and the process control is better than about +/−0.5%.

Figure 17:
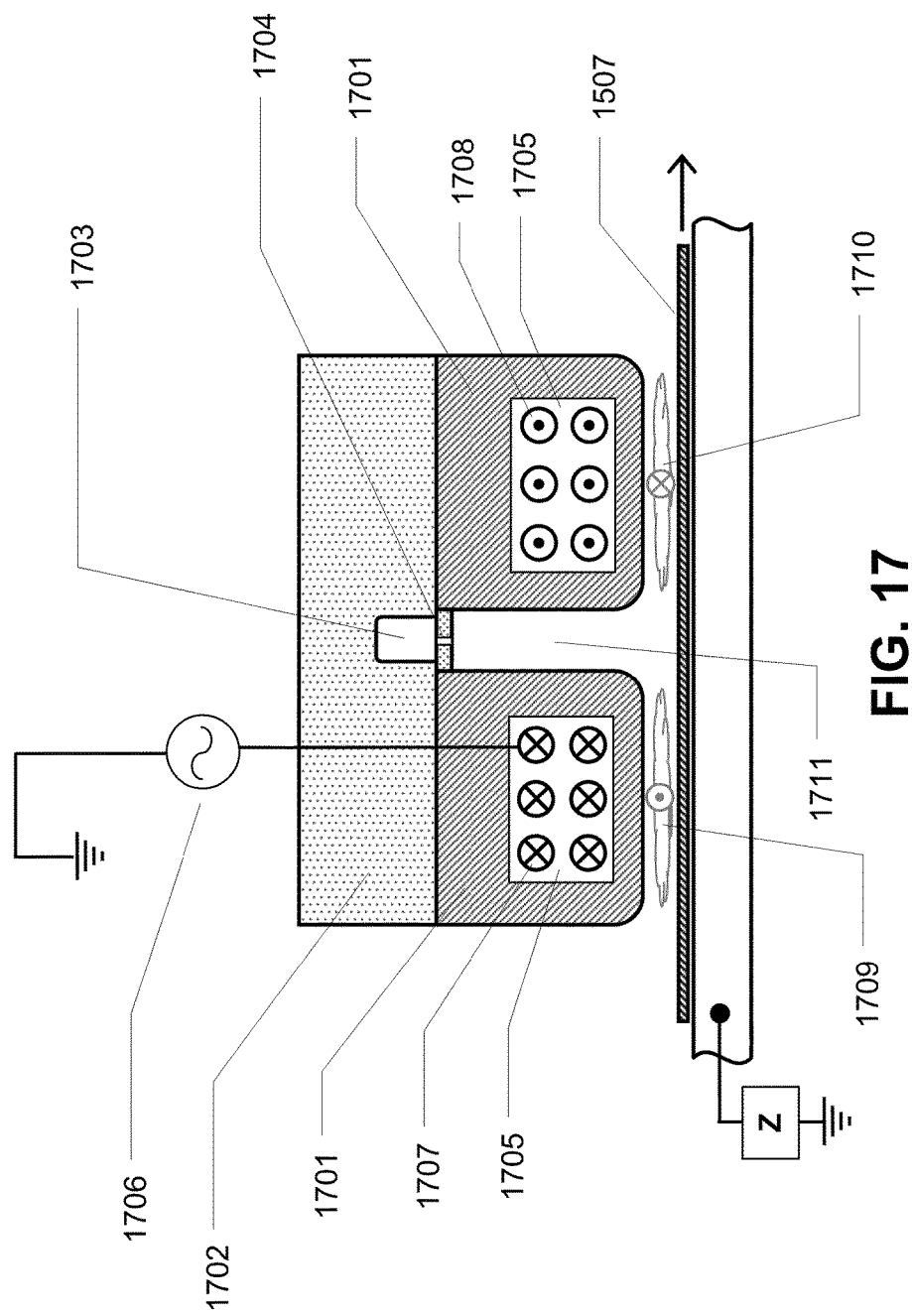
FIG. 17 shows a cross section of a reactor chamber according to an example embodiment wherein plasma formation is by inductive coupling using multiple turns of a conductor in which AC current generates a changing magnetic field in the direction of gas flow resulting in an induced electric field parallel to the long dimension of the PGU and the direction of current flow in the turns of the coils.

In FIG. 17 is shown an example embodiment of a PGU in which plasma formation is by inductive coupling via AC current flow in electrically conducting windings, 1705, in which currents, 1707 and 1708, having opposing directions flow in adjacent support structures, 1701, and 1702 respectively. The source of such AC current is the supply, 1706, and currents having passed through the windings 1705 are returned to ground via connection 1703. Such current in the windings produces rapidly varying magnetic fields in the spaces around the support structures which induce electric currents, 1709 and 1710, sustaining the plasmas that are formed in the regions between such structures and the substrate, 1507, which moves past such structures. Gas may be injected through small holes 1704 into the space 1711 wherein plasma is also sustained. Such inductive coupling may generally be at lf or RF frequencies for such large windings as would be used with structures, 1701 and 1702, that have lengths greater than about 35 centimeters for processing substrates of roughly 30 centimeter width or greater. Process chambers may have variable numbers of PGU and PGU may be of varying widths. For applications such as silicon deposition on photovoltaic panels which are roughly a meter in width and a meter and a half in length, in some embodiments there may be from about 5 to as many as about 100 PGU in a single chamber. Each AC powered electrode or coil winding structure may be roughly from about 3 centimeters in width to as much as about 30 centimeters and PGU may be from about 4 centimeters to about 60 centimeters.

Figure 18:
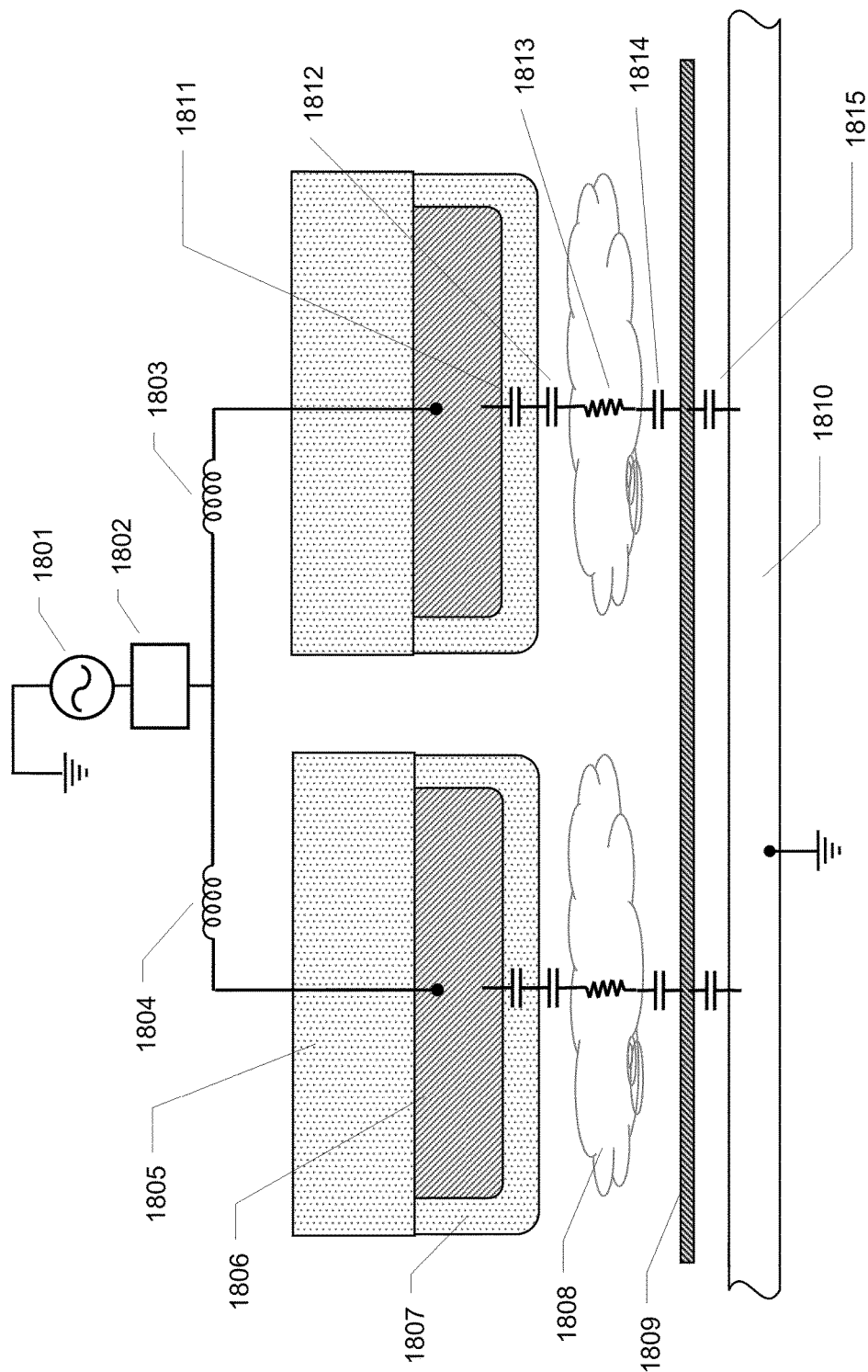
FIG. 18 shows an electrical circuit model of the electrodes with liners illustrating delivery of RF or VHF power to dual electrodes by a single power supply using an inductive splitter according to an example embodiment.

FIG. 18 illustrates an example embodiment with power splitting between electrodes. In FIG. 18 is shown a physical and electrical model of the equal splitting of RF or VHF power injection from a generator, 1801, through an impedance matching network, 1802, and then through roughly equal inductances, 1803 and 1804, to electrodes, 1806, which are mounted on a ceramic support, 1805. Each electrode is covered by dielectric liners, 1807. The splitting of the power by the two inductors is facilitated and stabilized by the presence of the dielectric liners which act as series capacitors, 1811, in the current flow path from the electrodes to the plasma. The RF or VHF current from the electrode after passing through the liner moves through the bulk plasma 1808 which has been successfully modeled as a series combination of capacitor—resistor—capacitor and then through the capacitance 1815 to the support. The capacitors representing the sheaths at the surface of the liner and the substrate, and the resistor representing the collisional losses of electrons carrying the current through the bulk of the plasma. Indicated in the figure are sheath capacitance, 1812, adjacent outer surfaces of the liners whose magnitude, in reality, varies with RF phase and ion current density of the sheaths that are in contact with the plasma. Such a sheath, 1814, is also present adjacent the surface of the substrate or holder thereof. Between these sheaths is the "bulk" plasma which has equal densities of negative and positive charges. This bulk has an effective resistance, 1813, which represents the resistance to motion of plasma electrons due to collisions with the gas as they carry the RF or VHF current between electrodes and substrate, 1809. There is also a grounded pedestal below the substrate, 1810, which has a finite gap to the substrate, or if the substrate is mainly a dielectric material, to any conducting material on its surface. Such gap and, where present, the dielectric of the substrate comprise a further capacitance from substrate or a conducting surface material to the grounded pedestal, 1810. Sheath capacitance varies inversely as the sheath thickness which depends on plasma characteristics such as the plasma potential and ion current density. Sheath thickness (Child's law for collisionless sheaths provides roughly the correct scaling for collisional sheaths) decreases approximately as the square root of the current ion density and increases as the $3/4^{th}$ power of the potential difference. The sheath thickness also varies with the RF or VHF phase so that the sheath capacitance is not constant in time.

For deposition of silicon for thin film photovoltaic applications, plasma operation at gas pressures above about 1000 Pascals reduces the amount of power going to the sheaths and therefore reduces the ion energies. This greatly reduces ion penetration into the film, thereby reducing defects in the silicon and improving PV efficiency. Increasing gas pressure in the discharge also increases the power going to the electrons and ultimately the efficiency of dissociation of feed gas into neutral reactive species. In an example embodiment, power efficiency of stripping of organic polymer by an oxygen plasma improves linearly with increasing gas pressure above about 600 Pascals. It is believed that processes dependent on production of neutral radicals may improve approximately linearly with increasing gas pressure above about 500 Pascals in example embodiments. In addition, as the gas pressure increases to about 4000 Pascals undesirable effects including ion damage to the film may decrease to near zero, even at excitation frequencies in the RF band as low as about 3 MHz.

In order to design the liner characteristics and choose the inductors to make the splitting work best, the plasma reactances and resistances should be understood for a range of plasma conditions. Shown in Table II are the ranges of impedances of the sheaths and bulk plasma for some pressure conditions that may be used in example embodiments. The electrical impedance of the discharge at a gas pressure of between 1000 Pascals and 5000 Pascals shows two major effects associated with the improving efficiency power transfer to electrons and reduced ion energy at higher pressures. First, the thickness of boundary layers—sheaths—at the electrode and substrate surfaces are small, causing the sheath capacitances to be large and the reactive part of the discharge impedance to be small.

For gas pressures above about 1000 Pascals the plasma resistivity is high due to the higher electron-neutral collision frequency and the lower density for electrons in the higher pressure plasma. (Plasma resistivity is inversely proportional to the electron density and directly, linearly, proportional to the gas density). This means that the electrical resistance of the plasma is large. The electron density is between about $10^9$ to about $5 \times 10^9$ per cubic centimeter. Therefore, the plasma resistivity for the higher pressure case—greater than about 1000 Pascals—is between about 10,000 Ohm-centimeters and about 200,000 Ohm-centimeters. Assuming about a one centimeter gap, this results in a resistive impedance for a 0.25 meter squared electrode area between about four (4) Ohms and about eighty (80) Ohms.

Above about 1000 Pascals the sheath thickness may be between about 0.2 millimeters and about 1 millimeter. This means that for a single sheath the capacitance per square centimeter is between about 1.2 picofarads/cm$^2$ and about 6 picofarads/cm$^2$. Discharge reactive impedances, unlike resistive impedances, are dependent on the excitation frequency—inversely proportional to frequency. For an operating frequency of 13.56 MHz the single sheath reactive impedance is between about 10,000 Ohms per centimeter squared and about 2,000 Ohms per centimeter squared. However, for this plasma there are two roughly equal sheaths in series so one must double the single sheath reactance. Thus, the plasma reactance is between about 4,000 Ohms per centimeter squared and 20,000 resulting in a plasma reactive impedance for a 0.25 meter squared electrode of between about 1.6 Ohm and about 8 Ohms.

If the liner has a gap from the electrode surface of about 0.25 millimeters and the thickness of the liner to be about 3 millimeters then the impedance of the liner at 13.56 MHz is about 14,000 Ohms per centimeter squared. This is in series with the reactive and resistive impedance of the discharge (see FIG. 18) and results in between 70% and a 350% increase in the reactive impedance of the high pressure discharge. For a 0.25 meters squared liner area the total reactance then is between about 7 Ohms and 12 Ohms—which is a much larger fraction of the resistive impedance of the discharge—helping to stabilize the plasma spatial uniformity. The sheath reactance then is a much larger fraction—nearly equal in some cases to the resistive impedance. If glass substrates are used that are 3 mm thick then the reactance is increased by 10,000 Ohm per centimeter squared to a range of about 24,000 Ohm per centimeter squared to 48,000 Ohms per centimeter squared, more comparable to the resistive impedance.

Thus, in the high gas pressure discharge the resistive impedance is usually greater than the reactive impedance. If the excitation frequency is increased to 40 MHz or above, it would further reduce the sheath thickness and the reactive impedance by a factor of several or more resulting in even greater dominance of the resistive impedance over the reactive. It is believed that the energy transfer in this discharge is very predominant to the electrons in the bulk of the plasma. Because at modest power densities—less than a few Watts per centimeter squared—the electron energy distribution in the high gas pressure case is strongly peaked at lower energies, this energy goes mainly to dissociation rather than ionization, further improving efficiency for generation of species for thin film deposition.

TABLE II

| | Discharge Impedance - no Liner | | Discharge Impedance - with Liner | |
|---|---|---|---|---|
| Discharge Conditions | Resistivity (Ohm-cm) | Reactance per square cm | Resistivity | Reactance per square cm |
| High Pressure Discharge (1000 Pascals to 5000 Pascals) | 10,000 to 200,000 | 4,000 to 20,000 | 10,000 to 200,000 | 18,000 to 34,000 |

In example embodiments, the aim of having roughly equal inductors in series with the electrodes and their plasmas is to equalize the RF or VHF current to the electrodes and sustain the plasmas adjacent the two electrodes at approximately equal power densities and processing rates of the substrate. The circuit with inductors splits the RF or VHF current to the two electrodes and their plasmas. If there were no liners on the electrodes, then a greater density of one electrode's plasma would increase the capacitance of its sheath and decrease both its sheath reactance and the resistance of its bulk region, so that the total impedance of the electrode and plasma would decrease. This would cause more of the current to go to that electrode and less to go to the other, making the power distribution to the electrodes and their plasmas more unbalanced. However, when electrodes have the liners, whose thickness and dielectric constant are such that they have capacitances less than, and reactances greater than those of the sheaths (under normal plasma conditions) the splitting of the current between the electrodes is stabilized. With the liner, if one plasma becomes denser, and begins to draw more current, the substantial reactance of the liner causes a larger voltage drop across the reactance of that liner, and the voltage on the outer surface of that liner decreases. This, in turn, decreases the current through that electrode's plasma, decreasing the plasma density at that electrode. This self-stabilizing feature works because the liner provides a suitable and sufficient capacitive reactance. Roughly, one chooses the value of the inductance for each branch of the splitter so that the inductive reactance of each cancels the combined series capacitive reactances of the liner and sheaths in the lowest density plasma condition, or for no plasma. Then, as the plasma becomes more dense the sheaths at the electrode and substrate become thinner, increasing their capacitance and decreasing their capacitive reactance. This causes the total reactance (the sum of the inductive reactance which is positive and the capacitive reactance which is negative cancel each other out at resonance condition) through that electrode, which is inductive, to increase substantially, while reactance through the other electrode decreases roughly equally. Such changes in reactance are greater than changes in plasma resistance, thereby causing more current to pass through the electrode having the less dense plasma—this is stabilizing for the splitting of power between them. For example, for 13.56 MHz RF power, to properly stabilize the splitting of the current the capacitance of the liner should be from about 0.5 picofarad per square centimeter to about 1.5 picofarads per square centimeter. As the frequency of the exciting current for the plasma increases, the liner thickness—and therefore its capacitance—should be chosen to decrease less than linearly with the increase in the frequency. So at 80 MHz one might have a range from about 0.2 picofarads per square centimeter to about 0.6 picofarads per square centimeter. The value of the inductors, 1803 or 1804, would then depend on the total capacitance of the liners which would also depend on their areas facing the plasma, as well as their stray capacitance to ground.

A liner for electrodes of 1.2 meter length and width of 10 centimeters area has about 2500 centimeters squared and a no-plasma electrode-to-ground capacitance between about 150 picofarads and 400 picofarads, yielding a total capacitive reactance of about 27 Ohms to 72 Ohms. Therefore, for series resonance the inductor size at 13.56 MHz for splitting current might be between about 0.3 microhenries and 0.8 microhenry. This inductance range—both bottom and top—would scale roughly inversely with the operating frequency, and inversely with the area of the electrode which is the product of the length times width times a factor of about 1.5 if no change is made in the dielectric thickness. However, use of higher operating frequency may oblige one to use a thicker dielectric in order to keep its reactance up at an acceptable value. For example, the dielectric thickness might increase roughly as the square root of the operating frequency, and so the reactance of the liner would increase similarly were the frequency not to change. The inductor value also will tend to increase, roughly linearly, in size as the gap between liner surface and substrate increases.

In summary, in example embodiments, the high pressure discharge may be predominantly resistive in electrical impedance under most circumstances. When the liner is added to the high pressure discharge the reactive impedance is substantially raised which helps to stabilize and keep equal the power splitting to the electrodes and plasmas. It should be noted, as well, that the presence of the liner causes there to be a minimum reactance for a liner area of 2500 centimeters squared of about 7 Ohms for the high pressure discharge.

Figure 19:
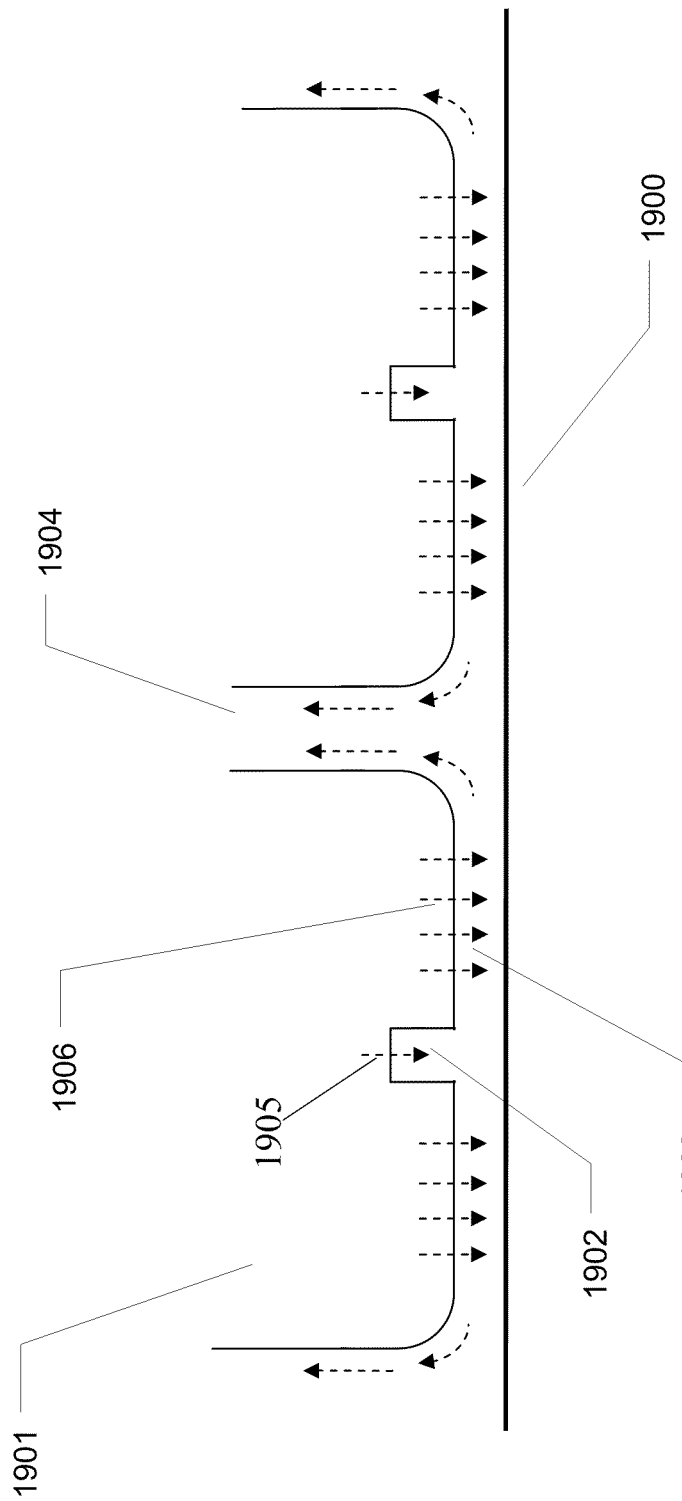
FIG. 19 shows electrodes having recesses in the middle where gas delivery is both from the recesses and the other substrate-facing surfaces of the electrodes according to an example embodiment.

FIG. 19 shows an example embodiment in which there is an electrode, 1901, which is adjacent at least one other electrode, at least one of which is powered, into a recessed area that is along the length of the electrode. There is gas injected in its middle, 1902, as well as from surrounding areas of the electrode, 1903. These gases may be mixtures and may be different or the same composition. After injection the gases flow adjacent a workpiece surface, 1900, and thence to one or more channels, 1904, which lead to exhausts from the chamber. Such channels leading to exhausts in some embodiments may be symmetrical with respect to the electrodes so that the gas flow divides almost equally between the two directions, left and right in the figure. Gases injected from the recess, 1905, may be different in composition from gases injected from other areas of the electrode, 1906, that are closer to the substrate. In particular, for deposition of silicon oxide or silicon nitride the gas injected in recesses may be oxygen or nitrogen, or mixtures containing these gases along with inert gases.

Figure 20:
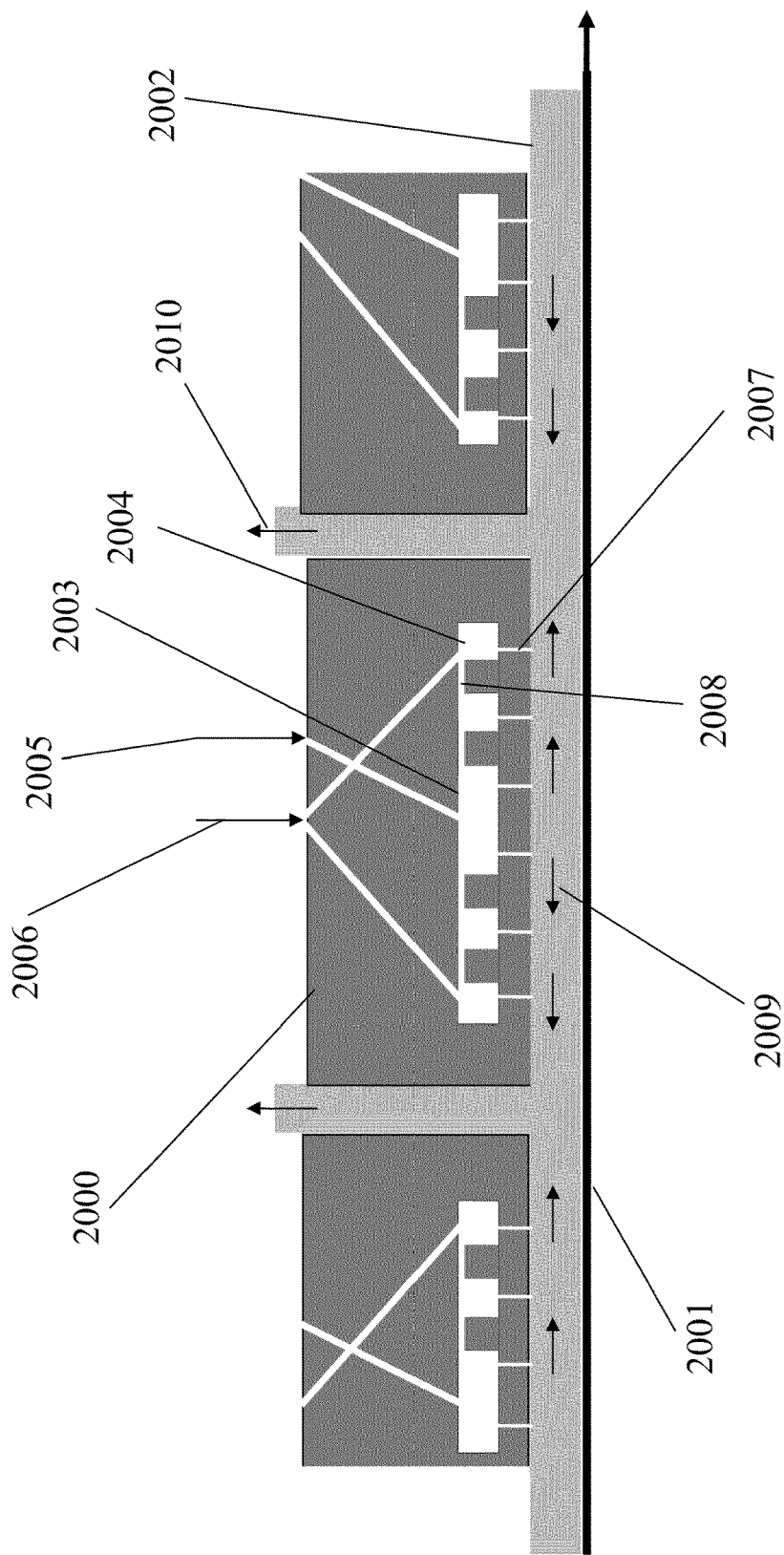
FIG. 20 shows a multiple electrode configuration according to an example embodiment where gas is injected only toward the substrate at the bottom of the electrodes, and each has multi-segment gas injection manifold.

In FIG. 20 is shown an electrode, 2000, adjacent other electrodes, with a substrate to be processed, 2001, and plasma, 2002, formed between all of these by the application of RF or VHF power to one or more electrodes. The gas is injected from the electrode into the space between the electrode and the substrate. Within said electrode is a gas injection manifold which has an inner channel, 2003, into which gas may be injected from a supply, 2005, and one or more outer channels, 2004, into which a separately controllable supply of gas, 2006, may be injected. Gas is injected into the plasma via a row or rows of small holes, 2007, from each channel to the surface of the electrode. Gas may conduct within the manifold from one channel to the next through restricted connections, 2008, whose cross sectional area for conduction from one channel to the next is smaller than that along the length of either channel. Once injected into the plasma the gases flow, 2009, away from the center of the electrode just past the edge of the electrode where the gas diverts to flow to the exhausts, 2010, via narrow gaps between the electrodes. In some embodiments, where amorphous silicon or some other materials that have properties sensitive to the gas phase composition, it may be desirable to maintain the same gas composition above the region of the substrate surface where deposition is taking place. In this case, when one or more gas constituents such as silane is more strongly depleted than others as the gas flows over the substrate, it is desirable to replenish it while not also injecting more of other species not depleted in the gas, such as hydrogen. In example embodiments represented by FIG. 20, the gas mixture fed to the outer channels, 2004, may be a mixture of gases rich in silane, or depleted gas component for other deposition process, so that the injected gas from rows of holes progressively farther from the center becomes increasingly rich in such depleted constituent as the flow progresses. Using this approach, by putting most enriched gas in the outer channel we can make the mixture of gases injected progressively more enriched as the gas moves from the center to the edge of the electrode so that the concentration of the critical species in the gas phase may be maintained approximately constant.

Figure 21A:
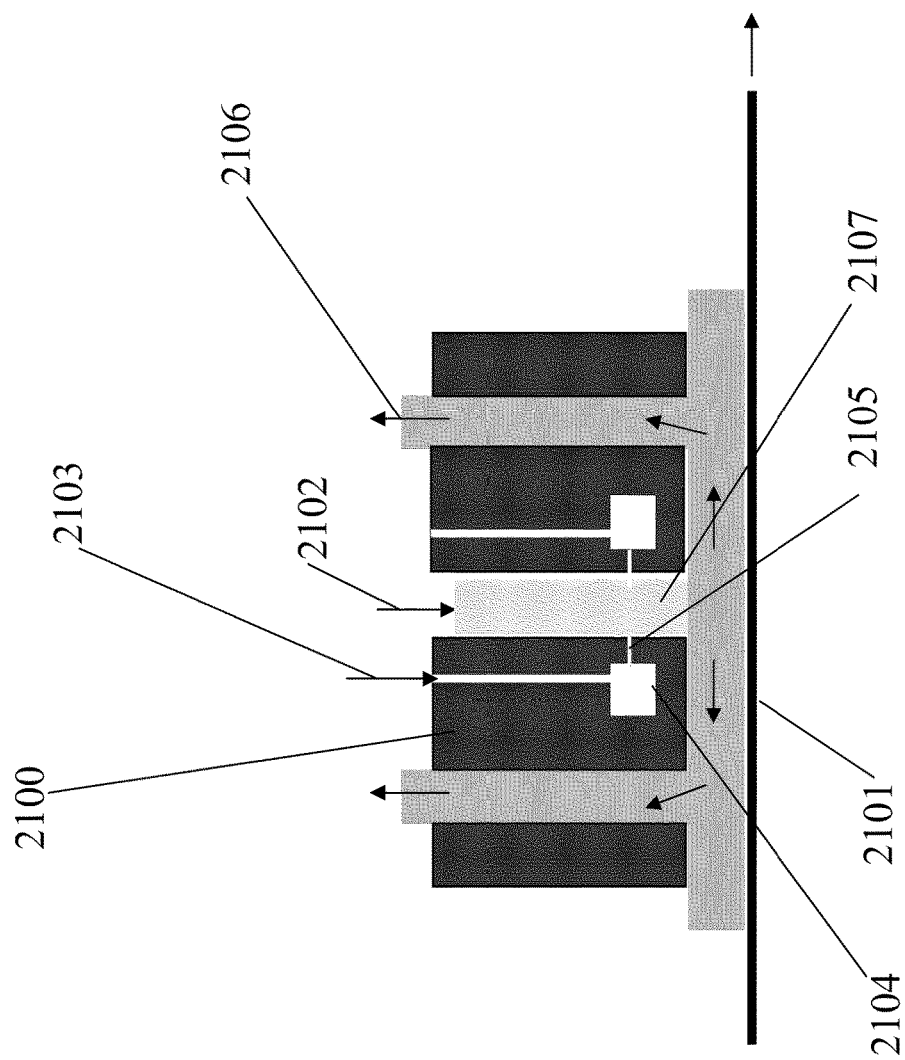
FIG. 21a shows a system according to an example embodiment where gas is injected and dense plasma is formed between the electrodes, as well as between electrodes and substrate.

FIG. 21*a* shows a schematic of an embodiment of a system that may be used for depositing dielectrics such as silicon oxide or silicon nitride on substrates having temperatures less than about 200 Celsius. There are two or more electrodes, 2100, that are supplied RF or VHF power of approximately the same voltage but whose phase may be different. These electrodes are separated from a substrate, 2101, that moves to the right in the figure. For depositing silicon oxide or other oxides or nitrides gas, 2102, is injected into the gap between the electrodes that may include oxygen or nitrogen or other species for forming thin films on substrates. There is a plasma in this gap, 2107, which may in some embodiments have a higher power density and plasma density than the plasma between the electrodes and the substrate for more rapidly and completely dissociating this gas to make reactive species before the other gas is injected. A precursor gas for deposition is also injected, 2103, into the electrodes which passes into a channel, 2104, and then through small holes, 2105, in the sides of the electrodes facing the other electrode, on its way to the plasma. This precursor gas may contain silane or other gas containing one or more elements such as silicon, zinc, titanium, aluminum, carbon, indium, ruthenium, tin, molybdenum, gallium, arsenic, phosphorus or tantalum. When the injected gas reaches the plasma it reacts very quickly with the dissociated reactive gas species such as oxygen, nitrogen, or other, and may become fully reacted in the gas phase, so that the resulting compound of the depositing element from the precursor and the reactive species may deposit on the substrate. Examples of compounds that may be deposited include silicon oxide, titanium dioxide, gallium nitride or silicon nitride. One potential advantage of embodiments of the disclosed invention is that films of high quality having less incorporated hydrogen or carbon may be deposited on substrates having lower temperatures than normal—for example, having temperatures lower than s about 200 Celsius. This further applies to epitaxial deposition of substances such as gallium nitride where normal substrates may be 600 Celsius. In example embodiments, epitaxial deposition may occur on substrates having temperatures less than about 600 Celsius. In this case, use of electrodes having liners reduces heat absorbed by electrodes. In fact, liners having two or more layers of dielectric liners, such as quartz or opaque quartz, can be used, thereby greatly reducing the heat flux to electrodes and facilitating such plasma-assisted epitaxial deposition. With such multiple layer liners it may be beneficial to use RF or VHF frequencies above 13.56 MHz so as to reduce the RF impedance of the liners. The width of the electrode, 2100, in some embodiments may be between about 1.5 centimeters and about 15 centimeters, because the depositing compound may be depleted from the gas phase rapidly as the gas flows away from the point where the precursor enters the plasma. The gases, having been injected between electrodes and then after passing under the electrodes divert to pass between an electrode and the neighboring electrode or divider to the exhaust, 2106. This embodiment and method may produce dielectric and other films of good quality at lower substrate temperatures than conventional PECVD reactors. Multiple pairs of such electrodes may be arranged with their long sides parallel with gaps between them that are between about 5 millimeters and about 15 millimeters.

Figure 21B:
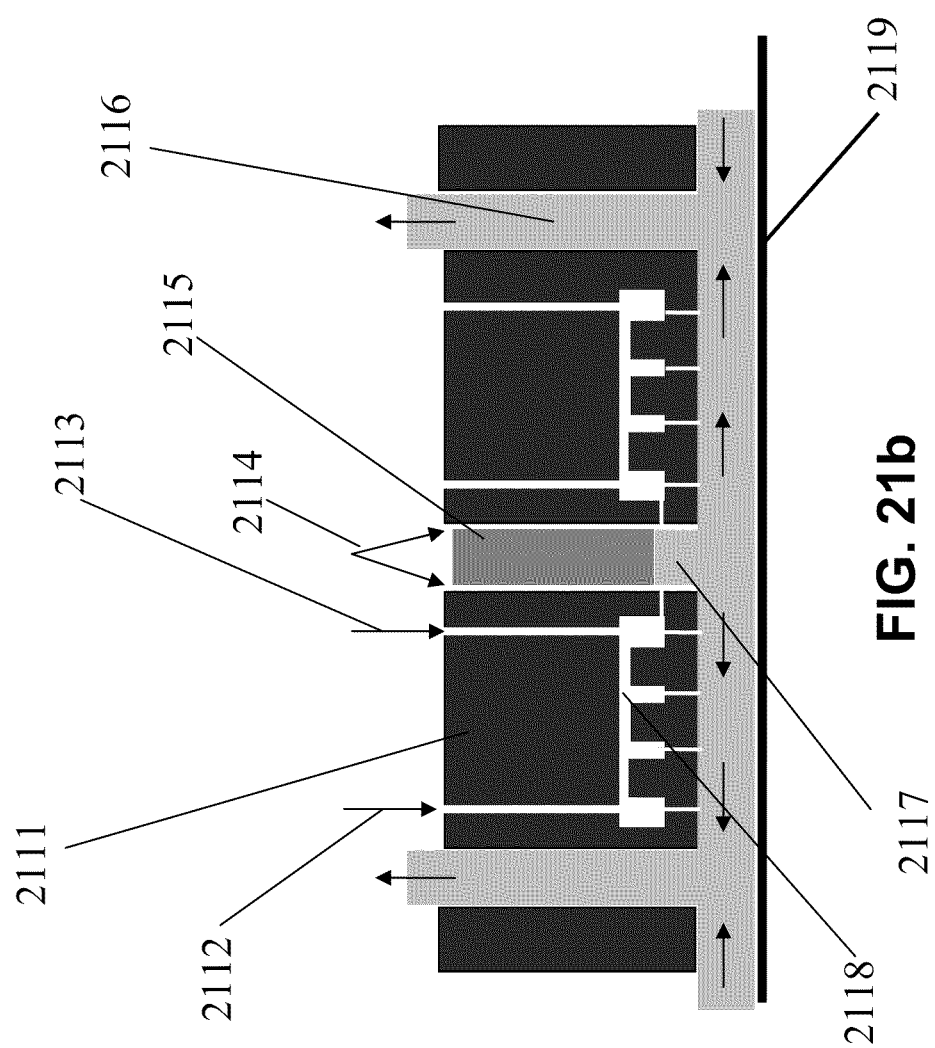
FIG. 21b shows a system according to an example embodiment wherein the gap between the electrodes is filled in part by a dielectric slab.

FIG. 21b shows a configuration appropriate to some embodiments where it is desired to reduce the plasma power density and pre-dissociation of species prior to mixing of all reactive gases and flow adjacent the substrate. The electrodes, 2111, in some embodiments may have a dielectric material, 2115, for example with a low dielectric constant, interposed between them and filling much of the space between where gas is introduced. In this way only a modest volume, 2117, remains available for plasma and dissociation of feed gases before the bulk gas flow carries them between electrodes and substrate. Gas may be introduced into this volume directly, either from the electrode(s) via manifold, 2118, and/or from a separately controllable supply, 2114. Gas may also be injected from separately controllable supplies 2112 and 2113 into the manifold 2118 that injects gas both to the gap between electrodes 2117 and the space between electrodes 2111 and substrate 2119. Once injected into this plasma it flows toward the substrate, then between electrode(s) and substrate, and finally in the narrow spaces between electrodes and neighboring elements, 2116, and thence to the exhaust from the chamber. Gas injected between electrodes, 2114, may be inert gas, process gas mixture or a separate mixture containing precursor and/or reactive gases.

Figure 22:
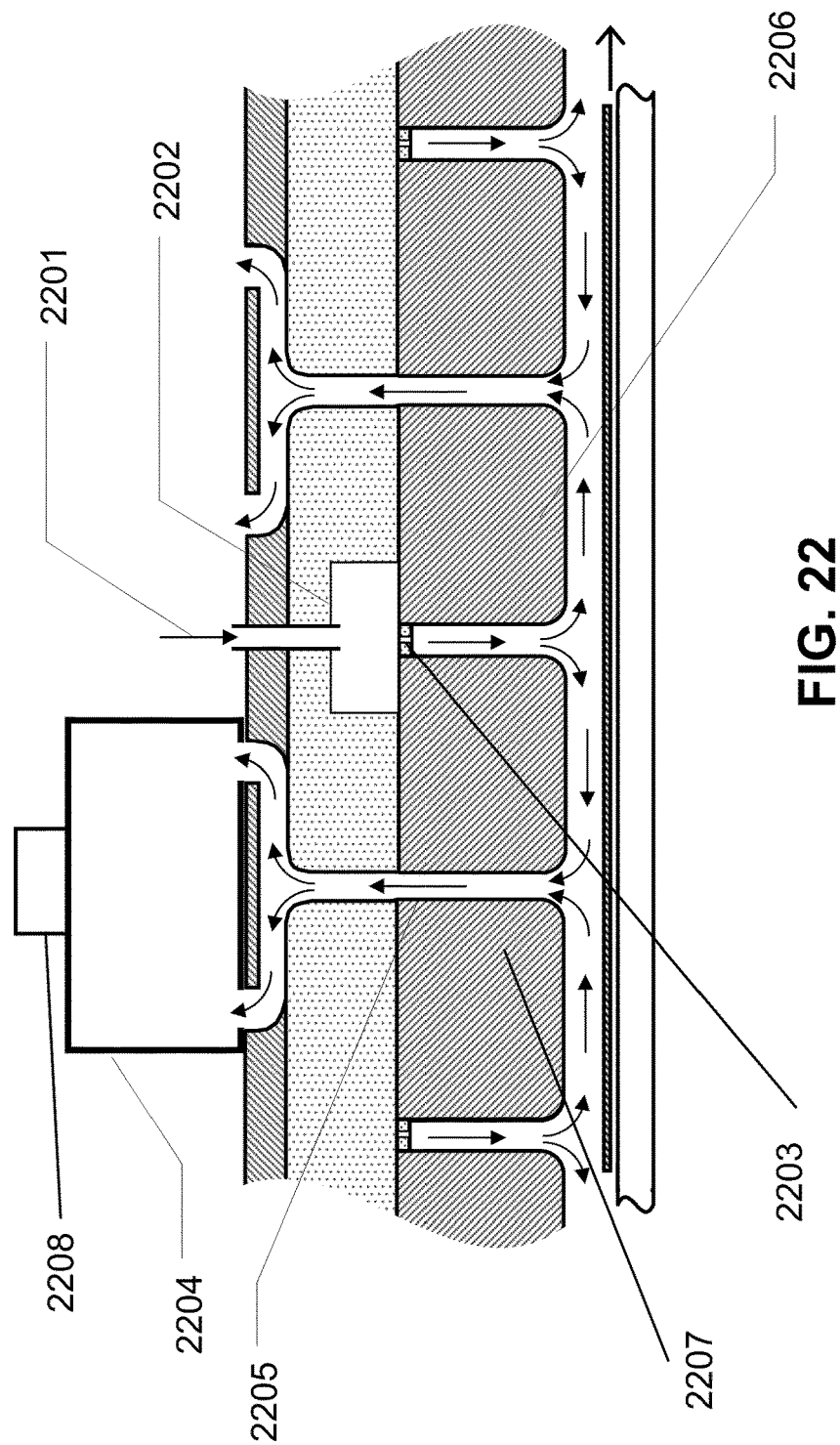
FIG. 22 shows a cross section view of multiple PGUs and a manifold used for pumping the exhaust from the processing plasma according to an example embodiment.

In FIG. 22 we see a configuration for some embodiments well suited to providing a flow pattern and velocity for the gas in the plasma which has only very slight variation, less than or of order 1%, along the length of the electrodes and plasma. It may be desirable for good plasma and process uniformity that the gas flow be highly constant along the length of the plasma, without much convergence or divergence as the gas flows between the substrate and the electrode. This means the direction of gas flow, for virtually the entire length of the source, should be perpendicular to the long direction of the electrode(s). In some embodiments where gas, 2201, from a separately controllable supply, is injected into the gap between electrodes through a manifold, 2202, this should have a cross sectional area greater than about 1 square centimeter in the plane of the figure. This, at the gas pressures preferred for this invention, between about 100 Pascals and about 5000 Pascals, results in a high gas conductance over the length of this manifold extending almost the entire length of the electrodes, 2206. In some embodiments there may be multiple parallel gas feeds to this manifold, distributed along its length, so that the pressure within is highly constant. The gas then flows through small holes or slots, 2203, and then downward in the figure through the space between electrodes. The combined area of such small holes or slots normal to the flow direction should be less than the cross sectional area, as shown in the figure, of the injection manifold from which they issue. In fact, the combined gas conductances of all such small ducts coming from the manifold should be less than the conductance of the manifold for half its length. As a consequence the gas pressure in the injection manifold is nearly constant so that the flow of gas from the small ducts into the gap between electrodes is very nearly independent of the position along the length. Once the gas flows between electrodes toward the substrate and then diverts to flow between substrate and electrode, and then having passed the electrode diverts again to flow in the narrow gap, 2205, between an electrode and the neighboring element, 2207, which may be an electrode. The flow in these narrow spaces according to the disclosed configuration will be effectively in the plane of the figure and independent of the position along the length of the source. Once gas has flowed through such narrow gap, it passes through exhaust aperture(s) into the exhaust manifold, 2204. The gas conductance of such manifold should be substantial along the direction parallel to the long dimension of the electrodes so that its cross sectional area in the plane of the figure may be five square centimeters or more. With such high gas conductance the gas pressure along the length of such manifold will be nearly constant. To further improve the uniformity and constancy of the gas pressure in the exhaust manifold it is helpful to provide, along the length of this manifold, more than one pump-out port, 2208, from the duct to the vacuum pumps, and they should be distributed somewhat evenly along the length. It is desirable that ducts connecting such pump-outs to the main vacuum line be of equal conductance so that the pressures at the pump-out ports are equal.

Figure 23:
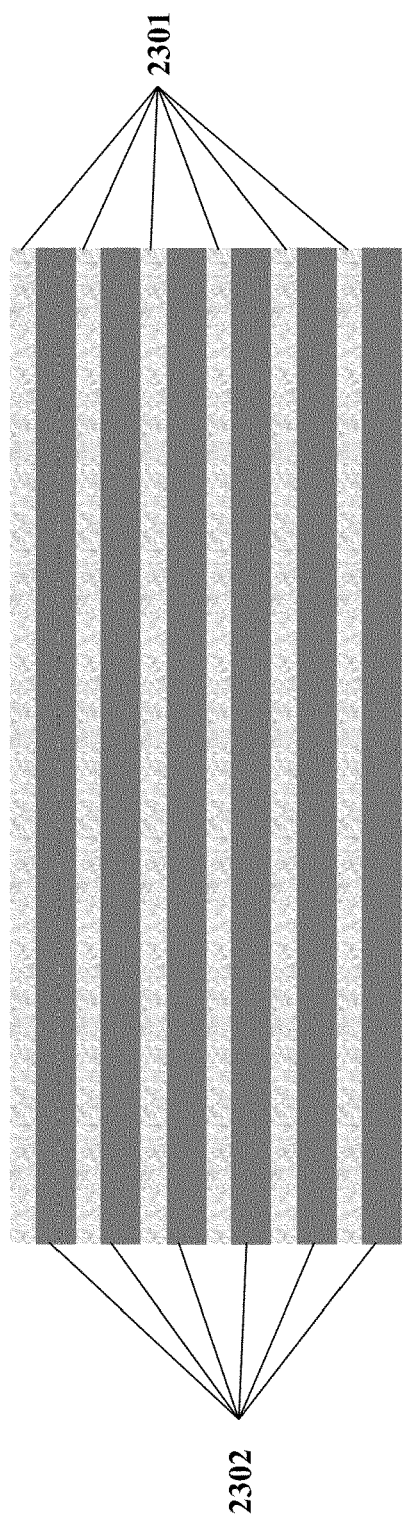
FIG. 23 shows an example multi-layer structure that may be manufactured using example systems and methods according to example embodiments.

FIG. 23 shows an example multi-layer structure that may be manufactured using example systems and methods according to example embodiments. For example, a reactor having multiple PGUs for sequentially depositing different layers may be used, such as the example reactor shown in FIG. 13. It will be understood that the number of PGUs for each layer and the number of layers to be deposited may be varied depending upon the desired structure to be formed. In FIG. 23, an example multi-layer structure is shown consisting of alternating layers of thin films of two materials either or both of which might be dielectric, electrically conducting, or semiconducting. Such a stack might be used for a dichroic optical filter to transmit a certain wavelength band while it reflects almost perfectly other wavelength bands. Another application might be superlattice structures for optical, photovoltaic, display or electronic applications. A third application might be for photovoltaic devices requiring alternating layers to be doped or undoped. For proper functionality in many applications such multi-layer structures should have precise and highly uniform thicknesses over most of the area of the substrate. For large rectangular substrates this is a very difficult task and may require the ability to maintain 1% to 2% control and repeatability of layer thicknesses and compositions. Example embodiments, such as those described above, are believed to have substantial advantage in fabricating such structures due to their ability to deposit many layers at the same time in the same system on moving substrates such that these deposits become different layers deposited at different levels on the substrate (for example, as described in connection with FIG. 13). In FIG. 23 layers alternate in thickness and material type, from layers of material 2301 which are thinner to layers of material 2302 that are thicker. Such layers could be alternating layers of transparent dielectric for a dichroic filter. In this case they would in some embodiments have different refractive indices and probably little absorption of light in the working wavelength region. Two such materials could be silicon oxide for the thicker layers and titanium dioxide for the thinner layers. Thicknesses in some embodiments might be in the range of 500 to 2000 Angstroms for the silicon oxide and 200 to 1000 Angstroms for the titanium dioxide. In FIG. 13, the layers of each material as shown are repeatedly the same throughout the stack, but the layers of each material may actually vary in thickness. In example embodiments, the number of PGUs, power, gas mixture and gas flow may change for subsequent processing stations in the reactor to achieve different layer thicknesses, properties and composition as part of a high throughput sequential deposition process. In example embodiments, the workpiece may be moved by a conveyor under the different sets of PGUs to deposit the various different sequential layers.

Whether the delivery of the AC power into the plasma is done by inductive or capacitive coupling or both the following features (or any combination thereof) may be provided in example embodiments:

In example embodiments, the elements in the PGU, including electrodes, or groups of windings of coils, as well as dividers, may be much longer than their width in the direction perpendicular to the gap from the elements to the substrate.

In example embodiments, the gap between the elements of the PGU and the substrate may be smaller than the width of the AC powered elements, whether electrodes or group of windings, and such gap may in some embodiments be between about 5 mm and 15 mm.

In example embodiments, the gas flow between the AC powered elements (electrodes or groups of windings of coils) and the substrate may have a very small component of flow velocity parallel to the long direction of the elements compared to its component of flow velocity perpendicular to the long dimension of the elements. The bulk flow of gas between AC powered elements and the substrate may be largely parallel to the substrate and neither convergent or divergent as it flows proximate the AC powered element. The concentrations of species in the gas may be generally independent of the position along the length of the AC powered elements or PGUs and easier to scale-up the length of the elements to process ever-larger substrates. In order to achieve this parallel, sheet-like flow of gas between elements and substrate, both the gas injection and gas pumping may be highly uniform along the length of the elements. This may be accomplished with appropriate distribution and pumping manifolds in example embodiments.

In example embodiments, such gas flow may be effectively around each AC powered element perpendicular to the long direction of the element and thence into the exhaust port proximate that element. Therefore, the gas stream around any AC powered element can be largely confined to that element. In case processes are highly sensitive to some gaseous species used in one or a group of PGUs an intervening element with only inert gas injected proximate or from it may be used in example embodiments. This may be used to provide gaseous isolation of processing regions each from the other. In consequence, there may be a number of different gas mixtures used so that two or more different processes are performed on one or more substrates simultaneously within the same processing chamber without large purged separation or extensive baffling between.

In example embodiments, the AC powered elements may be covered by dielectric or weakly conducting liners or shields. In example embodiments, the liners or shields may have modest thermal expansion coefficients. Such liners may prevent the gas from cooling due to contact with cold surfaces. This may help maintain constant gaps between electrodes or windings. Such shields or liners may also tend to stabilize the power density uniformity of the plasma in some embodiments.

Example embodiments may also cause plasmas sustained between each AC powered element and the substrate to be mainly dependent on the power injected from that element. This permits largely independent variation of plasma power density proximate the different powered elements, and when used along with independence of gas chemistry for each PGU, makes possible substantially independent variation of simultaneous processes on the substrate within different PGUs or processing regions. This can be used to facilitate and make more economical deposition of multilayer structures or integrated sequential treatments of substrates.

Although the invention has been described in reference to example embodiments it will be appreciated that specific components or configurations described with reference to one figure may equally be used when appropriate with a configuration described in another figure. Any description of these examples are not intended to limit the invention as changes and modifications can be made without departing from the spirit or scope of the invention.

What is claimed is:
1. An apparatus for plasma processing of a substrate, the apparatus comprising:
a process chamber housing at least one plasma generating unit (PGU), the PGU having exactly two electrodes, including a first electrode and a second electrode, the first electrode and second electrode being distinct from a substrate support on which the substrate is disposed, wherein each of the first and second electrodes has a length, a width, and a height, with the two electrodes aligned in parallel along their respective length directions, wherein said length is at least four times the width of the respective electrode, and is greater than the height of the respective electrode, wherein the first electrode has a front surface facing and separated by a first gap from the substrate support, wherein the first electrode has a first side surface facing and separated by a second gap from the second electrode, wherein the first electrode has a second side surface opposite the first side surface of the first electrode, wherein each of the minimum distance of the first gap, and the minimum distance of the second gap is greater than 5 mm and less than the width of the first electrode;
said substrate support configured to position the substrate with a first side of the substrate proximate and facing the two electrodes of the PGU, and a second side of the substrate facing the substrate support;

a first gas supply system, comprising a gas source connected to a first reservoir within the PGU, wherein the first reservoir has a plurality of injection holes;

at least one exhaust port, the first gas supply system and the at least one exhaust port configured to cause a first gas to flow at a pressure less than 2,000 Pascals, through the first reservoir and from the injection holes into the second gap between the first side surface of the first electrode and the second electrode and from the second gap into the first gap between the front surface of the first electrode and the substrate support;

a second gas supply system configured to provide a second gas to a second reservoir within at least the first electrode, wherein the second reservoir has a plurality of injection holes configured to introduce the second gas into at least one of the first gap between the front surface of the first electrode and the substrate support and the second gap between the first side surface of the first electrode and second electrode, and wherein the injection holes for the second gas are located closer to the substrate than the injection holes for the first gas; and a power supply system comprising a first and a second alternating current (AC) power supply, the first AC power supply being distinct from the second AC power supply, the first AC power supply comprising a first powered terminal and a first grounded terminal, the first powered terminal configured to provide a first time-varying electrical potential to at least the first electrode and the second AC power supply comprising a second powered terminal and a second grounded terminal, the second powered terminal configured to provide a second time-varying electrical potential to at least the second electrode so as to sustain a first plasma in the first gap and a second plasma in the second gap.

2. The apparatus of claim 1, wherein the second gas supply system is configured to inject a silicon-containing gas.

3. The apparatus of claim 1, wherein the minimum distance of the first gap between the front surface of the first electrode and the substrate support is less than about 20 mm.

4. The apparatus of claim 1, wherein the minimum distance of the second gap between the first side surface of the first electrode and the second electrode is less than about 20 mm.

5. The apparatus of claim 1, wherein the width of each of the first and second electrodes is at least 1 cm.

6. The apparatus of claim 1, wherein:
the first side surface and the second side surface of the first electrode are each substantially perpendicular to the front surface of the first electrode; and
the second electrode has an opposing side surface that is substantially parallel to the first side surface of the first electrode.

7. The apparatus of claim 1, further comprising an impedance element configured to provide an impedance of the support to electrical ground of less than about 10 Ohms.

8. The apparatus of claim 1, wherein the first side surface and the second side surface of the first electrode are substantially perpendicular to the first side of the substrate.

9. The apparatus of claim 1 wherein edges of the front surface of the first electrode are rounded with a curvature radius of more than about 1 mm.

10. The apparatus of claim 1, wherein the first gas supply system is configured to inject a nitrogen-containing gas.

11. The apparatus of claim 1, wherein the at least one exhaust port is configured to exhaust gas away from the substrate along the second side surface of the first electrode.

12. The apparatus of claim 1, wherein the power supply system is configured to provide power selected from the group consisting of radio frequency (RF), very high frequency (VHF) and ultra high frequency (UHF) power.

13. The apparatus of claim 1, wherein the current supplied from the first AC power supply has a magnitude and a phase.

14. The apparatus of claim 1, wherein the at least one PGU further comprises a divider.

15. The apparatus of claim 1, further comprising a grounded element, wherein the grounded element is separated from the second side surface of the first electrode by a third gap, and wherein the third gap is less than the width of the first electrode.

16. The apparatus of claim 1, wherein the substrate support is configured to position the substrate with a dimension of the substrate parallel to the length of the first and second electrodes.

17. The apparatus of claim 1, wherein the power supply system comprises an adjustable parameter configured to tune a power density of the first plasma relative to a power density of the second plasma.

18. The apparatus of claim 1, wherein a total number of AC power supplies that supply power to a first one of the at least one PGU is equal to a total number of electrodes of the first PGU.

19. An apparatus for plasma processing of a substrate, the apparatus comprising:
a process chamber housing at least one plasma generating unit (PGU) including at least a first electrode and a second electrode, wherein each of the first and second electrodes has a length, a width, and a height, wherein said length is at least four times the width of the respective electrode, and is greater than the height of the respective electrode, wherein the first electrode has a front surface facing and separated by a first gap from a substrate support, wherein the first electrode has a first side surface facing and separated by a second gap from the second electrode, wherein the first electrode has a second side surface opposite the first side surface of the first electrode, wherein each of the minimum distance of the first gap, and the minimum distance of the second gap is greater than 5 mm and less than the width of the first electrode;

the substrate support configured to position the substrate with a first side of the substrate proximate and facing the first and second electrodes of the PGU;

at least a first gas supply system with injection holes;

at least one exhaust port, the first gas supply system and the at least one exhaust port configured to cause a first gas to flow at a pressure less than 2,000 Pascals in the second gap between the first side surface of the first electrode and the second electrode and in the first gap between the front surface of the first electrode and the substrate;

a second gas supply system configured to provide a second gas to a reservoir within at least the first electrode, wherein the reservoir has injection holes configured to introduce the second gas into the second gap between the first side surface of the first electrode and second electrode, wherein said injection holes for the second gas have a length and a width dimension such that a flow of the second gas from the reservoir is along the length dimension of said injection holes and wherein a width of said injection holes for the second gas is less than a cross-sectional dimension of the reservoir; and a power supply system comprising a first and a second alternating current (AC) power supply, the first AC power supply being distinct from the second AC power supply, the first AC power supply comprising a first powered terminal and a first grounded terminal, the first powered terminal configured to provide a first time-varying electrical potential to at least the first electrode and the second AC power supply comprising a second powered terminal and a second grounded terminal, the second powered terminal configured to provide a second time-varying electrical potential to at least the second electrode so as to sustain a first plasma in the first gap and a second plasma in the second gap.

20. The apparatus of claim 19, further comprising a third element located adjacent to the first electrode, wherein a third gap is located between the second side surface of the first electrode and the third element, and wherein the first gas flows toward the exhaust port through the third gap.

21. The apparatus of claim 19, wherein the first electrode and the second electrode are aligned such that the first electrode and the second electrode are substantially parallel along their respective lengths.

22. The apparatus of claim 19, wherein the first gas supply system is configured to provide at least one of an oxygen-containing gas and a nitrogen-containing gas.

23. The apparatus of claim 19, wherein the first AC power supply is configured to provide electric power in at least one of the radio frequency (RF) band and the very high frequency (VHF) band.

24. The apparatus of claim 19, wherein the substrate support is configured to position the substrate with a dimension of the substrate parallel to a length of the first electrode.

* * * * *